(12) United States Patent
Akagawa

(10) Patent No.: US 6,356,305 B1
(45) Date of Patent: Mar. 12, 2002

(54) IMAGE-PICKUP APPARATUS AND METHOD FOR READING ACCUMULATED SIGNAL CHANGES THROUGH TRANSFER LINES

(75) Inventor: Keiichi Akagawa, Kanagawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/016,287

(22) Filed: Jan. 30, 1998

(30) Foreign Application Priority Data

Jan. 30, 1997 (JP) .............................................. 9-016399
Apr. 2, 1997 (JP) .............................................. 9-083559

(51) Int. Cl.$^7$ .............................................. H04N 5/335
(52) U.S. Cl. ...................................................... 348/311
(58) Field of Search ................................ 348/298, 302, 348/303, 304, 311, 315, 316, 317, 318, 319, 320, 321, 322, 323, 324; 257/245, 246, 247, 232, 233; H04N 5/335

(56) References Cited

U.S. PATENT DOCUMENTS 4,577,233 A    3/1986    Kimata
4,974,043 A  * 11/1990   Stevens ....................... 257/247
5,286,990 A  *  2/1994   Hynecek ...................... 257/247
5,416,344 A    5/1995    Ishizuya et al.
5,670,382 A    9/1997    Ishizuya et al.

FOREIGN PATENT DOCUMENTS

JP    58-210663    12/1983
JP     2544341     7/1996

* cited by examiner

Primary Examiner—Tuan Ho
(74) Attorney, Agent, or Firm—Foley & Lardner

(57) ABSTRACT

The present invention concerns an image-pickup apparatus and a method for driving the same, adapted for reading signal charges accumulated in a plurality of photodetection portions provided on a predetermined plane through vertical transfer lines and a horizontal transfer line. The image-pickup apparatus has the structure for establishing potential wells having a length not smaller than a vertical width of a horizontal line, in the vertical transfer lines, thereby permitting the horizontal width of the vertical transfer lines to be decreased. Since the image-pickup apparatus has the structure for establishing the plurality of potential wells having signal charges in the vertical transfer lines at a predetermined time, the signal charges can be transferred efficiently with keeping low driving speed of the vertical transfer lines.

27 Claims, 37 Drawing Sheets

TRUTH TABLE

| IN1 | IN2 | Out |
|-----|-----|-----|
| L   | L   | VL  |
| L   | H   | Z   |
| H   | L   | VM  |
| H   | H   | VH  |

TRUTH TABLE

| IN1 | IN2 | IN3 | Out |
|-----|-----|-----|-----|
| L | L | L | — |
| L | L | H | VM |
| L | H | L | VH |
| L | H | H | — |
| H | L | L | — |
| H | L | H | VM |
| H | H | L | VH |
| H | H | H | — |

IMAGE-PICKUP APPARATUS AND METHOD FOR READING ACCUMULATED SIGNAL CHANGES THROUGH TRANSFER LINES

BACKGROUND OF THE INVENTION

1. Field of the Invention

The present invention relates to an image-pickup apparatus and a method for driving the same, adapted for reading signal charges accumulated in a plurality of photodetection portions provided on a predetermined plane, through vertical transfer lines and a horizontal transfer line, which extend perpendicular to each other on the plane.

2. Related Background Art

The conventional electronic cameras and video cameras are equipped with an image-pickup apparatus, for example, composed of CCD image sensing devices or MOS image sensing devices. Some conventional examples of the image-pickup apparatus of this type will be described.

FIG. 1 is a drawing to show the structure of a conventional image-pickup apparatus of a progressive scan type (the first conventional example).

In FIG. 1, the image-pickup apparatus of the first conventional example has photodetection portions 51 of photodiodes or the like arrayed two-dimensionally on an image-pickup surface. Vertical transfer lines 52 (vertical CCD groups) are placed each through a transfer gate 53 between vertical strings of these photodetection portions 51 (vertical lines).

For each of the vertical transfer lines 52, 3-phase electrodes $\phi 1$–$\phi 3$ for transfer of charge are provided at regular intervals, and a horizontal transfer line 54 (a horizontal CCD group) is arranged along the horizontal direction on the output end side of the vertical transfer lines 52. An output amplifier 55 is connected to the output side of this horizontal transfer line 54.

In the image-pickup apparatus of this structure signal charges according to quantities of light received by the image-pickup surface are accumulated in the respective photodetection portions 51.

When a high voltage is applied to the electrodes $\phi 2$, $\phi 3$, potential wells for accumulating the signal charge are established under the electrodes $\phi 2$, $\phi 3$. At this time a vertical length L10 of a potential well is approximately two thirds of a vertical width L20 of a horizontal line, as shown in FIG. 1. A horizontal line means one row or two or more rows of photodetection portions 51 arranged along the horizontal direction and a vertical width of a horizontal line means a width along the vertical direction, of the photodetection portions 51 forming the horizontal line.

The signal charges accumulated in the photodetection portions 51 in this state are transferred at one time to the respective potential wells established in the vertical transfer lines 52, through the transfer gate 53.

When 3-phase driving pulses are then applied to the electrodes $\phi 1$–$\phi 3$, the signal charges in the potential wells are successively transferred in the vertical direction.

The signal charges of one horizontal line outputted from the group of vertical transfer lines 52 are taken into the horizontal transfer line 54 during a horizontal blanking interval. The signal charges of one horizontal line thus taken in are transferred in the horizontal direction to the outside over one horizontal scan period. The horizontal scan period means a period necessary only for the signal charges transferred from the respective vertical transfer lines into the horizontal transfer line to be successively transferred and be outputted to the outside, and the horizontal blanking interval means a period in which the transfer operation of signal charge is interrupted in the horizontal transfer line.

The outputs from the horizontal transfer line are subjected to the well-known color signal process and $\gamma$ correction or the like, thus generating image signals of a frame unit.

Next, FIG. 2 is a drawing to show the structure of a conventional image-pickup apparatus of a two-line-mixed interlace scan type (the second conventional example).

In FIG. 2, the image-pickup apparatus of the second conventional example has photodetection portions 61 of photodiodes or the like arrayed two-dimensionally on the image-pickup surface. Vertical transfer lines 62 (vertical CCD groups) are placed each through transfer gate 63 between the vertical strings of these photodetection portions 61.

For each of the vertical transfer lines 62, 4-phase electrodes $\phi 1$–$\phi 4$ for transfer of charge are provided at regular intervals and a horizontal transfer line 64 (a horizontal CCD group) is placed along the horizontal direction on the output end side of the vertical transfer lines 62. An output amplifier 66 is connected to the output side of this horizontal transfer line 64.

The image-pickup apparatus of this structure can perform interlace reading.

Described below is a case where an odd field is read.

First, a high voltage is applied to the electrodes $\phi 1$–3, whereby potential wells for accumulating the signal charge are established under the electrodes $\phi 1$–3. At this time the vertical length L11 of each potential well is approximately three quarters of the vertical width L21 of a horizontal line (composed of the photodetection portions in two rows), as shown in FIG. 2.

The signal charges accumulated in the photodetection portions 61 in this state are transferred at once to a potential well established in each of the adjacent vertical transfer lines 62, through the transfer gate 63. At this time signal charges accumulated in the photodetection portions 61 in the n-th row (n is an odd number) and in the (n+1)th row are mixed in one potential well, thus generating a signal charge of one horizontal line.

Then 4-phase driving pulses are applied to the electrodes $\phi 1$–$\phi 4$, whereby the signal charges in the potential wells are successively transferred in the vertical direction.

The horizontal transfer line 64 takes in the signal charges of one horizontal line outputted from the group of vertical transfer lines 62 during a horizontal blanking interval. The signal charges of one horizontal line thus taken in are transferred in the horizontal direction over one horizontal scan period.

The outputs from the horizontal transfer line are subjected to the well-known color signal process and $\gamma$ correction or the like, thus generating image signals of an odd field.

For reading an even field, the signal charges accumulated in the photodetection portions 61 in the n-th row (n is an odd number) and in the (n−1)th row are mixed in the potential wells established under the electrodes $\phi 4$, $\phi 1$, $\phi 2$, thus generating signal charges of one horizontal line.

Next, FIG. 3 is a drawing for explaining the operation of a conventional image-pickup apparatus of the CSD method (the third conventional example).

In FIG. 3, the image-pickup apparatus of the third conventional example has electrodes $\phi 1$–$\phi m$ arranged at regular intervals on each vertical transfer line 71. On the output end side of the vertical transfer line 71 a horizontal transfer line 74 is placed through storage area 72 and gate portion 73. This storage area 72 is a region for temporarily storing a signal charge and an electrode φC for establishing a potential well for storage of charge is placed on the storage area 72. The gate portion 73 is a transfer gate for electrically opening or closing the region between the storage area 72 and the horizontal transfer line 74, and a gate electrode φT is placed on the gate portion 73.

On the other hand, placed on the horizontal transfer line 74 is an electrode φH for establishing potential wells for transferring signal charges of one horizontal line taken in from the vertical transfer lines 71, in the horizontal direction.

In the image-pickup apparatus of this structure, a high voltage is applied at once to the electrodes φ1–φm on each vertical transfer line 71, thus establishing a potential well over the entire length of the vertical transfer line 71. In this state, a signal charge in each photodetection portion (not illustrated) forming one horizontal line is transferred to the potential well established in the vertical transfer line 71. (t1 in FIG. 3)

Subsequently, the voltage applied to the electrodes φ1–φm is lowered in the descending order from the other end side of the vertical transfer line 71, whereby the signal charge in the potential well is pushed successively toward the storage area 72 (t2–t5 in FIG. 3).

The signal charge stored in the storage area 72 is transferred through the gate portion 73 to the horizontal transfer line 74 during a horizontal blanking interval (t6–t8 in FIG. 3). The signal charges in the horizontal transfer line 74 are transferred in the horizontal direction over one horizontal scan period (t9 in FIG. 3), and then are successively outputted to the outside of the horizontal transfer line 74.

The above operation (t1–t9 in FIG. 3) is repeated while shifting the reading position of horizontal line, whereby image signals of the entire image-pickup surface are read out to the outside.

SUMMARY OF THE INVENTION

The inventor has examined the conventional technologies described above and found the following issues.

In recent years there is the demand for decrease in the width of the vertical transfer lines in order to decrease the chip size of image-pickup devices, in order to increase the number of pixels on the image-pickup surface, or in order to increase the aperture rate per pixel. In the image-pickup apparatus of the first and second conventional examples shown in FIG. 1 and FIG. 2, however, the vertical length L10 or L11 of one potential well must be shorter than the vertical width (the width in the vertical direction) L20 or L21, respectively, of one horizontal line. For preventing a signal charge from overflowing out of a potential well, it is necessary to assure a sufficient horizontal width (a width in the horizontal direction) of each vertical transfer line.

On the other hand, the image-pickup apparatus of the third conventional example shown in FIG. 3 has a larger storage capacity of signal charge than necessary, because the potential well is established over the entire length of each vertical transfer line. Therefore, this is a preferred structure for narrowing the horizontal width of vertical transfer line. The image-pickup apparatus of the third embodiment, however, completes within one horizontal period the sequential operation from the time when the signal charge of each photodetection portion forming one horizontal line is transferred to its corresponding vertical transfer line 71 to the time when the signal charge, after having been transferred in each vertical transfer line, is transferred to the horizontal transfer line 74. Therefore, the vertical transfer lines need to be driven at especially high speed.

For example, supposing 254-stage electrodes are prepared as the transfer electrodes composing the electrode string provided on the vertical transfer line, the signal charge must be transferred through 254 stages within one horizontal blanking interval (approximately 0.25 μsec), so that high-speed driving of at least about 4 MHz must be carried out.

In general, the transfer electrodes provided on the vertical transfer line are connected in parallel, corresponding to the number of horizontal pixels. Therefore, a large capacitive impedance appears in each electrode on the vertical transfer line. For high-speed driving of this large capacity, a large driving current is necessary, which will result in increasing the dissipation power of the image-pickup apparatus. Flow of the large driving current will increases heating amounts of the driving circuit, which could pose a problem of increase of dark current noise or the like. Further, there is also a possibility that the waveform of the driving voltage will become weakened in the high-speed driving of large capacity, so as to cause a transfer leak of signal charge.

The present invention has been accomplished to solve the above issues and an object of the present invention is to provide an image-pickup apparatus and a method for driving the apparatus in structure enabling to decrease the horizontal width of each vertical transfer line and enabling to keep the driving speed low in each vertical transfer line.

Specifically, an image-pickup apparatus according to the present invention comprises at least a plurality of photodetection portions arrayed two-dimensionally on an image-pickup surface, vertical transfer lines each extending adjacent to respective vertical lines being strings of photodetection portions arranged along a vertical direction out of the plurality of photodetection portions and extending along the vertical direction, and a horizontal transfer line provided along a plurality of horizontal lines being one row or two or more rows of photodetection portions arranged along a horizontal direction perpendicular to the vertical direction. Provided on each of the above-stated vertical transfer lines is an electrode string consisting of a plurality of transfer electrodes for establishing potential wells for transferring signal charges accumulated in the photodetection portions. The above horizontal transfer line is a region for successively transferring along the horizontal direction the signal charges having been transferred thereto each from the above vertical transfer lines.

Particularly, for achieving the above object, a method for driving the image-pickup apparatus according to the present invention is a method for, in each of the above plurality of vertical transfer lines, establishing a plurality of potential wells having a length not smaller than a vertical width of each horizontal line and for moving the plurality of potential wells along the vertical direction. In each of the vertical transfer lines, photodetection portions to be read are those of objects successively selected according to a reading order of plural horizontal lines, and a signal charge accumulated in a photodetection portion selected is transferred from the photodetection portion to a vacant potential well at timing when the vacant potential well is established in a portion adjacent to the photodetection portion thus selected.

For realizing the above driving method, the image-pickup apparatus according to the present invention further comprises a plurality of gate structures, provided corresponding to the plurality of respective photodetection portions, for transferring signal charges accumulated in the plurality of photodetection portions to potential wells established in the respectively adjacent vertical transfer lines, and a vertical driving control system for controlling the gate structures corresponding to the photodetection portions composing a horizontal line selected out of the plurality of horizontal lines, in each of the plurality of vertical transfer lines the vertical driving control system successively selecting a plurality of electrode groups each including two or more transfer electrodes arranged consecutively from the electrode string and successively applying a predetermined voltage to the plurality of electrode groups selected.

In the image-pickup apparatus and the method for driving it according to the present invention, since the potential wells having the length not smaller than the vertical width of a horizontal line are established in each of the vertical transfer lines as described, the width of the vertical transfer lines can be set narrower.

In the image-pickup apparatus according to the present invention, in each of the vertical transfer lines the above vertical driving control system simultaneously selects from the above electrode string an electrode group for establishing a potential well for transferring a signal charge accumulated in a photodetection portion forming a first horizontal line selected from the plurality of horizontal lines and an electrode group for establishing a potential well for transferring a signal charge accumulated in a photodetection portion forming a second horizontal line different from the first horizontal line. By this structure, a plurality of potential wells each containing a signal charge are established in each of the above vertical transfer lines at predetermined timing. In other words, in each of the above vertical transfer lines, one potential well or two or more potential wells containing signal charges are moved from positions where the signal charges were transferred through the gate structure, to the output end of each vertical transfer line over a plurality of horizontal scan periods, each being a period in which signal charges are transferred in the horizontal transfer line, or over a plurality of horizontal blanking intervals, each being a period in which the transfer operation of signal charge is interrupted in the horizontal transfer line. In each of the vertical transfer lines, a signal charge in a photodetection portion forming a horizontal line to be read next is transferred to a potential well established in the vertical transfer line, during a period in which a signal charge in a photodetection portion forming a horizontal line selected out of the horizontal lines is transferred in the vertical direction.

As described above, the image-pickup apparatus is not constructed in such arrangement that a signal charge taken out of a photodetection portion forming a horizontal line of a read object is transferred to the output end of each vertical transfer line during one horizontal period (including a horizontal scan period and a horizontal blanking interval), but is constructed in such arrangement that while signal charges accumulated in the photodetection portions in horizontal lines of read objects are successively transferred to each vertical transfer line, the potential wells in which the signal charges are present are gradually transferred toward the output end of each vertical transfer line, thereby permitting efficient transfer of signal charge with keeping low driving speed of the vertical transfer lines.

For realizing the driving method, the above vertical driving control system comprises a first shift register having output ports the number of which is not less than the number of photodetection portions forming a vertical line out of the plural photodetection portions, the first shift register being adapted for selecting gate structures corresponding to respective photodetection portions forming a horizontal line selected; a second shift register having output ports the number of which is smaller than the number of photodetection portions forming a vertical line out of the plurality of photodetection portions and smaller than the number of output ports of the first shift register, said second shift register being adapted for generating timing of movement of plural potential wells established in each of the vertical transfer lines; and a circuit for generating voltages of mutually different levels applied at predetermined timing to the transfer electrodes in the electrode string provided for each of the vertical transfer lines.

For providing an image-pickup apparatus without a need for providing storage areas for storing signal charges between the output ends of the vertical transfer lines and the horizontal transfer line, the image-pickup apparatus according to the present invention is driven so that in each of the vertical transfer lines the signal charge in the potential well, having been moved to the output end of the vertical transfer line, is transferred to the horizontal transfer line during a horizontal blanking interval. In this case, the image-pickup apparatus is provided with a first output electrode provided so as to cover the output ends of the respective vertical transfer lines adjacent to the horizontal transfer line and cover a part of the horizontal transfer line. Then the above vertical driving control system applies a predetermined voltage to the first output electrode so that the signal charges are transferred to the horizontal transfer line during a horizontal blanking interval and at timing when the potential well containing the signal charge reaches the output end of each vertical transfer line.

On the other hand, in order to realize an image-pickup pickup apparatus with high degrees of freedom of design as to the driving timing of the vertical transfer lines, the image-pickup apparatus according to the present invention preferably comprises a plurality of storage areas provided corresponding to the respective vertical transfer lines, each storage area being adapted for storing a signal charge, having been transferred in the each vertical transfer line, between the horizontal transfer line and the each vertical transfer line; a first electrode covering a part of the horizontal transfer line and a part of each of the plurality of storage areas; and a second output electrode covering a part of each of the plurality of storage areas and the output end of each of the vertical transfer lines. In this case, the above vertical driving control system applies a predetermined voltage to the first electrode at timing when a potential well containing a signal charge reaches the output end of each of the vertical transfer lines and also applies a predetermined voltage to the second output electrode during a horizontal blanking interval.

In this way, in each of the vertical transfer lines, a signal charge in a potential well, having been moved to the output end of each vertical transfer line, is temporarily withdrawn from the vertical transfer line, and after arrival of a next horizontal blanking interval, the signal charge temporarily withdrawn is outputted to the horizontal transfer line, which ensures degrees of freedom of design for the driving timing of vertical transfer lines.

Next, the image-pickup apparatus and the method for driving the apparatus according to the present invention can also prevent the negative effect due to the transfer leak of signal charge transferred in the vertical transfer lines. Namely, in each of the vertical transfer lines at a certain instant, a main potential well for transferring a signal charge and an auxiliary potential well for transferring a leak of the signal charge are established adjacent to each other along the vertical direction. Then the signal charge in the main potential well and the leak of the signal charge collected by the auxiliary potential well paired with the main potential well in each of the vertical transfer lines are outputted (or added) each onto the horizontal transfer line, thus realizing the prevention of the negative effect. The above pair of main potential well and auxiliary potential well are established by such arrangement that the above vertical driving control system simultaneously selects an electrode group for establishing at least the main potential well and an electrode group for establishing the auxiliary potential well from the electrode string provided for each of the vertical transfer lines. This structure can further increase the transfer efficiency of signal charge in the vertical transfer lines.

Further, for realizing an image-pickup apparatus having an electronic shutter function, the image-pickup apparatus according to the present invention is driven preferably so that in the above plurality of vertical transfer lines, after a lapse of a predetermined time from the time when undesired charges accumulated in the photodetection portions of a horizontal line selected out of the horizontal lines are transferred into the adjacent vertical transfer lines, signal charges accumulated in the photodetection portions are transferred to the adjacent vertical transfer lines and the undesired charges in the potential wells, having been moved to a predetermined portion of the vertical transfer lines, are drained away to the outside of the vertical transfer lines.

For realizing this driving method, the image-pickup apparatus according to the present invention comprises a plurality of discharge areas for sweeping an undesired charge having been transferred in each vertical transfer line away thereinto, each discharge area being a region provided between the output end of each of the vertical lines and the horizontal transfer line; and a third output electrode covering a part of each of the plurality of discharge areas and a part of each vertical transfer line corresponding thereto. Then the above vertical driving control system controls the associated gate structures so that after a lapse of a predetermined time from the time when the undesired charge accumulated in each photodetection portion of a horizontal line selected out of the horizontal lines is transferred to each vertical transfer line, the signal charge accumulated in the each photodetection portion is transferred to each vertical transfer line adjacent thereto, and in each vertical transfer line the vertical driving control system applies a predetermined voltage to the electrode group for establishing the potential well, thereby establishing the potential well to which the signal charge in the each photodetection portion is to be transferred. For transferring the undesired charge from each vertical transfer line to a corresponding one of discharge areas, this vertical driving control system applies a predetermined voltage to the third output electrode in each vertical transfer line, at the timing when the potential well containing the undesired charge reaches a portion adjacent to the corresponding discharge area.

When the above horizontal line is composed of a plurality of rows of photodetection portions adjacent to each other along the horizontal direction, it is also possible to realize an image-pickup apparatus having the interlace scan function. Specifically, the image-pickup apparatus according to the present invention is driven preferably so that a shift of a predetermined distance in the vertical direction is given to positions where potential wells for vertically transferring a signal charge accumulated in a photodetection portion forming the horizontal line are established successively in a first operation for reading an odd field with respect to those in a second operation for reading an even field. Also in this driving method the above vertical driving control system successively selects different electrode groups respectively in the first operation and in the second operation, out of the electrode string provided for each of the vertical transfer lines.

In addition, the image-pickup apparatus according to the present invention can also be driven so that in each of the vertical transfer lines, a plurality of horizontal lines are selected based on predetermined reading sections of horizontal lines and signal charges accumulated in the respective photodetection portions forming the respective horizontal lines spaced at a predetermined distance are transferred at once to the vertical transfer line. In this case, the basic structure is the same as the structure of the above-stated image-pickup apparatus, but the vertical driving control system in the image-pickup apparatus controls the gate structures corresponding to the respective photodetection portions forming the respective horizontal lines spaced at the predetermined distance and selected based on the predetermined reading sections of horizontal lines out of the plurality of horizontal lines each being one row or two or more rows of photodetection portions arranged along the horizontal line, and in each of the vertical transfer lines and in order to establish a plurality of potential wells having a length not smaller than a width of each horizontal line in the vertical direction and successively move the plurality of potential wells in the vertical direction, the vertical driving control system successively selects a plurality of electrode groups each including two or more transfer electrodes arranged consecutively from the above electrode string and successively applies a predetermined voltage to the plurality of electrode groups selected in each of the vertical transfer lines.

Further, the image-pickup apparatus comprises a pixel rearranging section for successively capturing outputs from the above horizontal transfer line, rearranging the outputs according to an original sequence of the horizontal lines, and thereby generating image signals of a frame unit or a field unit.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
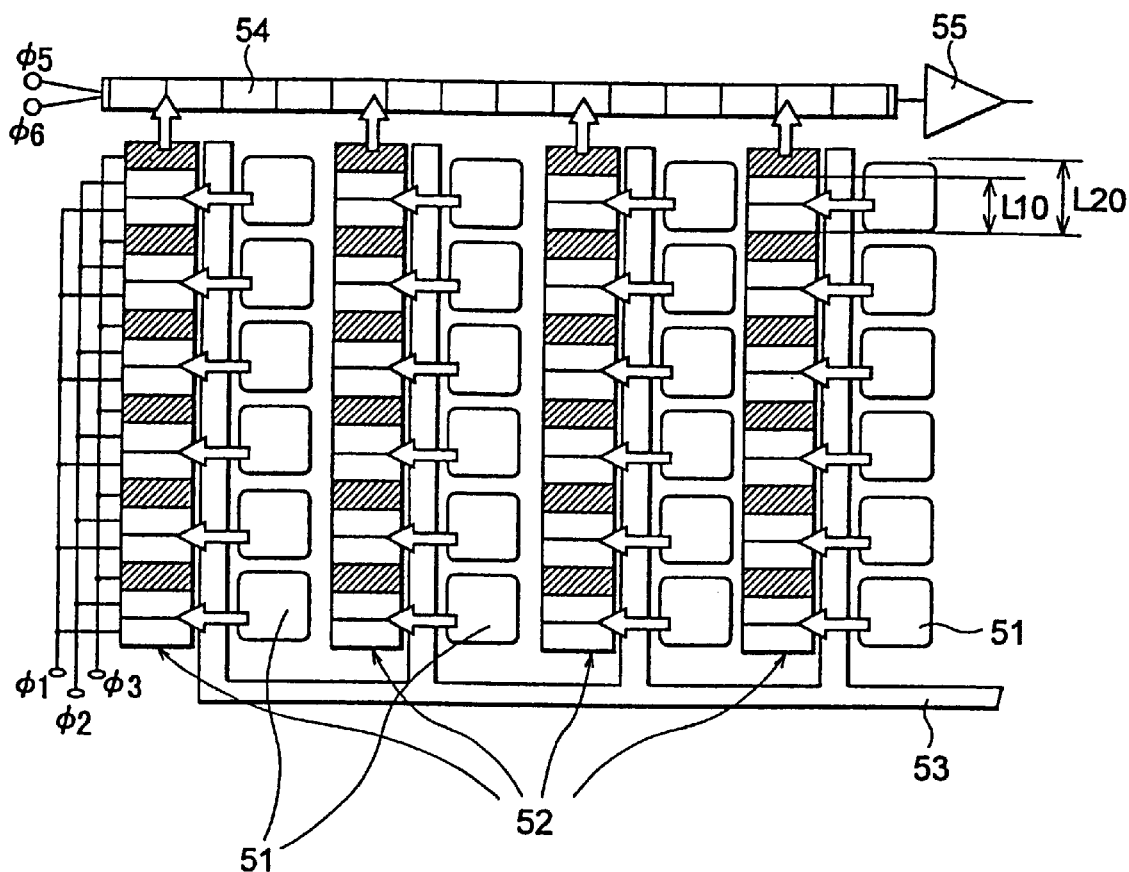
FIG. 1 is a drawing to show the structure of the conventional image-pickup apparatus of the progressive scan type (the first conventional example)

The image-pickup apparatus and the methods for driving the same according to the present invention will be described by reference to FIG. 4 to FIG. 42. In the drawings the same portions will be denoted by the same reference symbols and redundant description will be omitted.

FIRST EMBODIMENT

Figure 4:
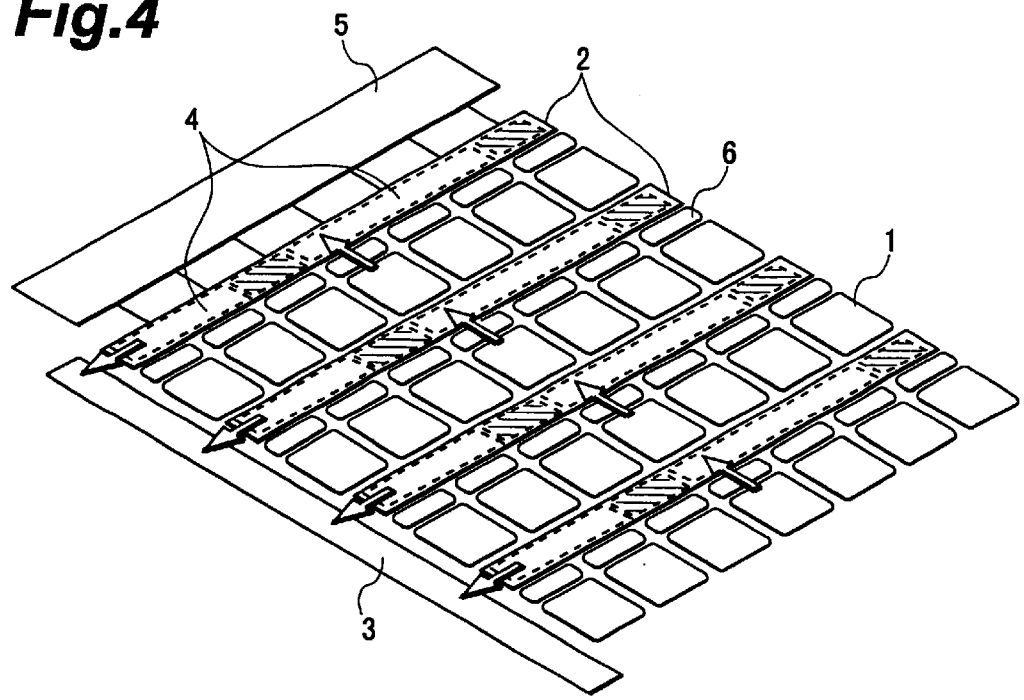
FIG. 4 is a conceptual drawing of the first embodiment of the image-pickup apparatus according to the present invention.

FIG. 4 is a conceptual drawing of the first embodiment of the image-pickup apparatus according to the present invention. In this figure, the image-pickup apparatus has a plurality of photodetection portions 1 arrayed two-dimensionally on the image-pickup surface, a plurality of vertical transfer lines 2 for vertically transferring signal charges accumulated in the photodetection portions 1 and read every predetermined horizontal line out of the plurality of photodetection portions 1, and a horizontal transfer line 3 for horizontally transferring signal charges outputted from the vertical transfer line group 2. Particularly, this image-pickup apparatus further has a vertical driving control system 5 for establishing a plurality of potential wells 4 longer than a vertical width of a horizontal line, in the vertical transfer lines 2 and for successively moving the potential wells 4 in the vertical direction, and gate structures 6 for transferring signal charges accumulated in the photodetection portions 1 to the vacant potential wells 4 in synchronism with the timing when the signal charges in the photodetection portions 1 selected according to the reading order of the horizontal lines become adjacent to the vacant potential wells 4 established in the vertical transfer lines 2.

This image-pickup apparatus of the first embodiment is characterized in that the vertical driving control system 5 is arranged to apply predetermined voltage to each group of electrodes selected from a string of electrodes (in which a plurality of electrodes for transfer are arrayed along the vertical direction) provided for each of the vertical transfer lines 2 so that at least one potential well 4 containing a signal charge is moved to the output end of the vertical transfer line 2 over plural horizontal periods (including horizontal scan periods and horizontal blanking intervals).

Further, this image-pickup apparatus of the first embodiment is characterized in that the vertical driving control system 5 is arranged to output the signal charges in the potential wells 4, having been moved to the output end of the vertical transfer lines 2, to the horizontal transfer line 3 during a horizontal blanking interval.

In the image-pickup apparatus of the first embodiment as described, when the photodetection portions 1 are exposed to the light, signal charges according to quantities of received light are generated therein. The signal charges generated are read every predetermined horizontal line and are read out through the plural vertical transfer lines 2 and horizontal transfer line 3 to the outside of the apparatus.

In the reading operation of signal charge, the vertical driving control system 5 establishes the plurality of potential wells 4 in the vertical transfer lines 2. The potential wells 4 have the length not smaller than the vertical width of the horizontal line. A potential barrier for isolating the signal charges from each other is set between these potential wells 4.

Figure 2:
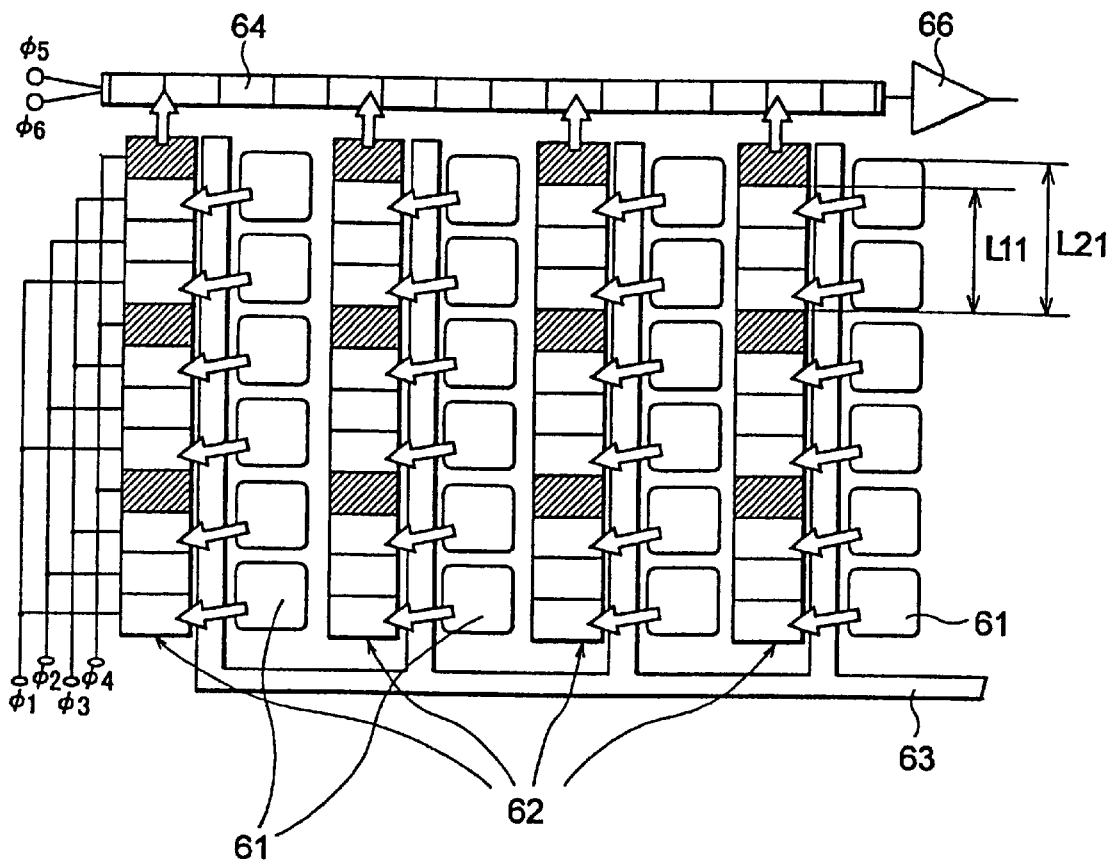
FIG. 2 is a drawing to show the structure of the conventional image-pickup apparatus of the two-line-mixed interlace scan type (the second conventional example)

Because of this configuration, the number of potential wells 4 that can be established at one time in each vertical transfer line 2 is smaller than the number of horizontal lines. Therefore, the apparatus of the present embodiment is not allowed to transfer the all signal charges in the photodetection portions 1 together through the vertical transfer lines 2, different from the conventional image-pickup apparatus of the progressive scan type (FIG. 1) and the conventional image-pickup apparatus of the interlace scan type (FIG. 2).

Then, the gate structures 6 successively transfer the signal charges in the photodetection portions 1 to the potential wells established in the vertical transfer lines 2 according to the following procedures.

First, the gate structures 6 transfer the signal charges in the selected photodetection portions 1 to the potential wells 4 according to the reading order of the horizontal lines at the timing when the vacant potential wells 4 established in the vertical transfer lines 2 become adjacent to the selected photodetection portions 1. The signal charges thus transferred are moved along the vertical direction of the potential wells 4 while the vertical driving control system 5 controls each transfer electrode in the electrode string provided for each of the vertical transfer lines 2. Accordingly, the signal charges transferred to the vertical transfer lines 2 move in the vertical transfer lines 2 according to the movement of the potential wells to reach the horizontal transfer line 3.

In this image-pickup apparatus of the first embodiment, the transfer of signal charges is executed by setting a time difference between horizontal lines, thereby completing the reading operation for the all horizontal lines.

In this image-pickup apparatus of the first embodiment, since a plurality of potential wells 4 are established in each vertical transfer line 2, signal charges of plural lines can be preliminarily stored in the vertical transfer line 2. Such signal charges of plural lines are transferred in the vertical transfer line 2 over a plurality of horizontal periods.

In the conventional image-pickup apparatus of the CSD method (the third conventional example), only one potential well was established in each vertical transfer line, and thus the vertical transfer of signal charge had to be completed within one horizontal period. In contrast, this image-pickup apparatus of the first embodiment is arranged so that the signal charges can be vertically transferred over a plurality of horizontal periods; therefore, the driving speed of the vertical transfer lines 2 can be controlled to be low with no difficulty.

Further, in the image-pickup apparatus of the first embodiment the vertical driving control system 5 outputs the signal charges in the potential wells 4, having been transferred to the output end of the vertical transfer lines 2, to the horizontal transfer line 3 during a horizontal blanking interval. This operation adjusts the operation timing between the plural vertical transfer lines 2 and the horizontal transfer line 3, thus eliminating the need for providing a separate configuration for adjustment of timing.

Figure 5:
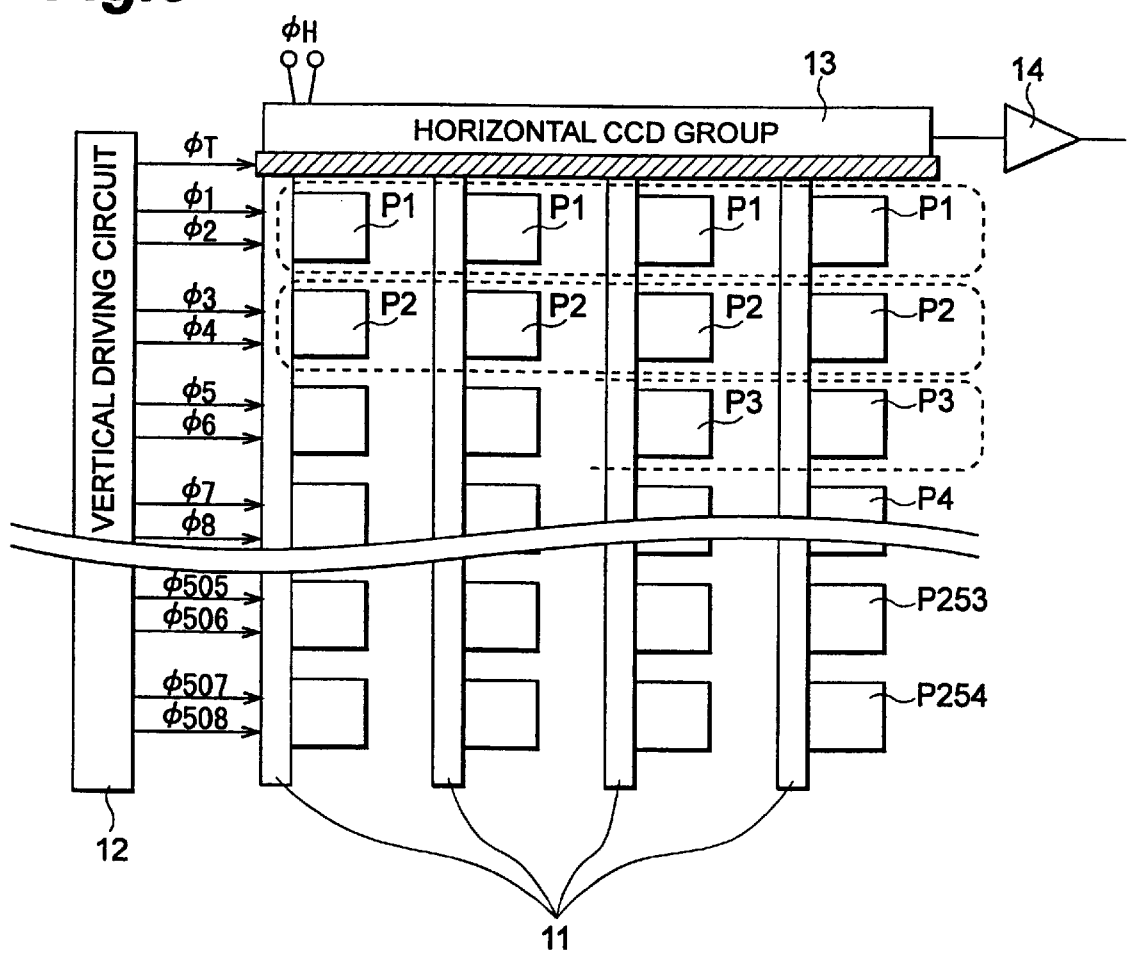
FIG. 5 is a drawing to show the schematic structure of the first embodiment of the image-pickup apparatus according to the present invention.

Next, FIG. 5 is a drawing to show a more specific configuration of the first embodiment of the image-pickup apparatus according to the present invention. In FIG. 5 the photodetection portions such as photodiodes are arrayed two-dimensionally on the image-pickup surface in the image-pickup apparatus of the first embodiment. These photodetection portions are arranged in 254 rows juxtaposed in the vertical direction. The photodetection portions in each horizontal line will be described as denoted by reference numerals of P1–P254.

The vertical transfer lines 11 (vertical CCD groups) are located each adjacent to one of vertical strings (vertical lines) of these photodetection portions P1 to P254. Electrodes $\phi 1$–$\phi 508$ and output electrode $\phi T$ are provided along the vertical direction on each of these vertical transfer lines 11. These electrodes $\phi 1$–$\phi 508$ and output electrode $\phi T$ are connected to vertical driving circuit 12.

This vertical driving circuit 12 is included in a vertical driving control system.

Figure 6:
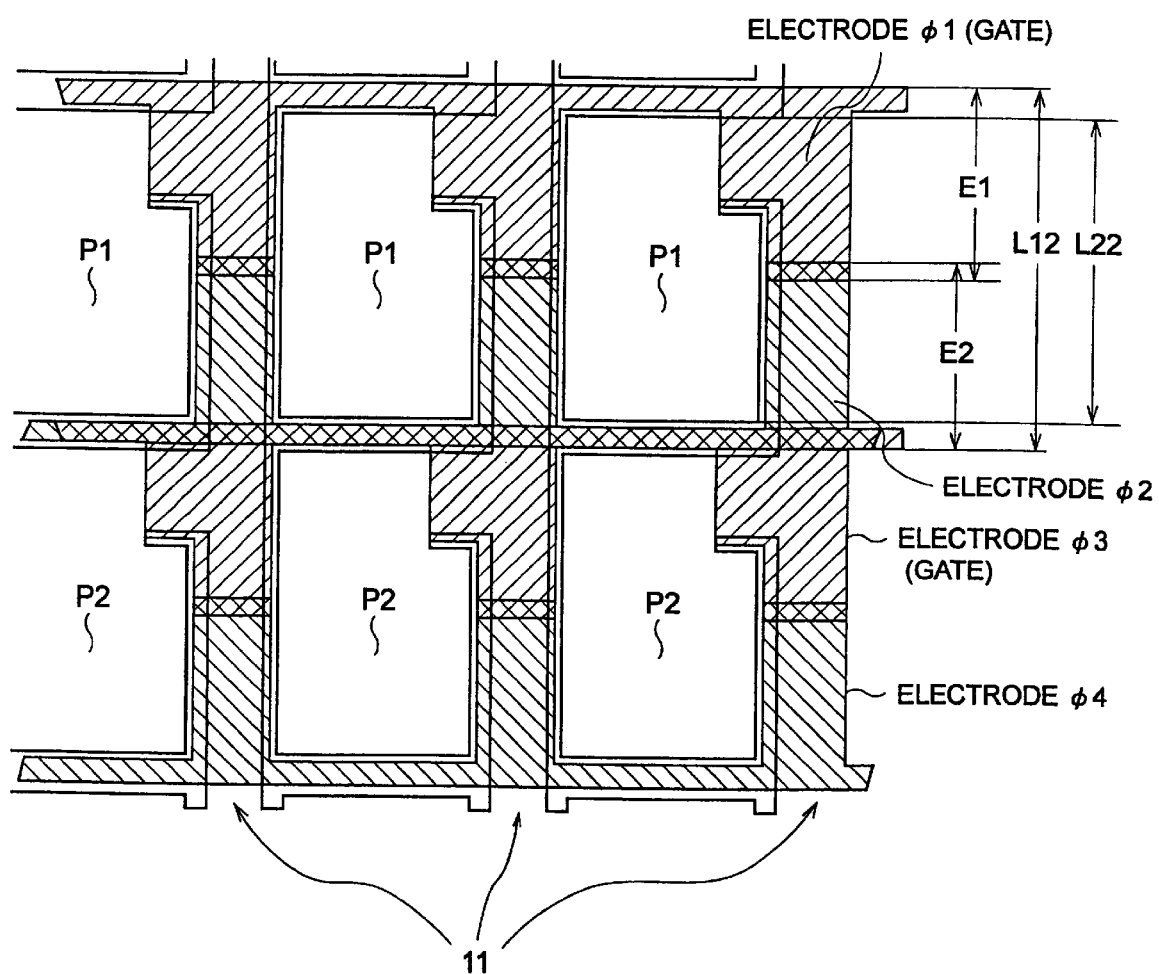
FIG. 6 is a drawing to show an electrode layout on the vertical transfer lines.

FIG. 6 shows the details of the electrode arrangement on the above-stated vertical transfer lines 11. In this FIG. 6, two electrodes $\phi 1$, $\phi 2$ are positioned per photodetection portion P1 on the vertical transfer line 11. One electrode $\phi 1$ is placed in contact with the photodetection portion P1, thereby also functioning as a gate structure 6. In this figure, E1 and E2 are vertical lengths of the respective electrodes, L12 is a vertical length of a potential well 4 established in the vertical transfer line 11, and L22 a vertical length of a horizontal line (a vertical length of a light receiving region in a photodetection portion).

On the output end side of the vertical transfer lines 11 the horizontal transfer line 13 (a horizontal CCD group) is placed along their output ends. Electrode $\phi H$ for transferring the signal charges in the horizontal direction is placed on this horizontal transfer line 13. An output amplifier 14 is connected to the output end of the horizontal transfer line 13.

Figure 7:
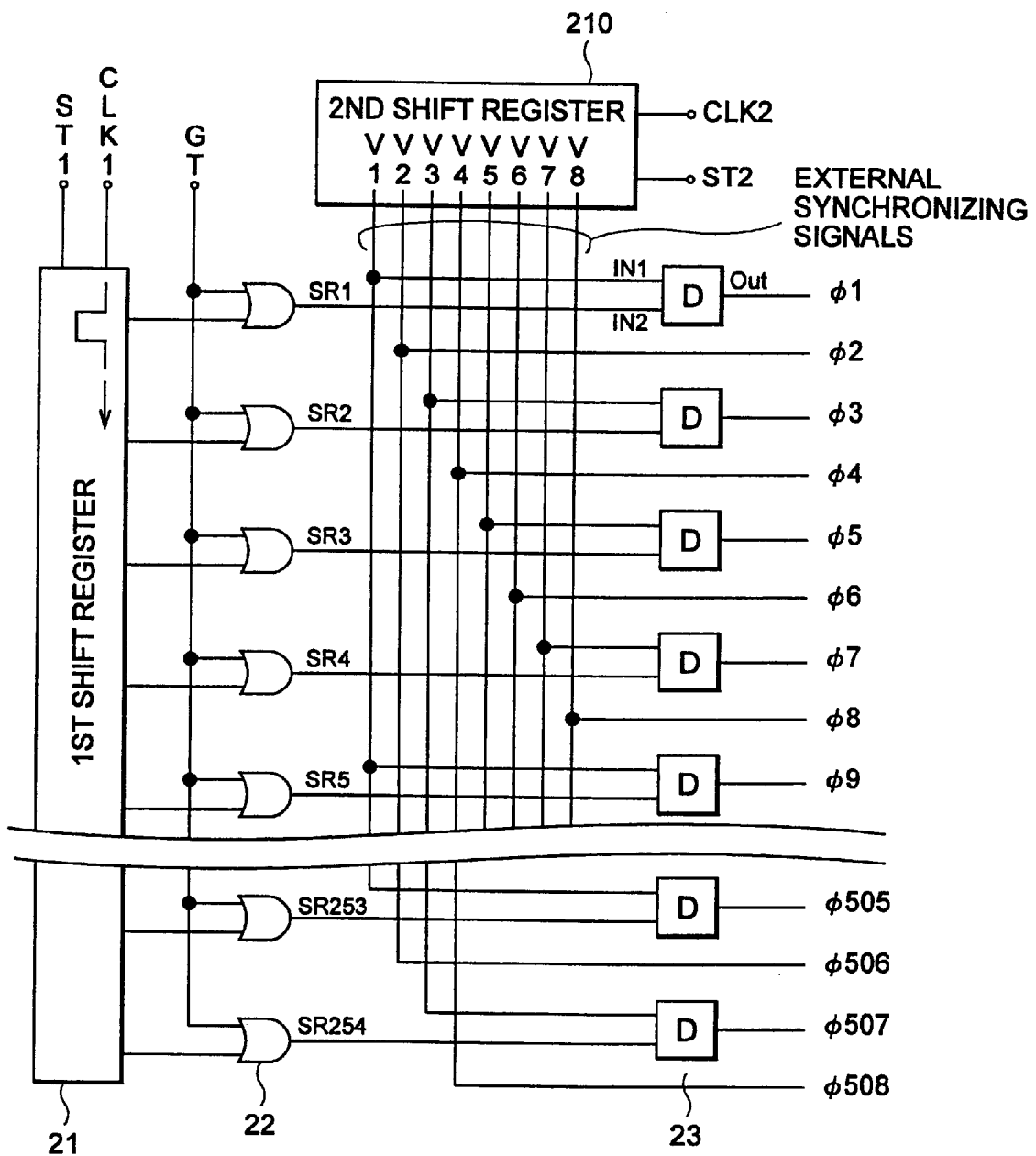
FIG. 7 is a drawing to show a specific configuration of the first embodiment shown in FIG. 5.

Next, FIG. 7 is a drawing to show a configuration of the vertical driving circuit 12 for applying predetermined voltage to the transfer electrodes $\phi 1$–$\phi 508$ in this embodiment.

This vertical driving circuit 12 has a first shift register 21 for receiving start pulse ST1 and clock CLK1 from the outside and a second shift register 210 for receiving start pulse ST2 and clock CLK2 from the outside. This first shift register 21 has output ports numbering 254 equal to the number of photodetection portions composing each vertical line, and outputs from these 254 output ports are supplied to corresponding 254 AND circuits 22, where logic operation is executed with gate pulse GT separately. In above-described FIG. 6 and this FIG. 7, an output port of the output electrode ϕT and others are not illustrated.

Each output SR1 to SR254 from the AND circuits 22 is supplied to input terminal IN2 of each of 254 ternary driver circuits 23. Input terminal IN1 of these driver circuits 23 is connected to an output port of the second shift register 210 for regularly outputting external synchronizing signal V1, V3, V5, V7.

Two hundred fifty four output terminals Out of such driver circuits 23 are connected each to the odd-numbered electrode ϕ1, ϕ3, . . . , ϕ507. On the other hand, the even-numbered electrodes ϕ2, ϕ4, . . . , ϕ508 are connected to the output ports of the second shift register 210 for regularly outputting external synchronizing signal V2, V4, V6, V8.

Figures 8, 9:
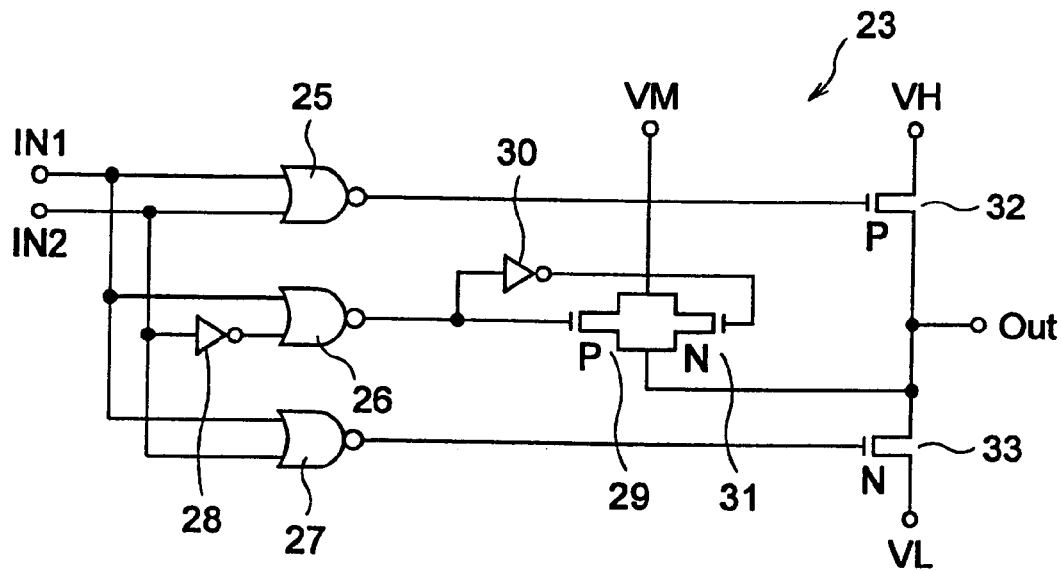
FIG. 8 is a drawing to show a configuration of a ternary driver circuit in a vertical driving circuit (included in a vertical driving control system)
FIG. 9 is a drawing to show a truth table of the ternary driver circuit shown in FIG. 8.

Next, FIG. 8 is a drawing to show the structure of the ternary driver circuit 23. In this FIG. 8, the input terminal IN1 is connected to a first input terminal of NAND circuit 25, to a first input terminal of NAND circuit 26, and to a first input terminal of NOR circuit 27. The input terminal IN2 is connected to a second input terminal of NAND circuit 25, to a second input terminal of NOR circuit 27, and to an input terminal of NOT circuit 28. An output terminal of the NOT circuit 28 is connected to a second input terminal of NAND circuit 26.

An output terminal of NAND circuit 25 is connected to the gate of PMOS transistor 32 and an output terminal of NOR circuit 27 to the gate of NMOS transistor 33. An output terminal of NAND circuit 26 is connected to the gate of PMOS transistor 29 and to an input terminal of NOT circuit 30 and an output terminal of NOT circuit 30 is connected to the gate of NMOS transistor 31.

Further, the source of PMOS transistor 29 and the drain of NMOS transistor 31 are connected each to constant voltage supply VM and the source of PMOS transistor 32 is connected to constant voltage supply VH. The source of NMOS transistor 33 is connected to constant voltage supply VL.

On the other hand, the drain of PMOS transistor 29, the source of NMOS transistor 31, the drain of PMOS transistor 32, and the drain of NMOS transistor 33 are connected each to the output terminal Out. FIG. 9 shows a truth table of this ternary driver circuit 23.

Figure 10:
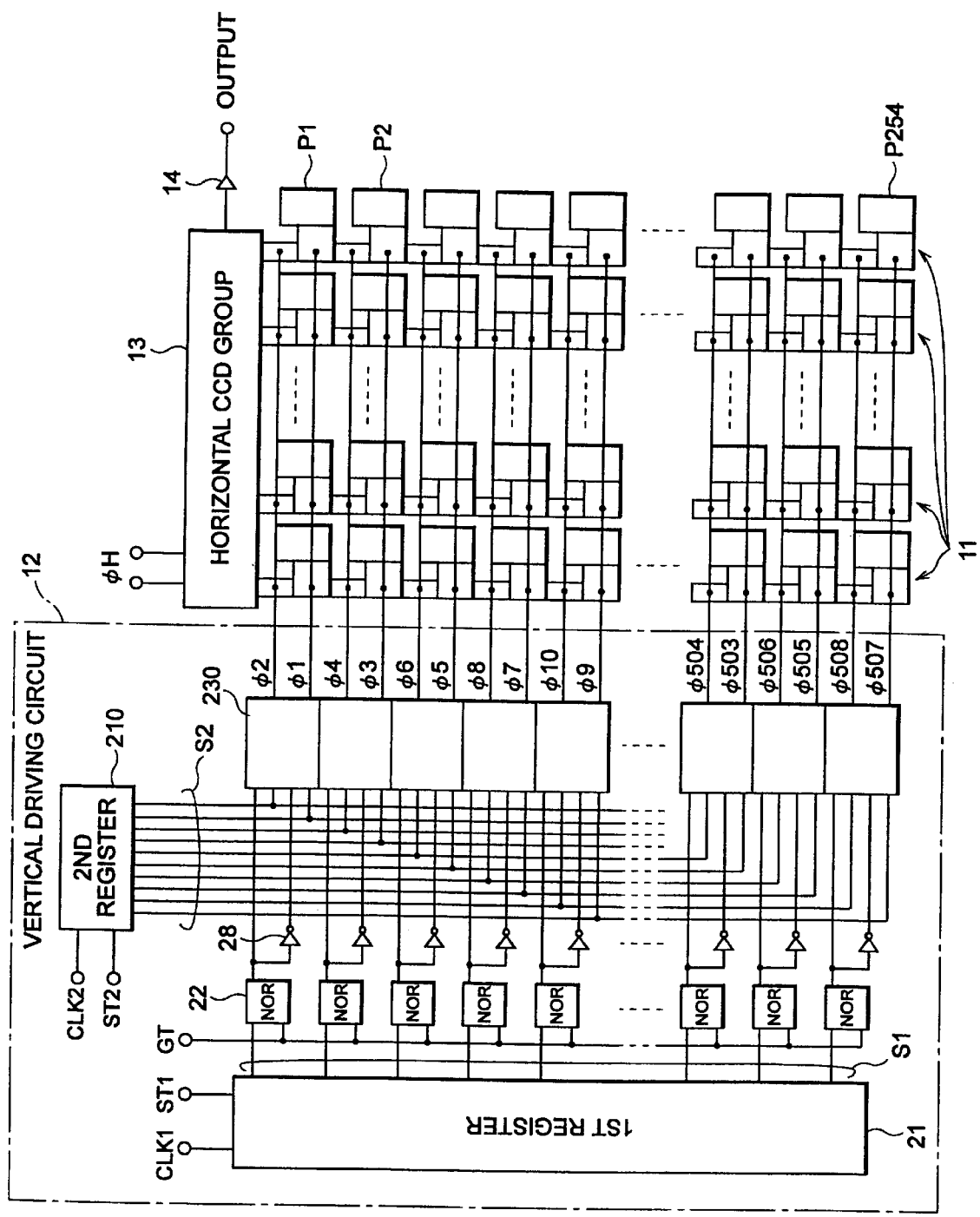
FIG. 10 is a drawing to show another specific configuration of the first embodiment shown in FIG. 5, which is a drawing to show the structure of an image-pickup apparatus including a circuit equivalent to the vertical driving circuit shown in FIG. 7.
Figure 11:
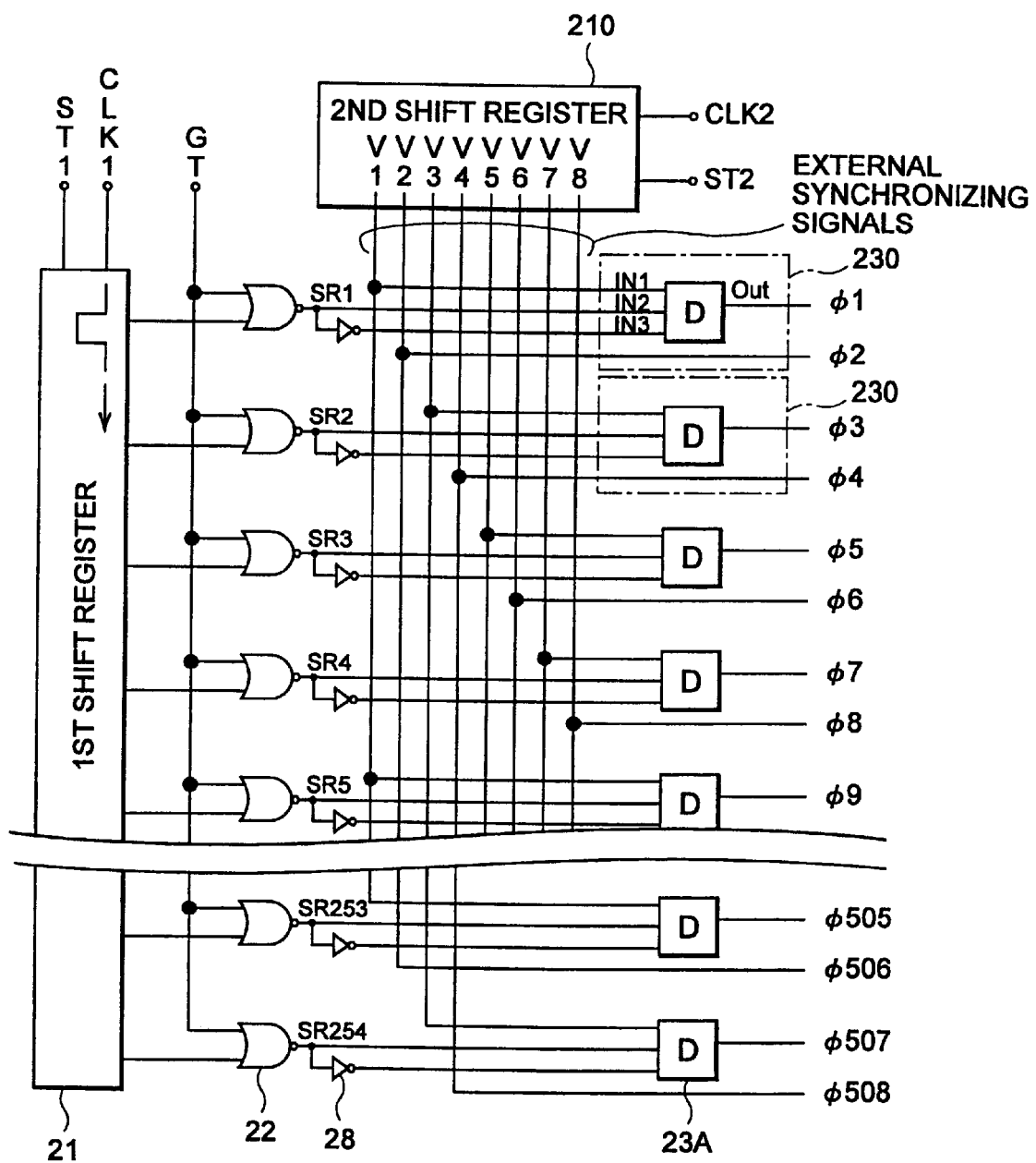
FIG. 11 is a drawing to show a circuit equivalent to the vertical driving circuit shown in FIG. 7, this circuit including a 3-input converting circuit as a ternary driver circuit.

FIG. 10 to FIG. 13 show a circuit layout equivalent to the vertical control circuit 12 and the driver circuits 23 in the above-stated vertical driving control system. Particularly, each of ternary driver circuits 230 in the vertical driving circuit 12 of FIG. 10 and FIG. 11 is provided with a 3-input converting circuit 23A having input terminals of IN1–IN3.

Figures 12, 13:
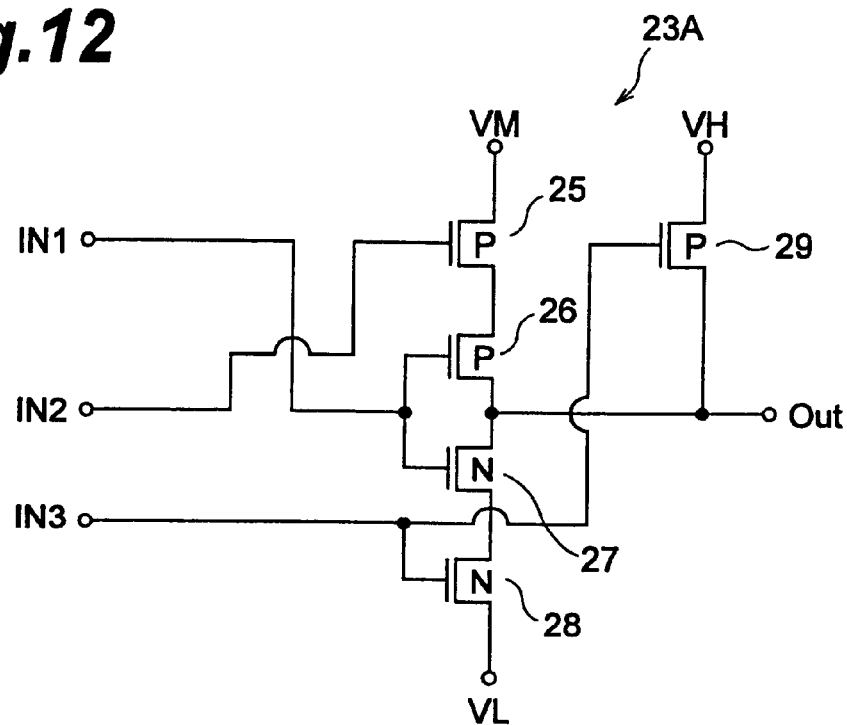
FIG. 12 is a drawing to show the detailed structure of the 3-input converting circuit shown in FIG. 11, which is a drawing to show the structure of the ternary driver circuit in the control system.
FIG. 13 is a drawing to show a truth table of the ternary converting circuit shown in FIG. 12.

FIG. 12 is a drawing to show the structure of the 3-input converting circuit 23A. In this figure, PMOS 25, PMOS 26, NMOS 27, and NMOS 28 are connected in series. One end of the PMOS 25 is connected to the constant voltage supply VM while one end of the NMOS 28 is connected to the constant voltage supply VL, thereby composing a so-called clocked CMOS type inverter.

The input terminal IN1 is connected to the gate of PMOS 26 and to the gate of NMOS 27, the gates being the input of this CMOS type inverter. The input terminal IN2 is connected to the gate of PMOS 25 and the input terminal IN3 to the gate of NMOS 26. The source of PMOS 26 and the drain of NMOS 27, being the output of the clocked CMOS inverter, are connected to the output terminal Out of the ternary driving circuit 23A.

Further, the source of PMOS 29 is connected to the output terminal Out of the ternary converting circuit 23A, the gate thereof to the input terminal IN3, and the drain thereof to the constant voltage supply VH.

In addition, FIG. 13 is a drawing to show a truth table of the above-stated ternary converting circuit 23A. In this truth table, since the signal level of the input terminal IN2 and the signal level of the input terminal IN3 are always inverse, the output Out is invalid when the signal levels of the respective input terminals IN2 and IN3 are equal.

The relation of correspondence between the conceptual drawing shown in FIG. 4 and this embodiment is as follows. Specifically, the photodetection portions 1 correspond to the photodetection portions P1–P256, the vertical transfer lines 2 to the vertical transfer lines 11 (vertical CCD groups), the horizontal transfer line 3 to the horizontal transfer line 13 (horizontal CCD group), the gate structures 6 to the electrodes in contact with the vertical driving circuit 12 and photodetection portion P1–P256, and the vertical driving control system 5 to the "function for vertically transferring the signal charges on the vertical transfer lines 11," of the vertical driving circuit 12.

Figure 14:
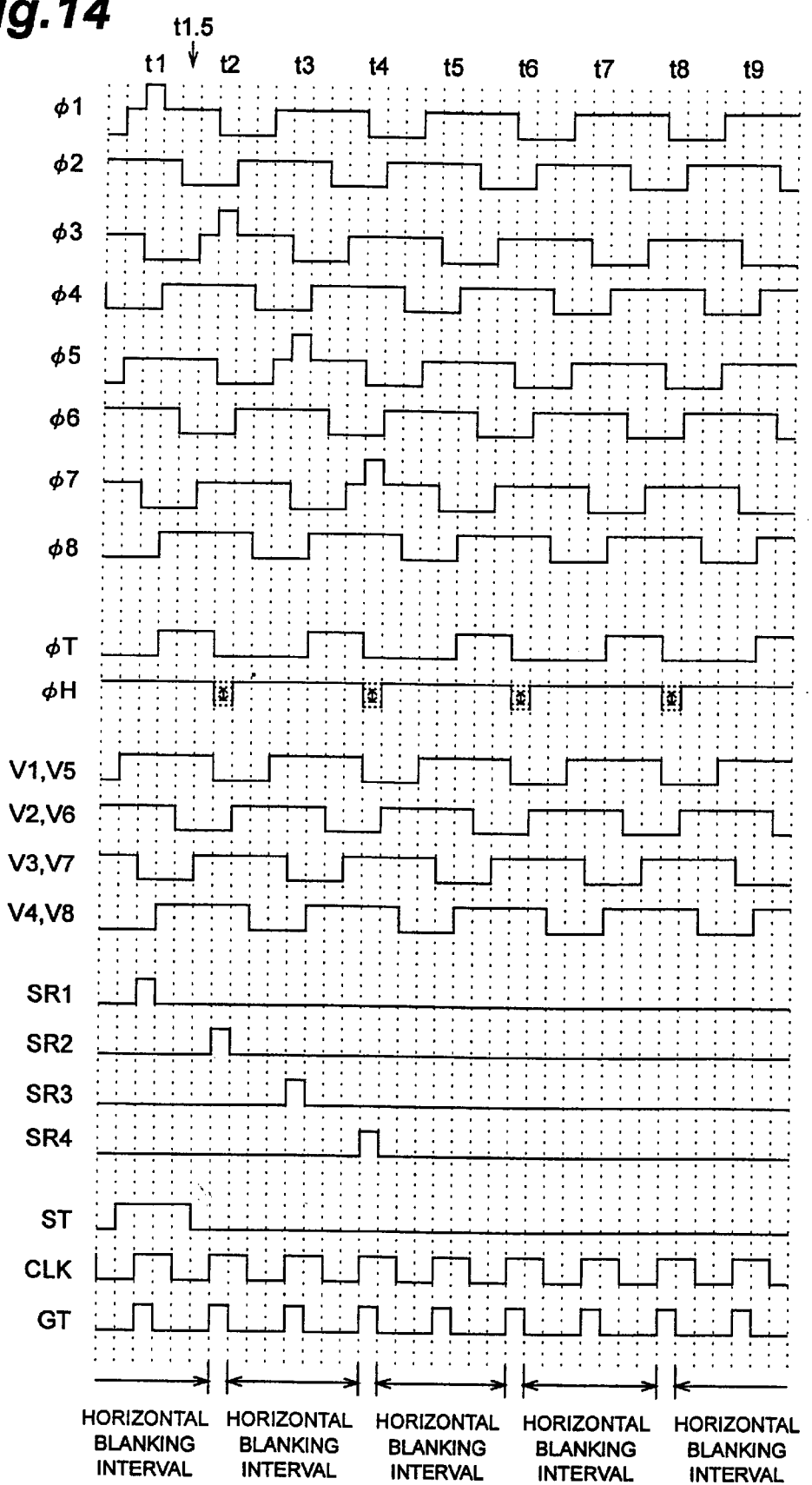
FIG. 14 is a drawing to show a timing chart in the first embodiment of the image-pickup apparatus according to the present invention.
Figure 15:
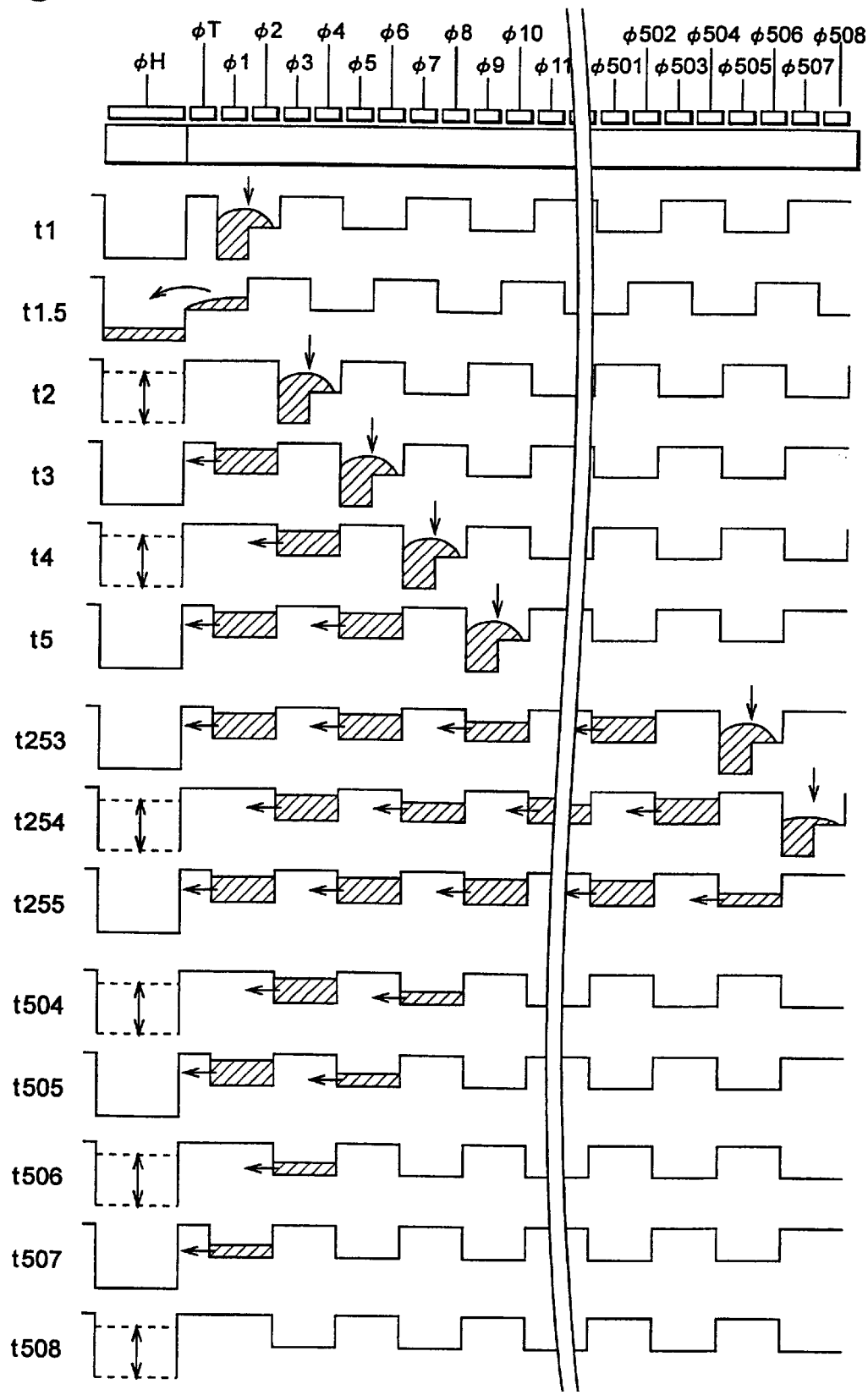
FIG. 15 is a drawing for explaining the operation (the driving method) of the first embodiment of the image-pickup apparatus according to the present invention.

Next, FIG. 14 is a drawing to show a timing chart of this image-pickup apparatus of the first embodiment and FIG. 15 a drawing for explaining the operation (the driving method) of this image-pickup apparatus of the first embodiment.

The driving method of the first embodiment will be described according to times t1 to t508 shown in FIG. 15.

First, at the time t1 the vertical driving circuit 12 applies the intermediate voltage VM to the electrode ϕ1 and to the electrode ϕ2 to establish the potential wells having the length (the length L12) not smaller than the vertical width L22 of the horizontal line including the photodetection portions P1.

In synchronism with the timing when the vacant potential wells become adjacent to the corresponding photodetection portions P1 in this way, the vertical driving circuit 12 applies the high voltage VH to the electrode ϕ1. This results in transferring the signal charges accumulated in the photodetection portions P1 to the potential wells.

Next, at the time t1.5 the vertical driving circuit 12 applies the intermediate voltage VM to the electrode ϕT to eliminate the barrier between each vertical transfer line 11 and the horizontal transfer line 13. In this state the vertical driving circuit 12 applies the low voltage to the electrode ϕ2, thereby pushing the signal charges in the potential wells to the horizontal transfer line 13. This pushing of signal charges is completed during a horizontal blanking interval.

At the time t2 the electrode ϕH of the horizontal transfer line 13 is driven, whereby the signal charges in the horizontal transfer line 13 are read out to the outside over one horizontal scan period. During this horizontal scan period the vertical driving circuit 12 applies the intermediate voltage VM to the electrode ϕ3 and to the electrode ϕ4, thereby establishing the potential wells having the length not smaller than the vertical width of the horizontal line including the photodetection portions P2.

In synchronism with the timing when the vacant potential wells become adjacent to the photodetection portions P2 in this way, the vertical driving circuit 12 applies the high voltage VH to the electrode φ3. This results in transferring the signal charges accumulated in the photodetection portions P2 to the vacant potential wells.

At the time t3 the vertical driving circuit 12 transfers the signal charges, having been transferred from the photodetection portions P2, to below the electrode φ1 and electrode φ2 with movement of the potential wells. On the other hand, the vertical driving circuit 12 applies the intermediate voltage VM to the electrode φ5 and to the electrode φ6, thus establishing the potential wells having the length not smaller than the vertical width of the horizontal line including the photodetection portions P3.

In synchronism with the timing when the vacant potential wells become adjacent to the photodetection portions P3 in this way, the vertical driving circuit 12 applies the high potential VH to the electrode φ5. This results in transferring the signal charges accumulated in the photodetection portions P3 to the vacant potential wells.

Further, at the time t4 the vertical driving circuit 12 controls the electrode φT so as to output the signal charges taken from the photodetection portions P2 to the horizontal transfer line 13 within a horizontal blanking interval. On the other hand, the predetermined voltage is applied to the electrode φH in the horizontal transfer line 13, whereby the signal charges in the horizontal transfer line 13 are read out to the outside over one horizontal scan period.

During this horizontal scan period the vertical driving circuit 12 applies the intermediate voltage VM to the electrode φ7 and to the electrode φ8, thereby establishing the potential wells having the length not smaller than the vertical width of the horizontal line including the photodetection portions P4.

In synchronism with the timing when the vacant potential wells become adjacent to the photodetection portions P4 in this way, the vertical driving circuit 12 applies the high voltage VH to the electrode φ7. This results in transferring the signal charges accumulated in the photodetection portions P4 to the vacant potential wells.

At the time t5 the vertical driving circuit 12 transfers the signal charges taken from the photodetection portions P3, P4 each one step in the vertical direction with movement of the potential wells (the potential wells including the signal charges are moved toward the horizontal transfer line 13).

In this state the vertical driving circuit 12 applies the intermediate voltage VM to the electrode φ9 and to the electrode φ10, thereby establishing the potential wells having the length not smaller than the vertical width of the horizontal line including the photodetection portions P5.

In synchronism with the timing when the vacant potential wells become adjacent to the photodetection portions P5 in this way, the vertical driving circuit 12 applies the high voltage VH to the electrode φ9. This results in transferring the signal charges accumulated in the photodetection portions P5 to the vacant potential wells.

Subsequently, the above-stated operation is repeated at the times t6 to t254, whereby the signal charges in the photodetection portions P3 to P127 are read out through the plural vertical transfer lines 11 and horizontal transfer line 13 to the outside.

On the other hand, the signal charges in the photodetection portions P128 to P254 remain in the vertical transfer lines 11. At the times t255 to t507, therefore, transfer of signal charge is stopped from the photodetection portions P1 to P254 to the vertical transfer lines 11 and the signal charges remaining in the vertical transfer lines 11 are read out in order from the output ends of the vertical transfer lines 11 through the horizontal transfer line 13.

Further, at the time t508 the signal charges taken out of the photodetection portions P254 are read out through the horizontal transfer line 13 to the outside, which completes reading of the all signal charges of one frame to the outside.

As described above, this image-pickup apparatus of the first embodiment is constructed so that the vertical length of each potential well is not smaller than the vertical width of each horizontal line. This can assure larger charge storage amounts of potential wells than in the case of the short potential wells as in the first conventional example of the progressive scan type (FIG. 1) and the second conventional example of the interlace scan type (FIG. 2) accordingly. As a result, the decrease of the horizontal width of the vertical transfer lines 11 can be realized without any difficulty.

Figure 3:
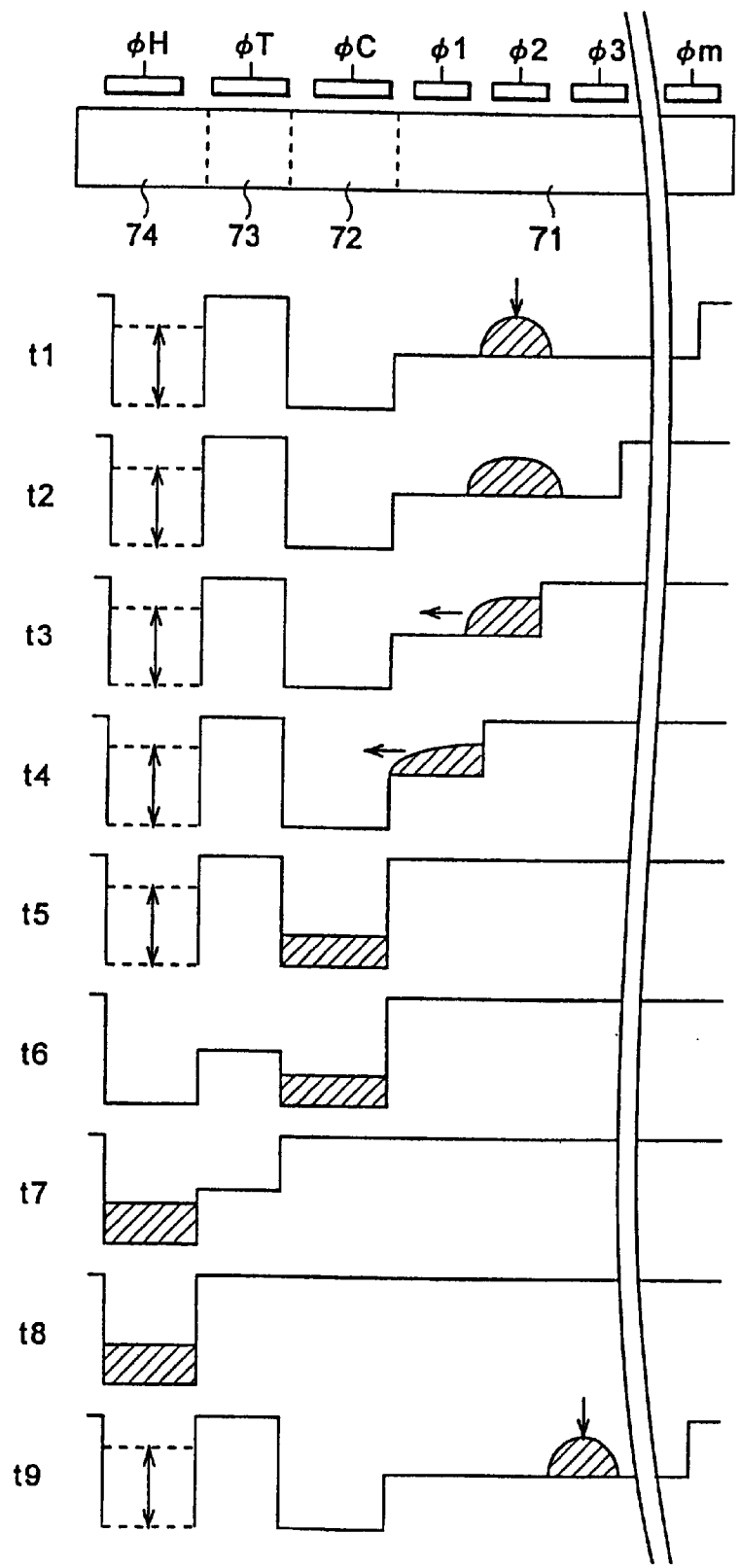
FIG. 3 is a drawing for explaining the operation of the conventional image-pickup apparatus of the CSD method (the third conventional example)

In the image-pickup apparatus of the first embodiment at least one potential well containing a signal charge moves up to the output end of each vertical transfer line over plural horizontal periods. The driving speed of vertical transfer line can be decreased remarkably as against the third conventional example of the CSD method (FIG. 3).

Further, the signal charges are outputted from the vertical transfer lines 11 to the horizontal transfer line 13 only during the horizontal blanking interval in the image-pickup apparatus of the first embodiment. There is, therefore, no need for providing the storage areas of signal charge between the output ends of the vertical transfer lines 11 and the horizontal transfer line 13.

SECOND EMBODIMENT

Figure 16:
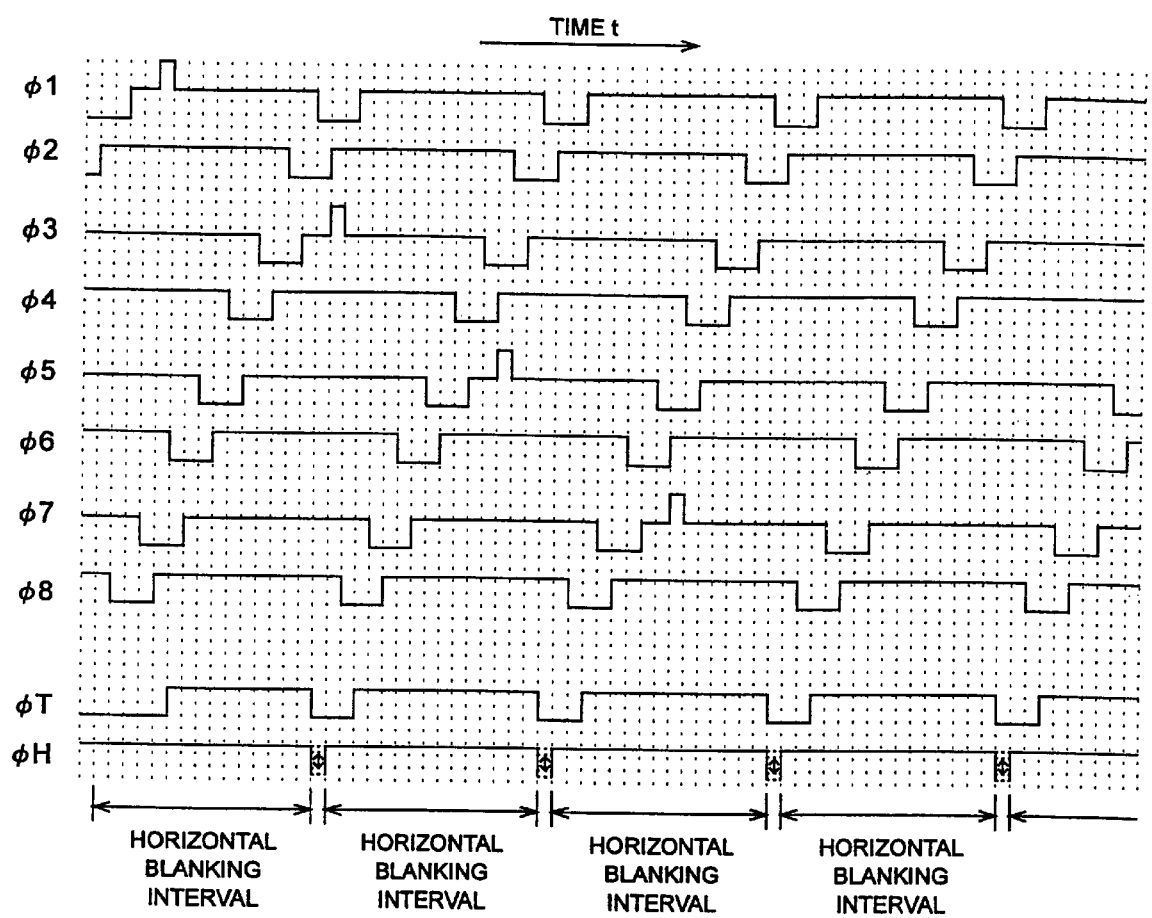
FIG. 16 is a drawing to show a timing chart in the second embodiment of the image-pickup apparatus according to the present invention.
Figure 17:
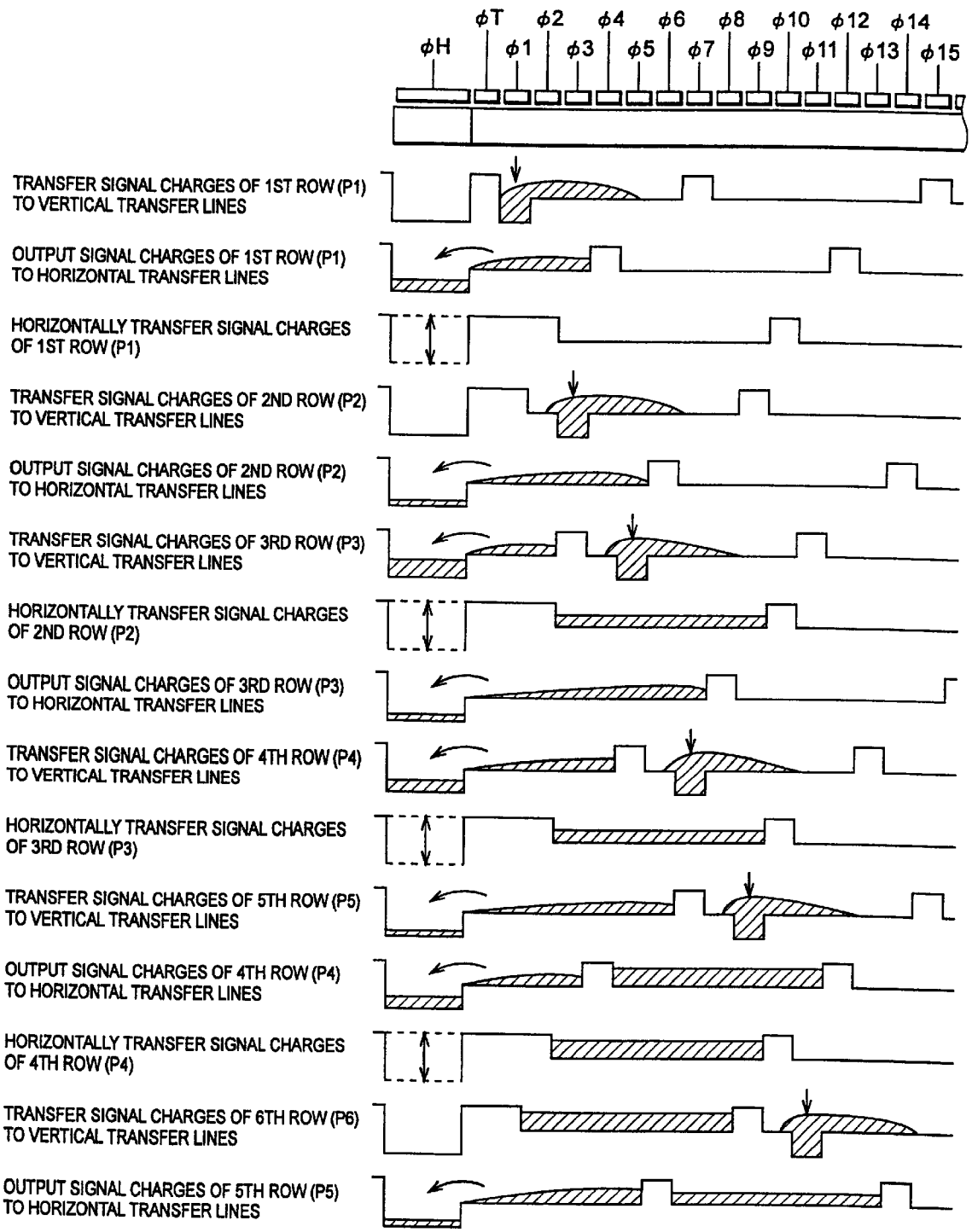
FIG. 17 is a drawing for explaining the operation (the driving method) of the second embodiment of the image-pickup apparatus according to the present invention.

Next, FIG. 16 is a drawing to show a timing chart of the second embodiment of the image-pickup apparatus according to the present invention and FIG. 17 is a drawing for explaining the operation (the driving method) of the second embodiment of the image-pickup apparatus according to the present invention. Since the structure of the image-pickup apparatus of the second embodiment is the same as that of the image-pickup apparatus of the first embodiment (FIG. 5) described above, redundant description is omitted herein.

The operation (the driving method) of the second embodiment will be described below.

First, the vertical driving circuit 12 applies the intermediate voltage VM to each group of 6–7 electrodes on each of the vertical transfer lines 11, thereby establishing a plurality of potential wells having the length of 3–3.5 horizontal lines.

Next, the vertical driving circuit 12 applies 8-phase driving pulses to the electrodes φ1–φ508 on the vertical transfer lines 11 only during a horizontal blanking interval, thereby successively moving these potential wells toward the horizontal transfer line 13.

The vertical driving circuit 12 selects the photodetection portions P1 to P254 in the ascending order in accordance with the reading order of the horizontal lines and applies the high voltage VH to the electrode φ(2n−1) at the timing when the photodetection portions Pn selected come to be adjacent to the vacant potential wells.

By this operation, the signal charges in the photodetection portions P1–P254 are successively transferred into the potential wells established in the vertical transfer lines 11 with a time difference and are read out through the plural vertical transfer lines 11 and horizontal transfer line 13 to the outside.

In the image-pickup apparatus of the second embodiment the vertical length of each potential well is equal to the vertical width of 3–3.5 horizontal lines. Accordingly, the image-pickup apparatus of the second embodiment can assure charge storage amounts of potential wells approximately three to four times greater than those in the case of the short potential wells as in the first conventional example of the progressive scan type (FIG. 1) and the second conventional example of the interlace scan type (FIG. 2). As a result, the horizontal width of the vertical transfer lines 11 can be decreased with no difficulty.

In the image-pickup apparatus of the second embodiment at least one potential well containing a signal charge moves up to the output end of each vertical transfer line over plural horizontal periods. Therefore, the driving speed of vertical transfer line can be decreased remarkably as against the third conventional example of the CSD method (FIG. 3).

Further, the signal charges are transferred from the vertical transfer lines 11 to the horizontal transfer line 13 only during the horizontal blanking interval in the image-pickup apparatus of the second embodiment. There is, therefore, no need for providing the storage areas of signal charge between the plural vertical transfer lines 11 and the horizontal transfer line 13.

THIRD EMBODIMENT

Figure 18:
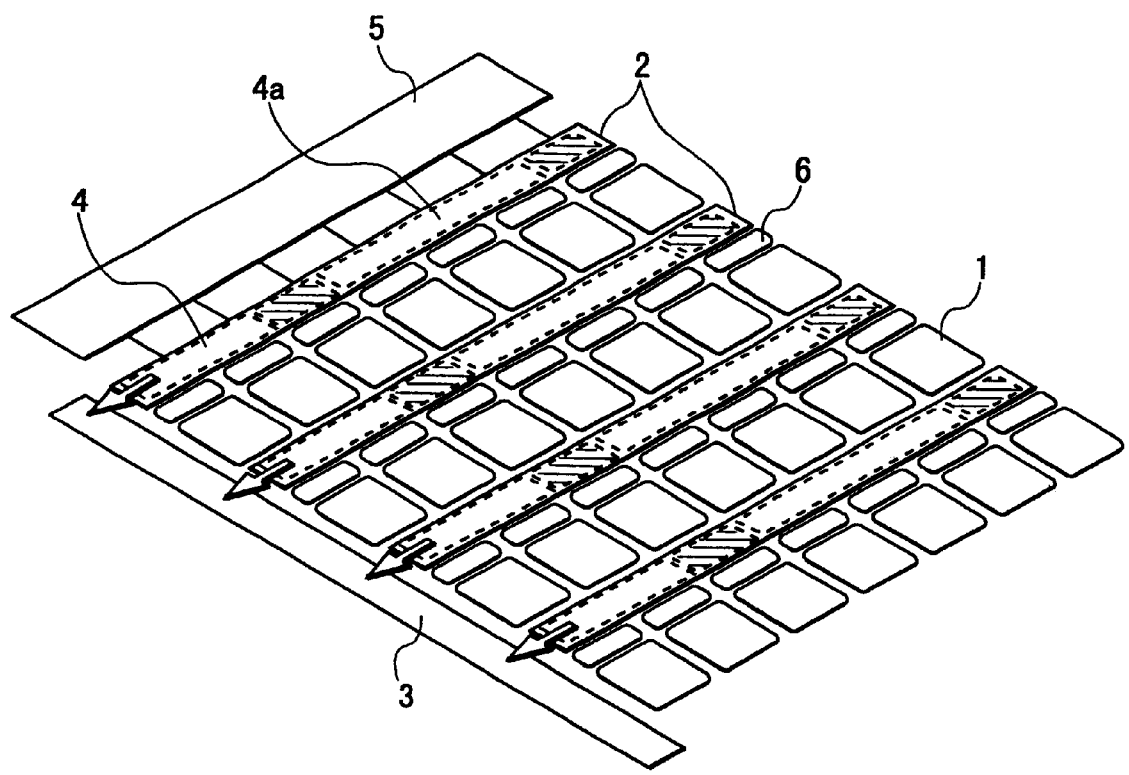
FIG. 18 is a conceptual drawing of the third embodiment of the image-pickup apparatus according to the present invention.

FIG. 18 is a conceptual drawing of the third embodiment of the image-pickup apparatus according to the present invention.

In this image-pickup apparatus of the third embodiment the vertical driving control system 5 establishes in each vertical transfer line 11 a main potential well 4 in which a signal charge being a transferred object is present, and an auxiliary potential well 4a, subsequent to the main potential well 4, for transferring a leak of the signal charge. The apparatus is characterized in that the vertical driving control system 5 outputs (or adds) to each horizontal transfer line 3 a signal charge in the main potential well 4 and a leak thereof collected in the auxiliary potential well 4a subsequent to the main potential well 4.

This auxiliary potential well 4a is formed in order to collect the transfer leak from the preceding main potential well 4, which can surely prevent such a malfunction that the transfer leak of signal charge is mixed in another signal charge.

In this image-pickup apparatus of the third embodiment, the signal charge in the main potential well 4, together with the leak of signal charge collected in the auxiliary potential well 4a subsequent to the main potential well 4, is outputted to the horizontal transfer line 3, and this prevents the transfer leak of signal charge from being lost, thereby increasing the transfer efficiency of signal charge in the vertical transfer lines 2.

The specific structure of this image-pickup apparatus of the third embodiment is the same as that of the image-pickup apparatus (FIG. 5) of the first and second embodiments described previously.

Figure 19:
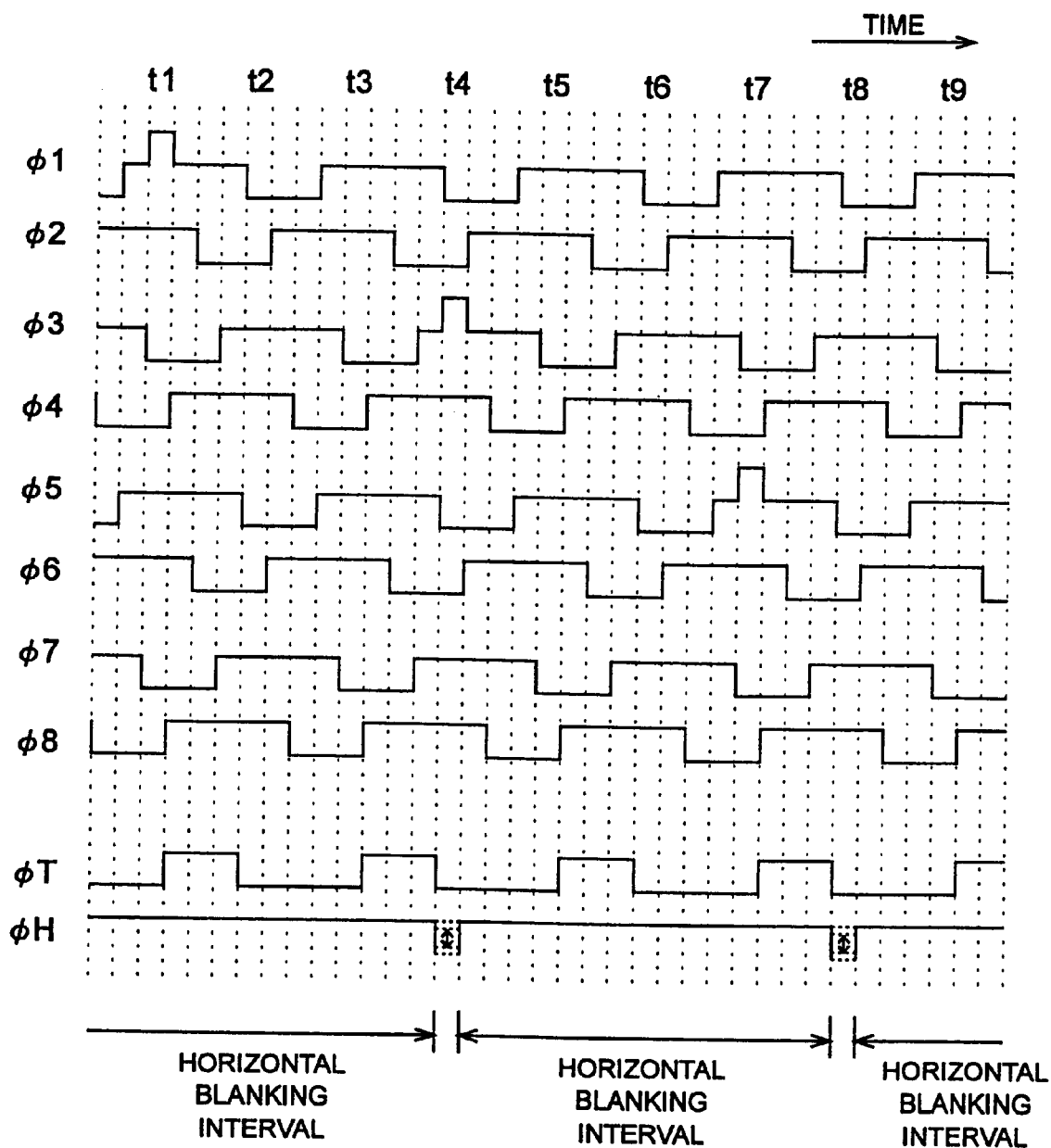
FIG. 19 is a drawing to show a timing chart in the third embodiment of the image-pickup apparatus according to the present invention.
Figure 20:
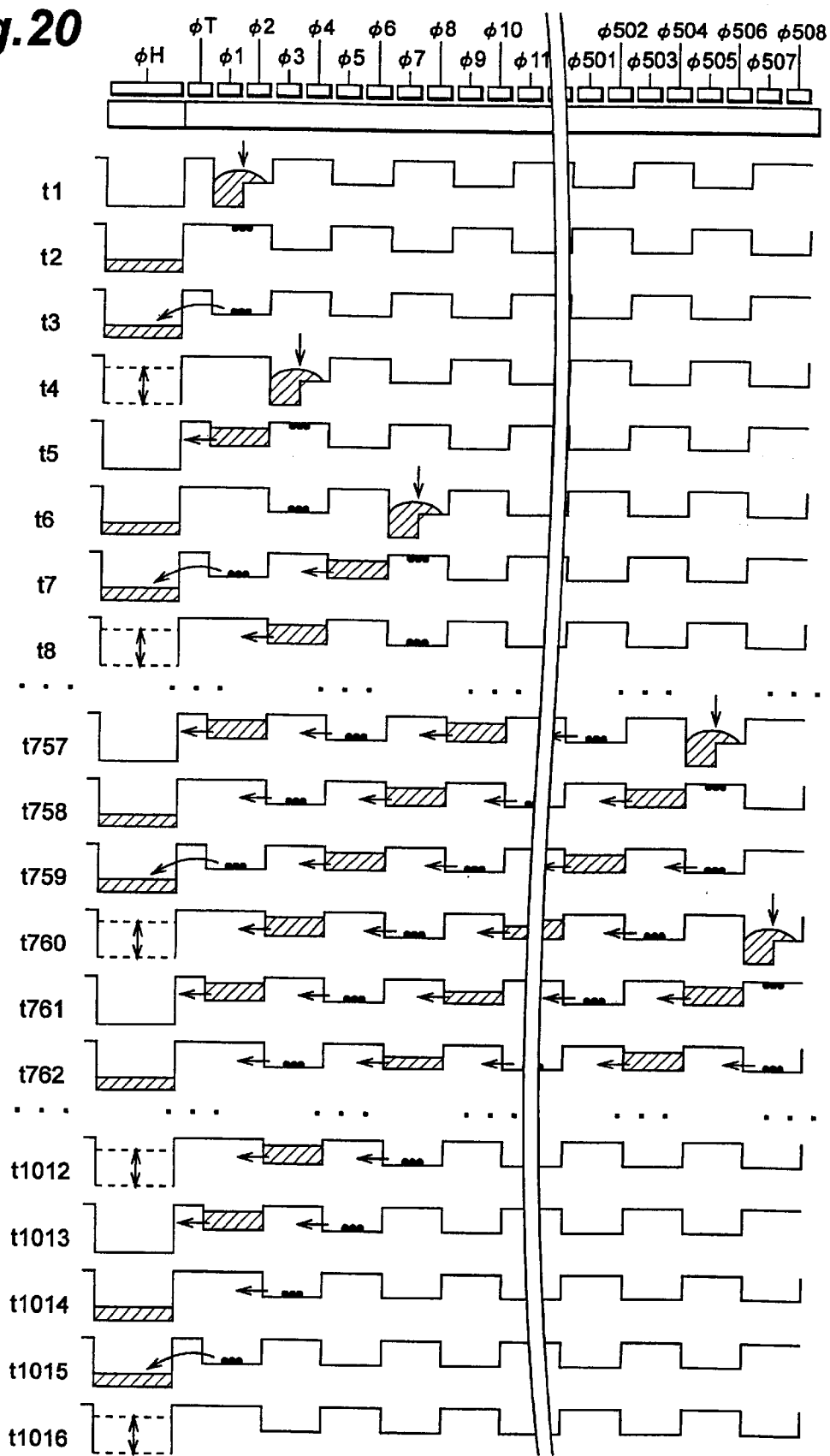
FIG. 20 is a drawing for explaining the operation (the driving method) of the third embodiment of the image-pickup apparatus according to the present invention.

FIG. 19 is a drawing to show a timing chart of the third embodiment in this image-pickup apparatus according to the present invention and FIG. 20 is a drawing for explaining the operation (the driving method) of the third embodiment of the image-pickup apparatus according to the present invention.

An operational feature of this image-pickup apparatus of the third embodiment is that in each vertical transfer line 11 the auxiliary potential well is established subsequent to the main potential well in which the signal charge exists.

Since in this third embodiment the main potential well and auxiliary potential well are established adjacent to each other in each vertical transfer line, the subsequent auxiliary potential well collects the leak (black dots in FIG. 20) of signal charge occurring upon transfer of the signal charge. Accordingly, this eliminates the malfunction of mixture of the leak in another signal charge, thereby surely preventing decrease in the vertical resolution of image.

Since the leak collected by the auxiliary potential well is added again to the signal charge in the horizontal transfer line 13, the transfer leak is not lost and the transfer efficiency of signal charge can be increased.

FOURTH EMBODIMENT

Figure 21:
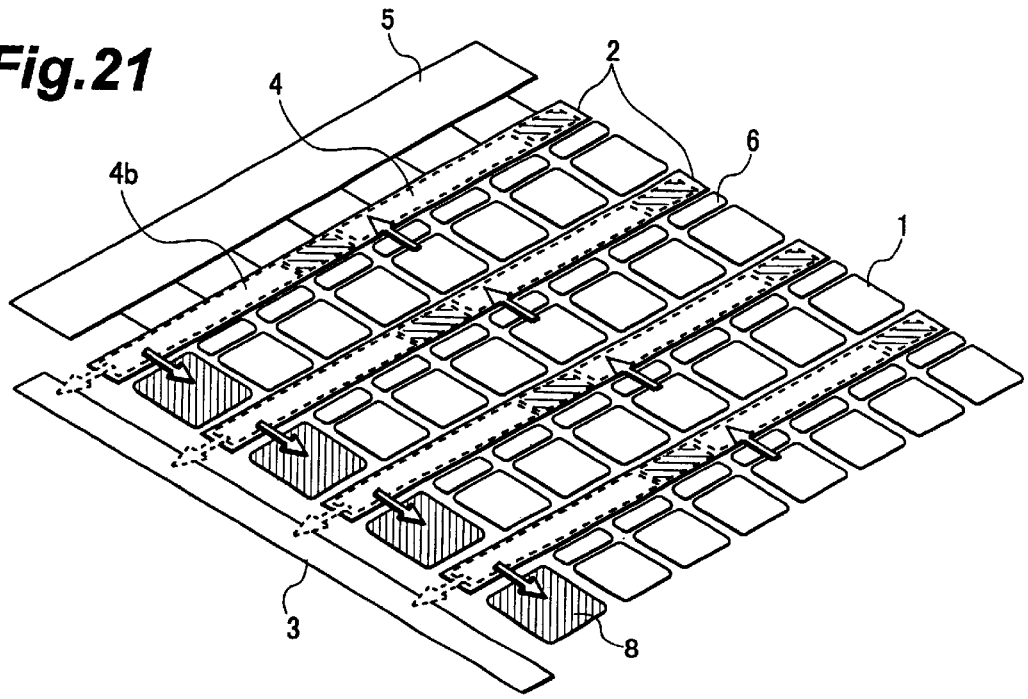
FIG. 21 is a conceptual drawing of the fourth embodiment of the image-pickup apparatus according to the present invention.

FIG. 21 is a conceptual drawing of the fourth embodiment of the image-pickup apparatus according to the present invention. This image-pickup apparatus of the fourth embodiment is provided with discharge areas 8 into which undesired charges are swept out of the vertical transfer lines 2.

In this image-pickup apparatus of the fourth embodiment the vertical driving control system 5 thus controls the gate structures in such a way that the undesired charges accumulated in the photodetection portions 1 are transferred to the potential wells 4b and after a lapse of a predetermined exposure time from the time of the transfer of undesired charge the signal charges accumulated in the photodetection portions 1 are again transferred to other potential wells 4. The vertical driving control system 5 is featured by performing such control that the control system 5 determines whether a charge passing a predetermined portion in each vertical transfer line 2 is undesired charge, based on the timing of transfer of signal charge, and sweeps the undesired charge away into the discharge area 8.

According to this operation, the potential well 4b with the undesired charge therein and the potential well 4 with the signal charge both are present in each vertical transfer line 2 and the charges are vertically transferred in one direction. On the other hand, the undesired charge is discharged into the discharge area 8 by the vertical driving control system 5, so that only the signal charge accumulated for the predetermined exposure period reaches the horizontal transfer line 3 to be read out to the outside. The electronic shutter function can be realized by properly setting this exposure period.

Figure 22:
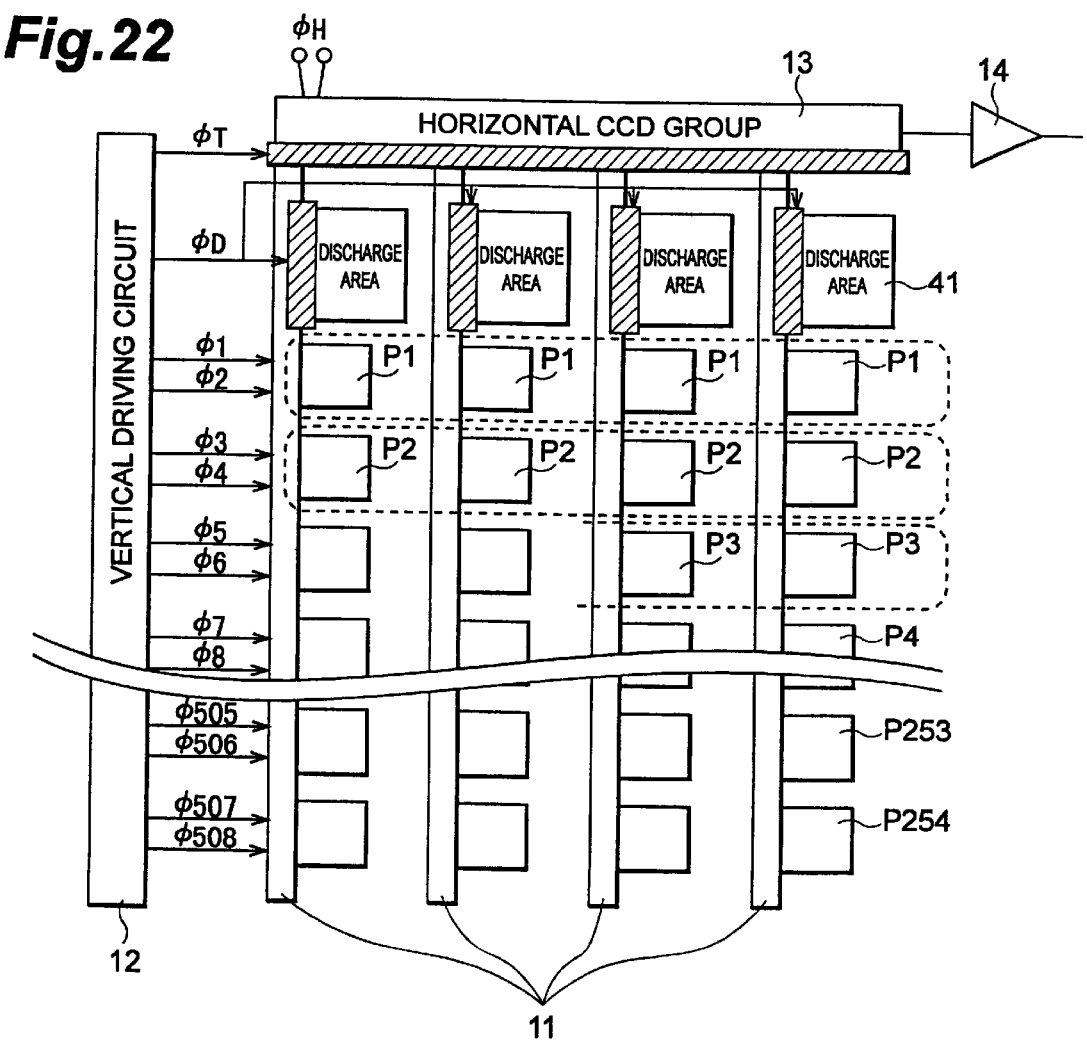
FIG. 22 is a drawing to show the schematic structure of the fourth embodiment of the image-pickup apparatus according to the present invention.

FIG. 22 is a drawing to show a specific configuration of the fourth embodiment of the image-pickup apparatus according to the present invention. As described above, the structural feature of this image-pickup apparatus of the fourth embodiment is that a plurality of discharge areas 41 into which the undesired charges are discharged are provided between the plural vertical transfer lines 11 and the horizontal transfer line 13 and an electrode φD for controlling the discharge areas 41 is connected to the vertical driving circuit 12.

Similar components to those shown in FIG. 5 are illustrated in FIG. 22 with the same reference symbols and the description thereof is omitted herein.

Figure 23:
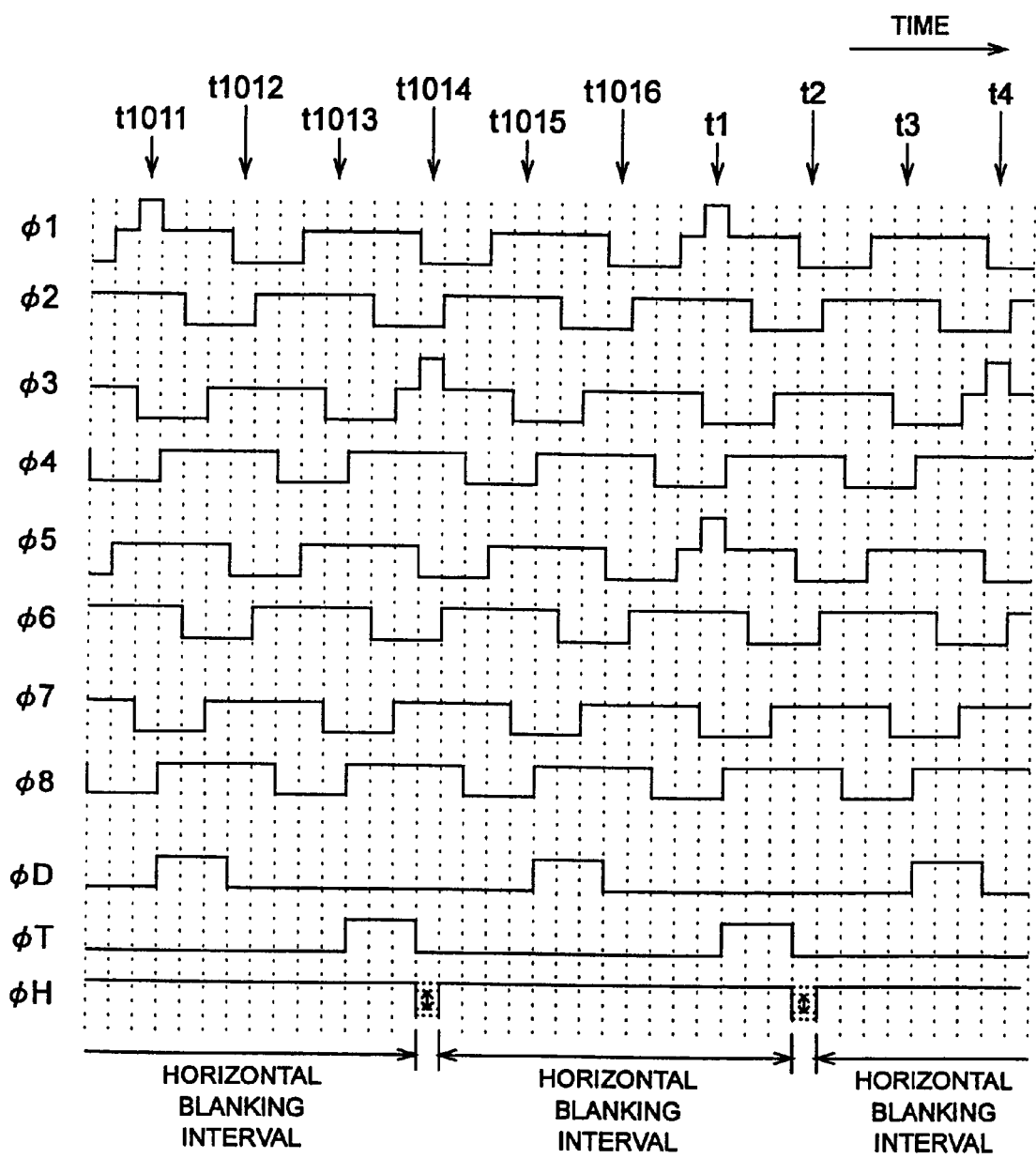
FIG. 23 is a drawing to show a timing chart in the fourth embodiment of the image-pickup apparatus according to the present invention.
Figure 24:
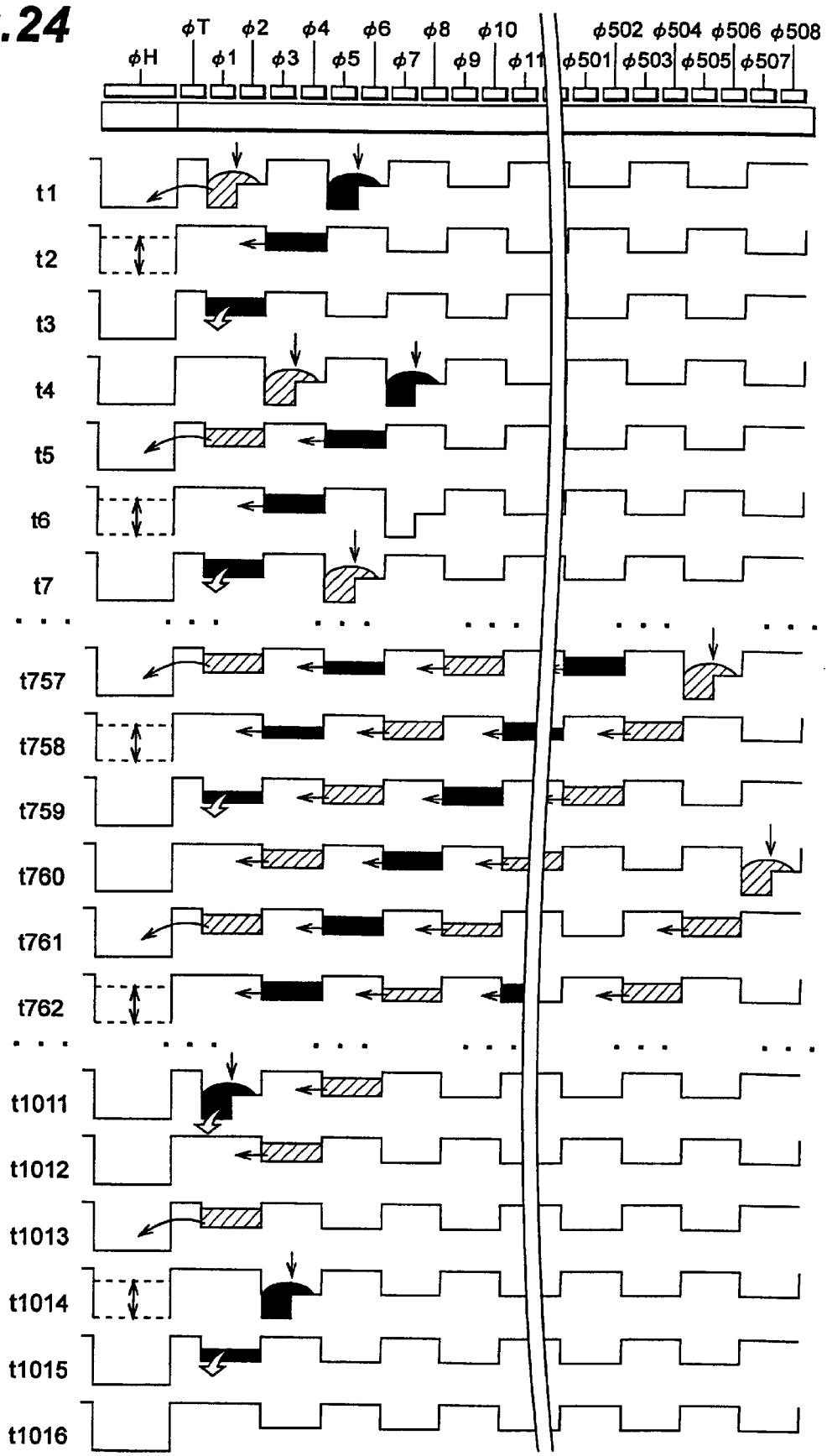
FIG. 24 is a drawing for explaining the operation (the driving method) of the fourth embodiment of the image-pickup apparatus according to the present invention.

FIG. 23 is a drawing to show a timing chart of the fourth embodiment of the image-pickup apparatus according to the present invention and FIG. 24 is a drawing for explaining the operation (the driving method) of the fourth embodiment of the image-pickup apparatus according to the present invention.

Operational features of this image-pickup apparatus of the fourth embodiment are two points below.

(1) Undesired charges accumulated in the photodetection portions are transferred to the potential wells to sweep the charges out of the photodetection portions and the signal charges accumulated during the predetermined exposure period are transferred again to other potential wells.

(2) Based on the transfer timing of undesired charges, whether the charges passing beside the discharge areas 41 are undesired charges is determined and if undesired charges the predetermined voltage is applied to the electrode φD to discharge the undesired charges into the discharge areas 41.

For example, in FIG. 24, at the time t1011 undesired charges in the photodetection portions P1 are swept away and signal charges accumulated from this instant to the time t1 are read out to the outside. At the time t1014 undesired charges in the photodetection portions P2 are swept away and signal charges accumulated from this instant to the time t4 are read out to the outside.

Further, undesired charges in the photodetection portions P3 are swept away at the time t1 and signal charges accumulated from this instant to the time t7 are read out to the outside.

In this image-pickup apparatus of the fourth embodiment the above operation restricts the exposure time of the photodetection portions, whereby the function of electronic shutter can be realized.

Figure 25:
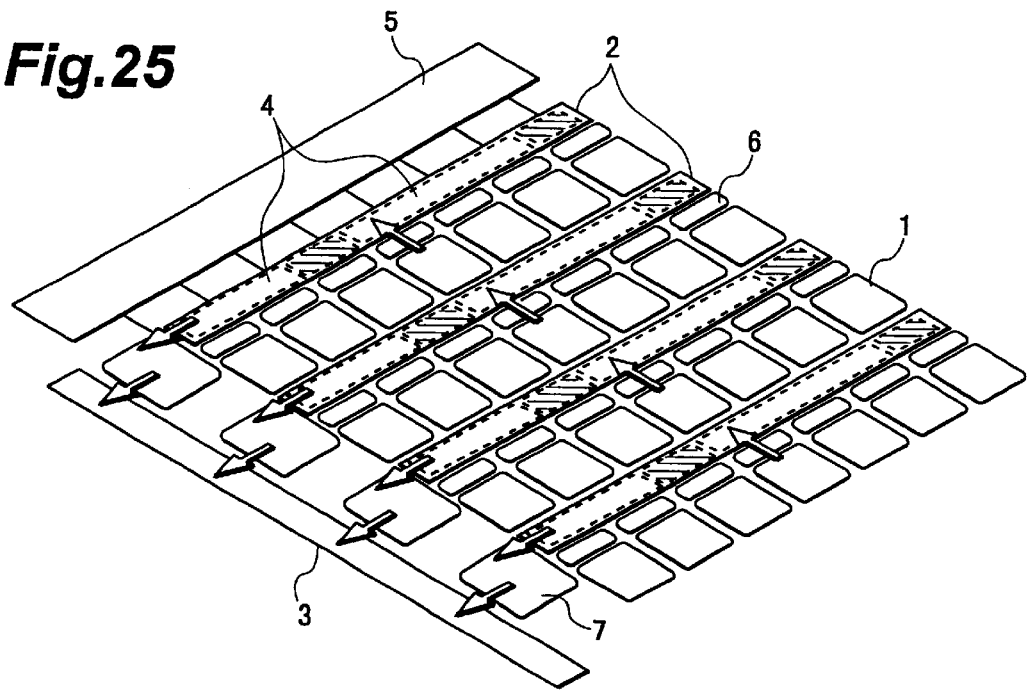
FIG. 25 is a conceptual drawing of a first application example of the image-pickup apparatus according to the present invention.

The image-pickup apparatus of the first to the fourth embodiments described above are not provided with a special structure for storing the signal charges between the plural vertical transfer lines 11 and the horizontal transfer line 13, but, for example, the image-pickup apparatus shown in FIG. 25 (the first application example) is provided with storage areas 7 for temporarily storing the signal charges between the plural vertical transfer lines 2 and the horizontal transfer line 3. Accordingly, the vertical driving control system 5 is featured by temporarily storing the signal charges in the potential wells 4, having been moved to the output end of each vertical transfer line 2, in the storage areas 7, awaiting a horizontal blanking interval, and then outputting the signal charges in the storage areas 7 to the horizontal transfer line 3 during the horizontal blanking interval.

Figure 26:
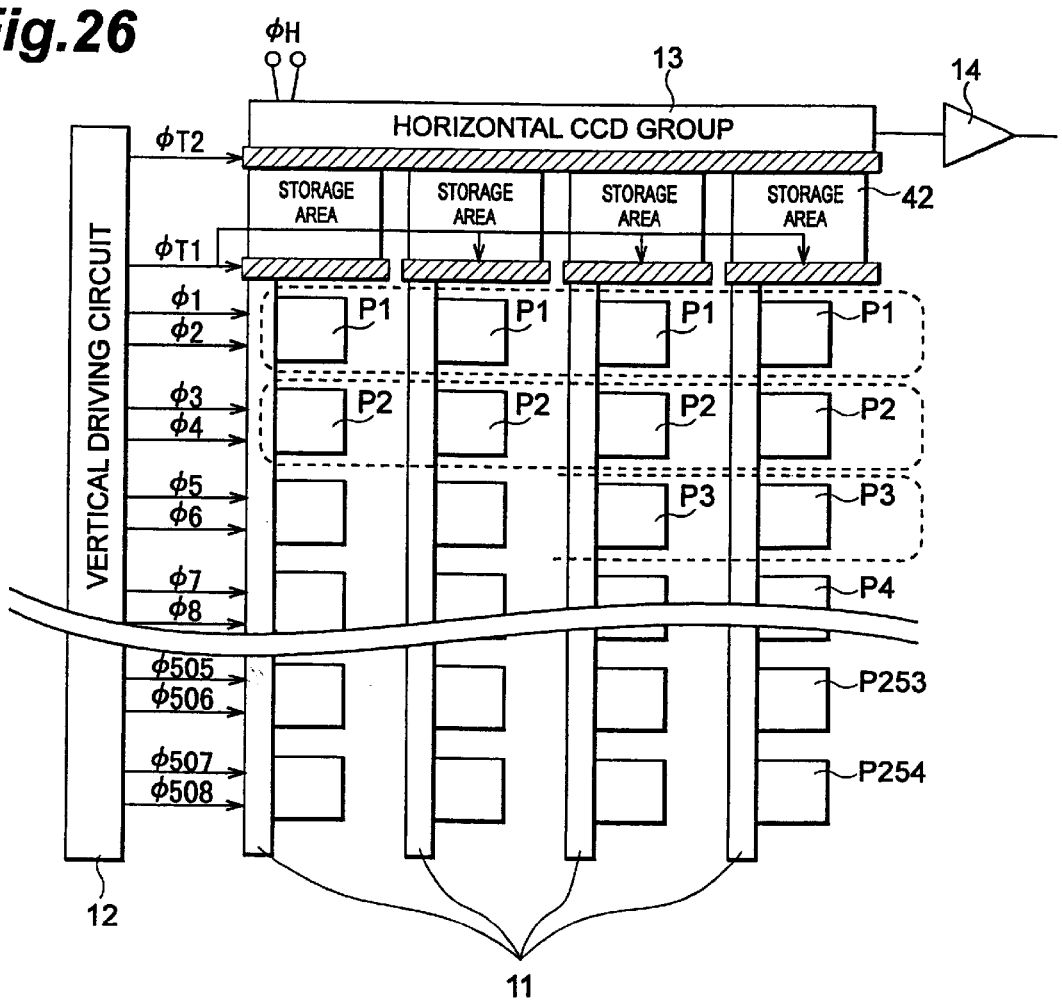
FIG. 26 is a drawing to show the schematic structure of the first application example of the image-pickup apparatus according to the present invention.
Figure 27:
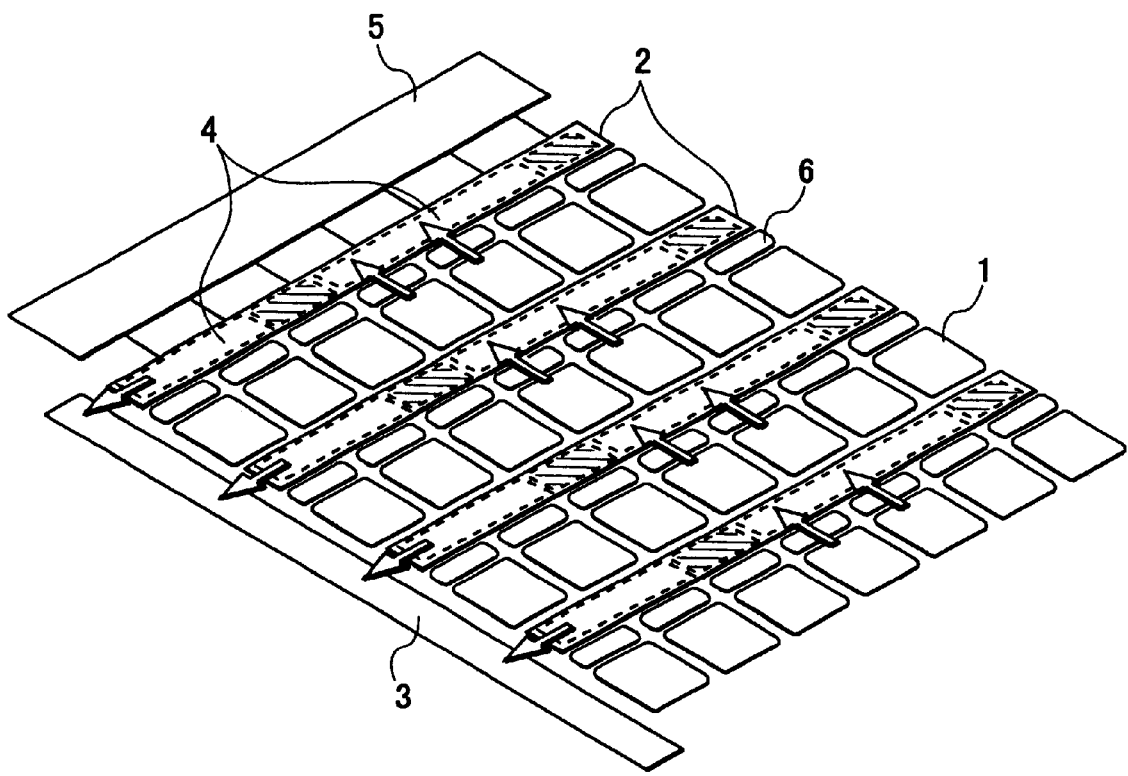
FIG. 27 is a conceptual drawing of a second application example of the image-pickup apparatus according to the present invention.

FIG. 26 is a drawing to show a more specific configuration of the first application example described above. In this structure the timing of outputting the signal charges to the horizontal transfer line 13 can be adjusted through the storage areas 42. Hence, the driving timing of the vertical transfer lines can be set freely, irrespective of the driving timing of the horizontal transfer line. In addition, the aforementioned effect makes it very easy, for example, to set the timing of transfer of the signal charges from the photodetection portions in each horizontal line to the vertical transfer lines at equal intervals. This time setting makes possible smoother imaging of motion of an object.

Figure 28:
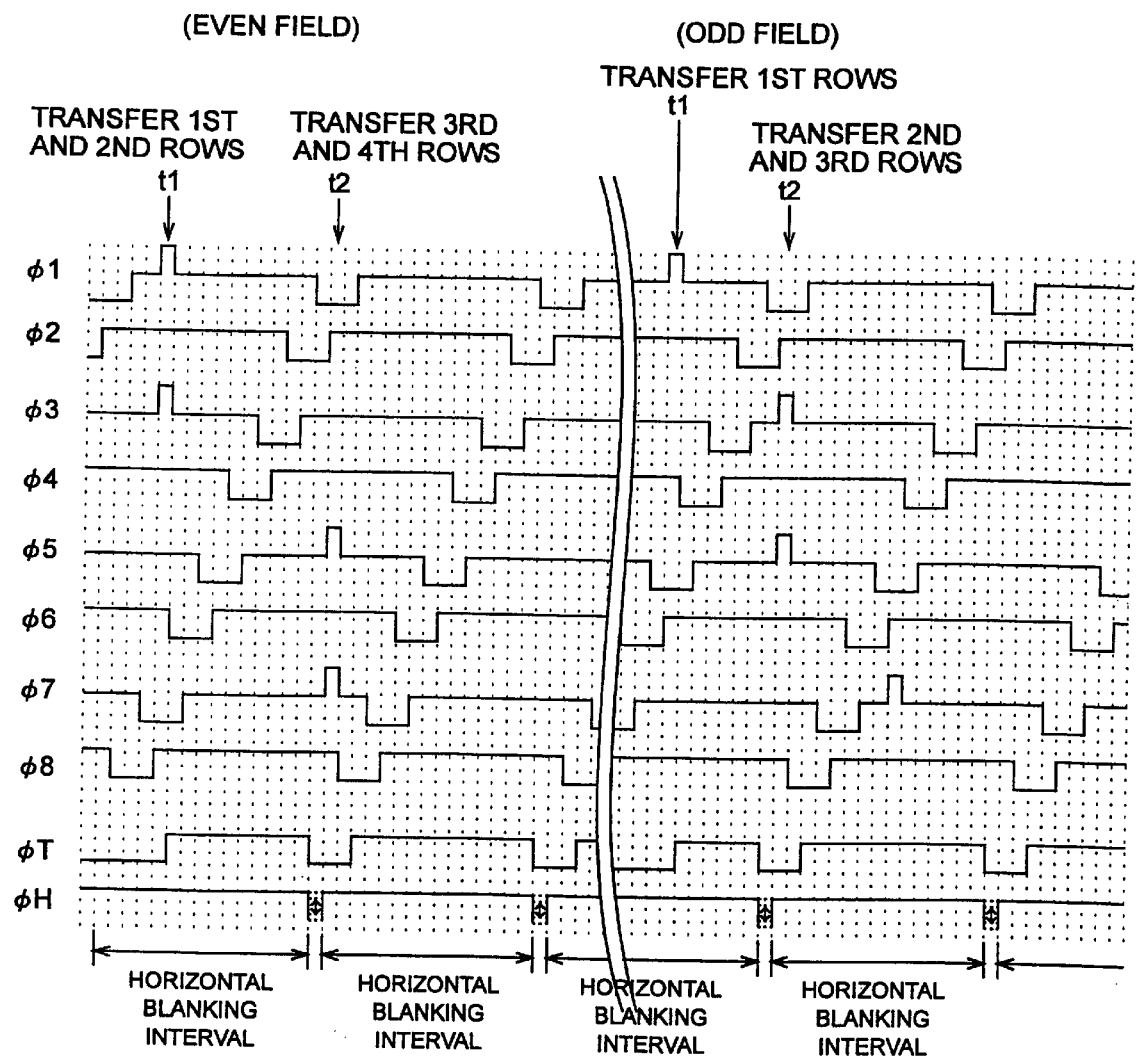
FIG. 28 is a drawing to show a timing chart in the second application example of the image-pickup apparatus according to the present invention.

Further, the embodiments described above were explained as the apparatus of the progressive scan type, but the image-pickup apparatus according to the present invention is by no means limited to this. For example, the image-pickup apparatus shown in FIG. 27 (the second application example) is characterized in that when each horizontal line is composed of plural rows of photodetection portions adjacent to each other along the horizontal direction, the vertical driving control system 5 gives a shift of a predetermined distance in the vertical direction to positions where the potential wells for transferring the signal charges accumulated in the photodetection portions forming the horizontal line in the vertical direction are successively formed in the first operation for reading an odd field, with respect to those in the second operation for reading an even field. Specifically, the vertical driving control system 5 selects an electrode group in the second operation different from that in the first operation out of the string of electrodes provided for each of the vertical transfer lines during the transfer operation of signal charges. FIG. 28 shows a timing chart of this image-pickup apparatus of the second application example. It is also possible to realize the interlace scan by transferring the signal charges at the operation timing as shown in FIG. 23.

FIFTH EMBODIMENT

Figure 29:
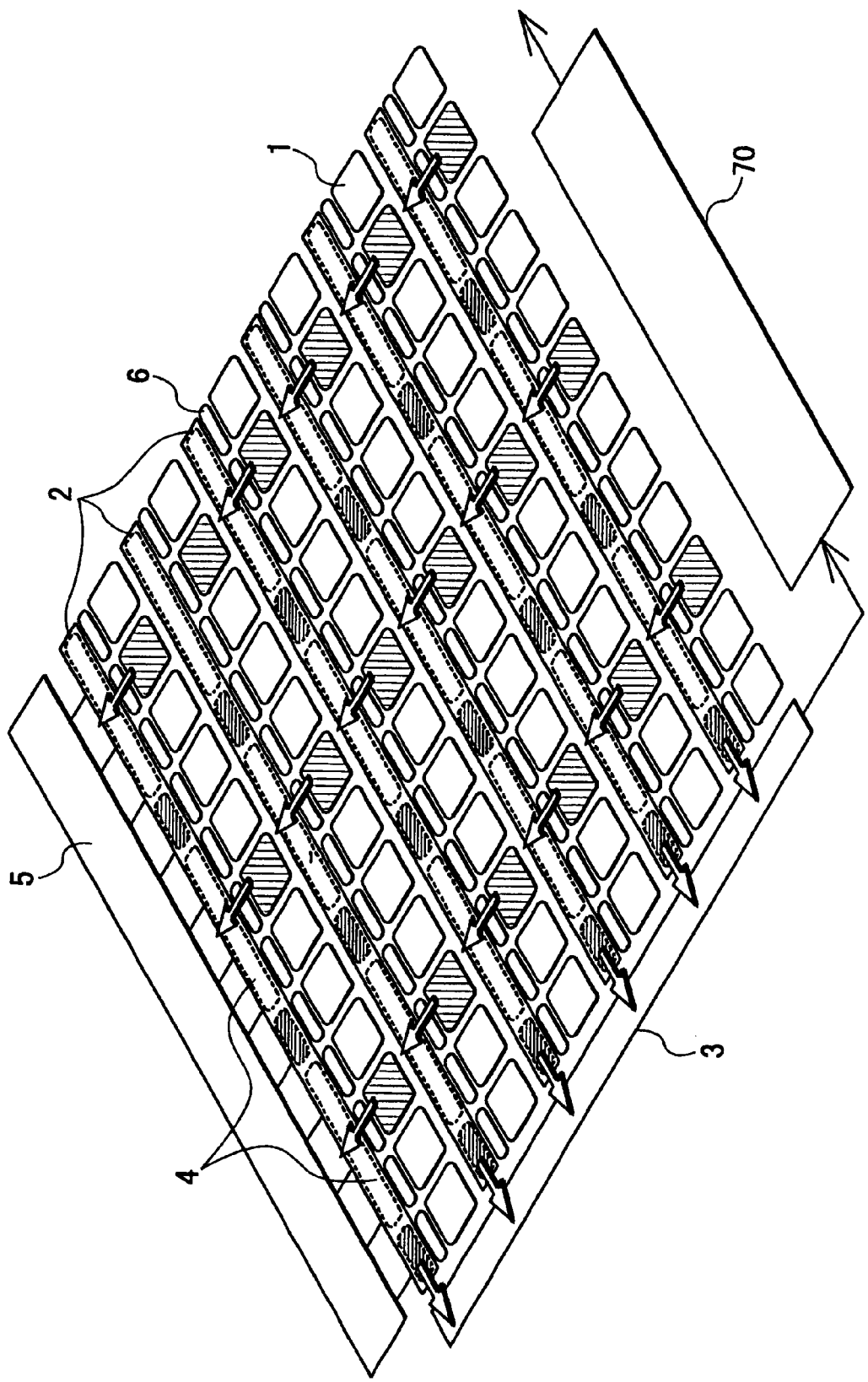
FIG. 29 is a conceptual drawing of the fifth embodiment of the image-pickup apparatus according to the present invention.

Next, the fifth embodiment of the image-pickup apparatus according to the present invention will be described. FIG. 29 is a conceptual drawing of the fifth embodiment of the image-pickup apparatus according to the present invention. In this figure, this image-pickup apparatus can also operate so that in each of the vertical transfer lines 2 a plurality of horizontal lines are selected based on predetermined reading sections of horizontal lines and signal charges accumulated in the respective photodetection portions 1 respectively forming these horizontal lines spaced at a predetermined distance are transferred simultaneously to the vertical transfer line 2. In this case, the fundamental structure is the same as that of the above-described image-pickup apparatus, but the vertical driving control system 5 in the image-pickup apparatus operates as follows; the control system 5 controls the gate structures 6 corresponding to the respective photodetection portions 1 respectively forming the plural horizontal lines spaced at the predetermined distance and selected based on the predetermined reading sections of horizontal lines out of the plural horizontal lines each being composed of one row or two or more rows of the photodetection portions arranged along the horizontal direction; in each of the vertical transfer lines 2 the control system 5 establishes a plurality of potential wells having the length not smaller than the vertical width of each horizontal line; for successively moving the plurality of potential wells in the vertical direction, the control system 5 successively selects a plurality of electrode groups including two or more transfer electrodes arranged consecutively from the above electrode string in each of the plural vertical transfer lines 2, and then applies the predetermined voltage to the plurality of electrode groups selected.

Further, the image-pickup apparatus has a pixel rearranging section 70 for successively capturing outputs from the horizontal transfer line 3, rearranging the outputs according to the original sequence of the horizontal lines, and thus generating image signals in frame units or in field units.

Particularly, this image-pickup apparatus of the fifth embodiment is characterized in that the vertical driving control system 5 selects a plurality of horizontal lines apart at constant intervals according to the predetermined reading sections of horizontal lines and transfers the signal charges in the photodetection portions 1 in each of the plural horizontal lines selected to the vertical transfer lines 2. Further, the vertical driving control system 5 outputs the signal charge in the potential well 4, having been moved to the output end of each vertical transfer line 2, to the horizontal transfer line 3 during a horizontal blanking interval in which the transfer operation of signal charge is interrupted in the horizontal transfer line 3.

In the image-pickup apparatus of the fifth embodiment as described above, when the photodetection portions 1 are exposed to the light, signal charges according to quantities of received light are generated. The signal charges thus generated are read out through the vertical transfer lines 2 and horizontal transfer line 3 to the outside.

On the occasion of the reading operation of signal charges as described, the vertical driving control system 5 establishes a plurality of potential wells 4 in each vertical transfer line 2. The potential wells 4 have the length not smaller than the vertical width of a horizontal line and a potential barrier for isolation of signal charge is placed between the potential wells 4.

Because of this structure, the number of potential wells 4 that can be established simultaneously in each vertical transfer line 2 is smaller than the number of horizontal lines in the image-pickup apparatus of the fifth embodiment. Accordingly, this apparatus cannot transfer the signal charges in the all photodetection portions 1 together onto the vertical transfer line 2, different from the first conventional example of the progressive scan type (FIG. 1) and the second conventional example of the interlace scan type (FIG. 2).

Thus, the image-pickup apparatus of the fifth embodiment reads the signal charges in the photodetection portions 1 according to the following procedures.

First, the vertical driving control system 5 selects a plurality of spaced horizontal lines in order according to the predetermined reading sections of horizontal lines. Then in each of the plural lines selected the vertical driving control system 5 transfers the signal charges from the photodetection portions 1 to the vertical transfer lines 2 through the gate structures 6. The signal charges thus transferred are put in the respective potential wells 4 established in the vertical transfer lines 2.

In this state the vertical driving control system 5 successively moves these potential wells 4 in the vertical direction. As a result, the signal charges of the plural horizontal lines are successively outputted from the output ends of the plural vertical transfer lines 2.

The horizontal transfer line 3 takes in the signal charges of these lines to transfer them in order in the horizontal direction.

The reading operation described above is carried out repetitively, thereby reading the all signal charges of one screen out.

However, the order of horizontal lines read in this way is discontinuous on the screen. Thus, the horizontal lines cannot be read along the general scan order of screen.

Then, this image-pickup apparatus of the fifth embodiment is provided with the pixel rearranging section 70. This pixel rearranging section 70 captures the outputs from the horizontal transfer line 3 and rearranges the outputs according to the original sequence of the horizontal lines, thus generating image signals of one screen.

In this image-pickup apparatus of the fifth embodiment, the vertical driving control system 5 selects the plurality of horizontal lines spaced at the constant intervals and transfers the signal charges in the photodetection portions 1 in the plural horizontal lines selected, to the vertical transfer lines 2. In this transfer method the essential point is that the plurality of potential wells 4 are spaced at the constant intervals, whereby the vertical driving of potential wells 4 etc. can be performed at regular timing. The reading timing of signal charges can be simplified more accordingly.

Further, in this image-pickup apparatus of the fifth embodiment the vertical driving control system 5 makes the signal charges in the potential wells 4, having been transferred to the output ends of the vertical transfer lines 2, outputted to the horizontal transfer line 3 during a horizontal blanking interval.

This operation adjusts the operation timing between the plural vertical transfer lines 2 and the horizontal transfer line 3, thus eliminating the need for providing the special structure for timing adjustment.

Figure 30:
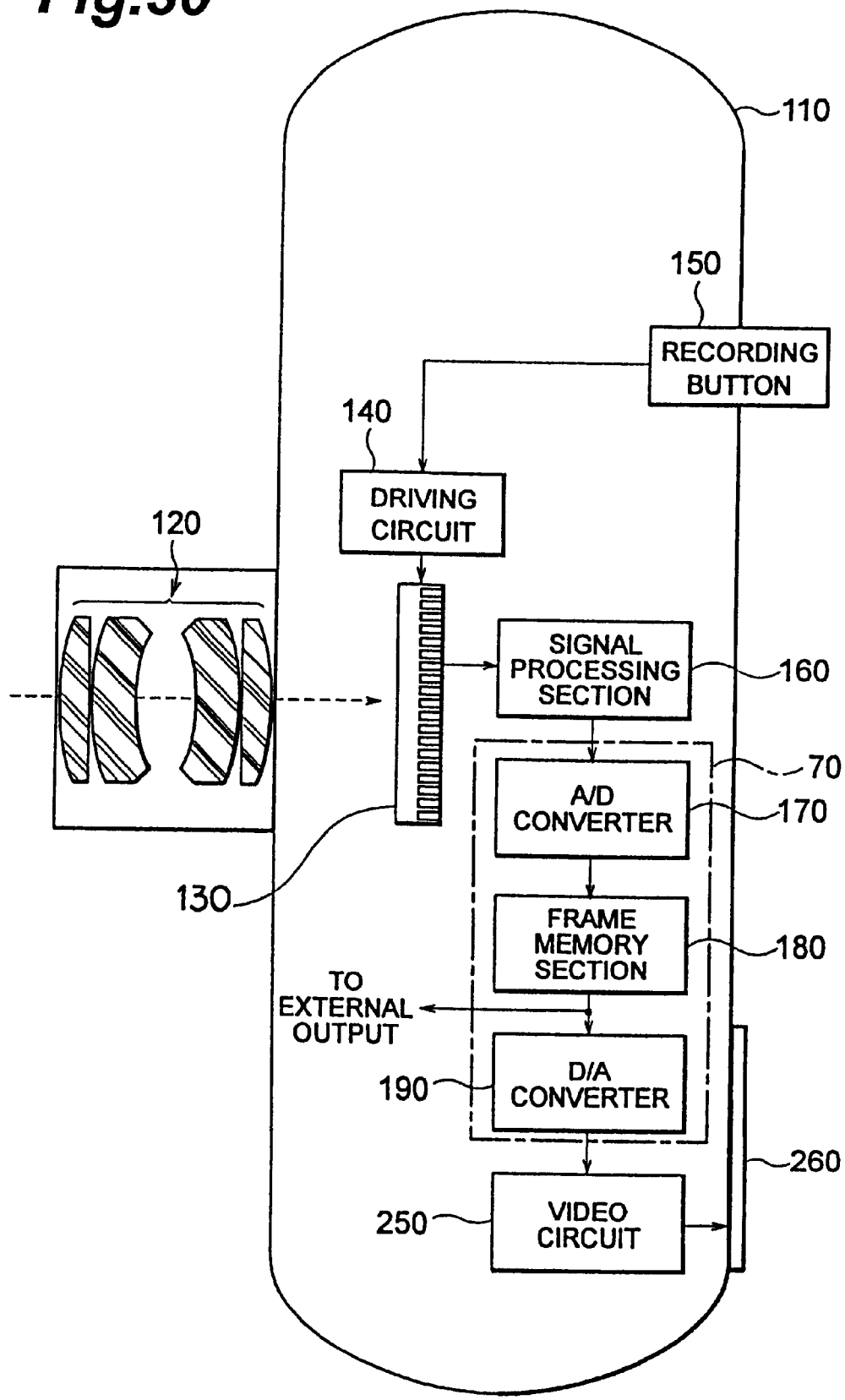
FIG. 30 is a block diagram to show the structure of an image-pickup system to which the fifth embodiment of the image-pickup apparatus according to the present invention is applied.

FIG. 30 is a block diagram to show a configuration of an image-pickup system to which the image-pickup apparatus of the fifth embodiment is applied. In this figure, a taking lens 120 is mounted on the front surface of system 110 and a solid-state image sensing device 130 included in the image-pickup apparatus is placed on the image space side of the taking lens 120. A driving circuit 140 for generating driving pulses is connected to the solid-state image sensing device 130 and a recording button 150 for effecting a release operation or the like is connected to the driving circuit 140.

Outputs from the solid-state image sensing device 130 are supplied through signal processing section 160 and A/D converter 170 to frame memory section 180 for performing asynchronous read/write operation.

The read output from the frame memory section 180 is connected to an external output terminal and is also supplied through D/A converter 190 and video circuit 250 to monitor 260.

The image rearranging section 70 is composed of at least the above A/D converter 170, frame memory section 180, and D/A converter 190.

Figure 31:
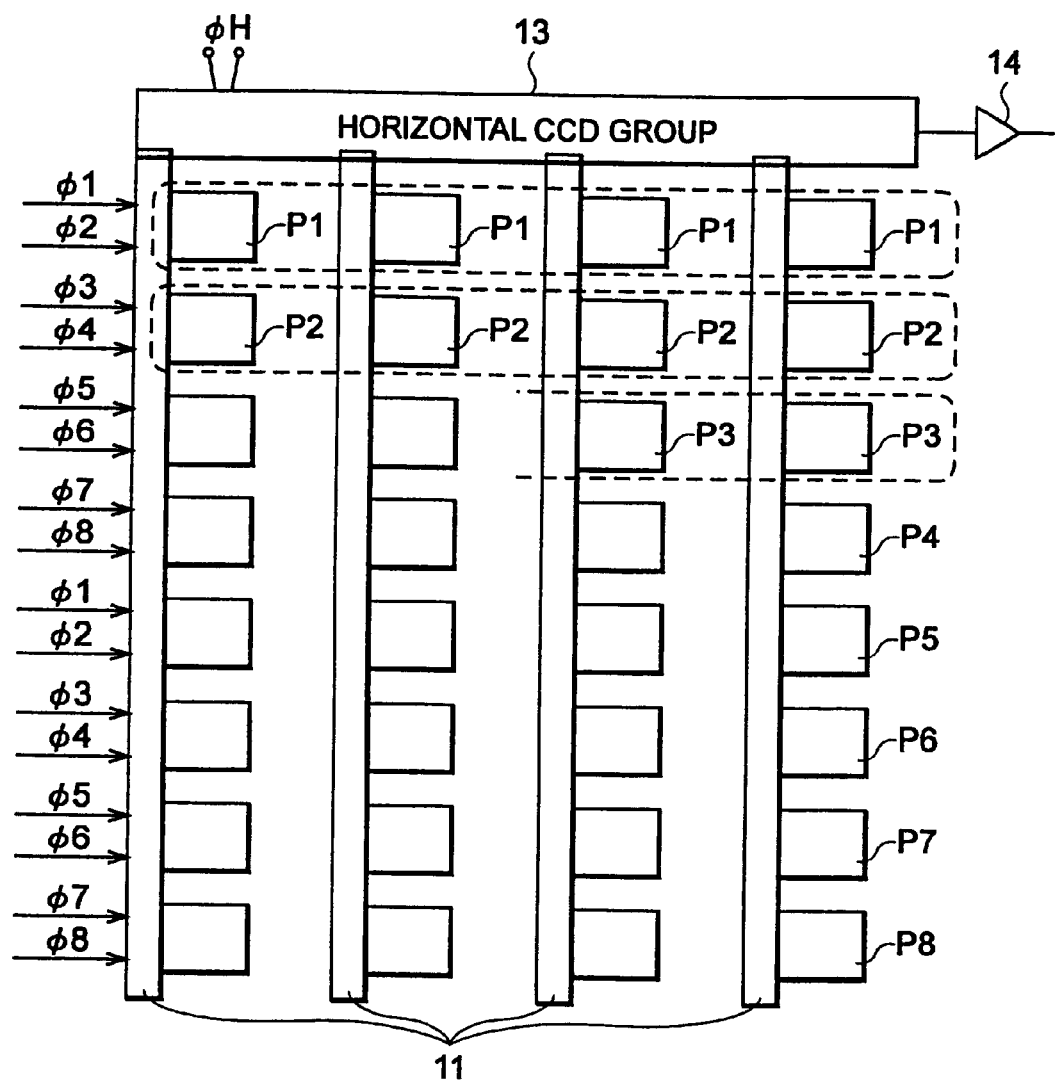
FIG. 31 is a drawing to show the major structure of the fifth embodiment of the image-pickup apparatus according to the present invention.

FIG. 31 is a drawing to show a more specific configuration of the major part in the image-pickup apparatus of the fifth embodiment and, more particularly, is a plan view to show the structure of the solid-state image sensing device 130 of FIG. 30.

In FIG. 31 the image-pickup apparatus is constructed in such arrangement that the photodetection portions such as photodiodes are arrayed vertically and horizontally. For easier understanding of description, the apparatus will be described using only the photodetection portions P1–8 of eight rows.

The vertical transfer lines 11 (vertical CCD groups) are arranged each per vertical line of these photodetection portions P1–8 and 8-phase electrodes $\phi1$–$\phi8$ are provided regularly for these vertical transfer lines 11. The horizontal transfer line 13 (horizontal CCD group) is placed on the output end side of the vertical transfer lines 11. The electrode $\phi H$ for transferring the signal charges along the horizontal direction is placed on the horizontal transfer line 13. These electrodes $\phi1$–8 and $\phi H$ are connected to the driving circuit 140 shown in FIG. 30. On the other hand, outputs from the horizontal transfer line 13 are supplied through output amplifier 14 etc. to the signal processing section 160 shown in FIG. 30.

Figure 32:
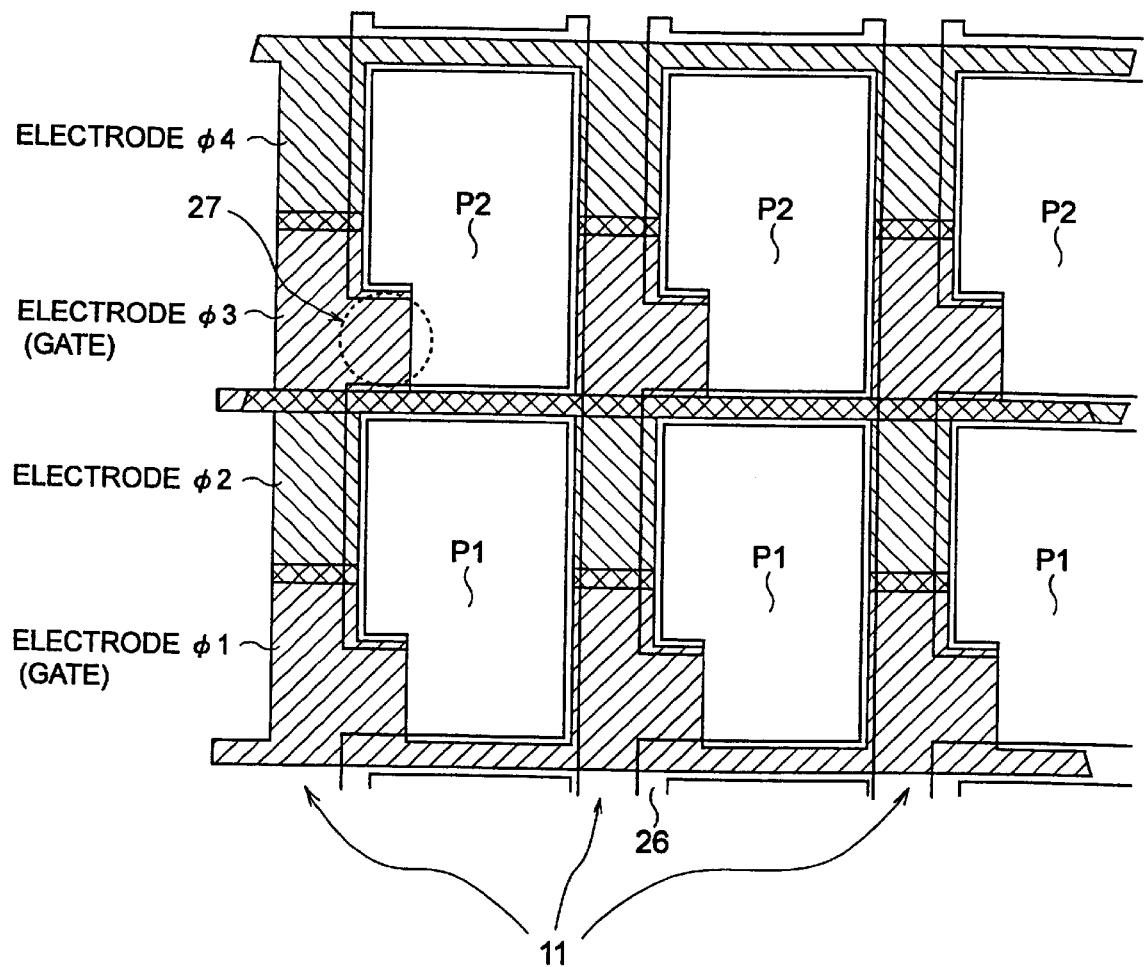
FIG. 32 is a drawing to show an electrode layout on the vertical transfer lines.

FIG. 32 is a drawing to show the details of the electrode arrangement on the vertical transfer lines 11 in this image-pickup apparatus. Also in this embodiment the vertical length of each potential well established in the vertical transfer lines 11 is longer than the vertical width of a horizontal line, as in the first embodiment shown in FIG. 5 and the other embodiments. In FIG. 32, two electrodes $\phi1$, $\phi2$ are provided per photodetection portion P1 through an insulating film 26 on the vertical transfer line 11. One electrode $\phi1$ is formed so as to cover a P+ diffuse layer 27 in contact with the photodetection portion P1. When the intermediate voltage is applied to such electrodes $\phi1$, $\phi2$, a potential well is formed under the electrodes. Further, when the high voltage is applied to one electrode $\phi1$ to form a channel in the P+ diffuse layer 27, the signal charge in the photodetection portion P1 is transferred to the potential well formed under the electrode $\phi1$.

For each of the other photodetection portions P2–8, the electrodes φ1–8 are also placed in the same structure.

Here, the relation of correspondence is listed below between the structure shown in FIG. 29 and the fifth embodiment. Namely, the photodetection portions 1 correspond to the photodetection portions P1–8, the vertical transfer lines 2 to the vertical transfer lines 11, the gate structures 6 to the driving circuit 140 and electrodes φ2, φ4, φ6, φ8, the vertical driving control system 5 to the driving circuit 140 and electrodes φ1–8, and the horizontal transfer line 3 to the horizontal transfer line 13 and driving circuit 140, and the pixel rearranging means 70 includes the frame memory section 180.

Figure 33:
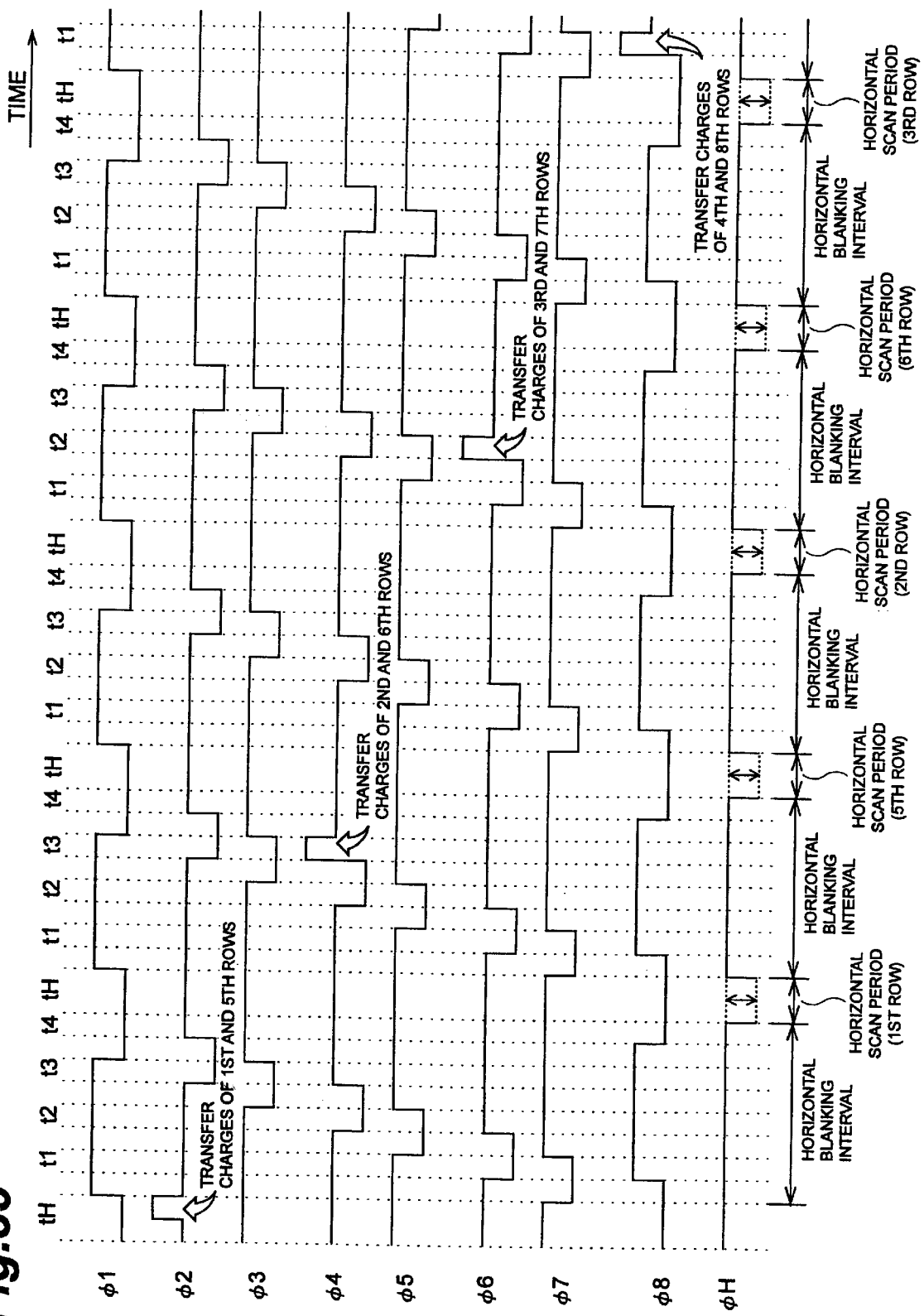
FIG. 33 is a drawing to show a timing chart in the fifth embodiment of the image-pickup apparatus according to the present invention.
Figure 34:
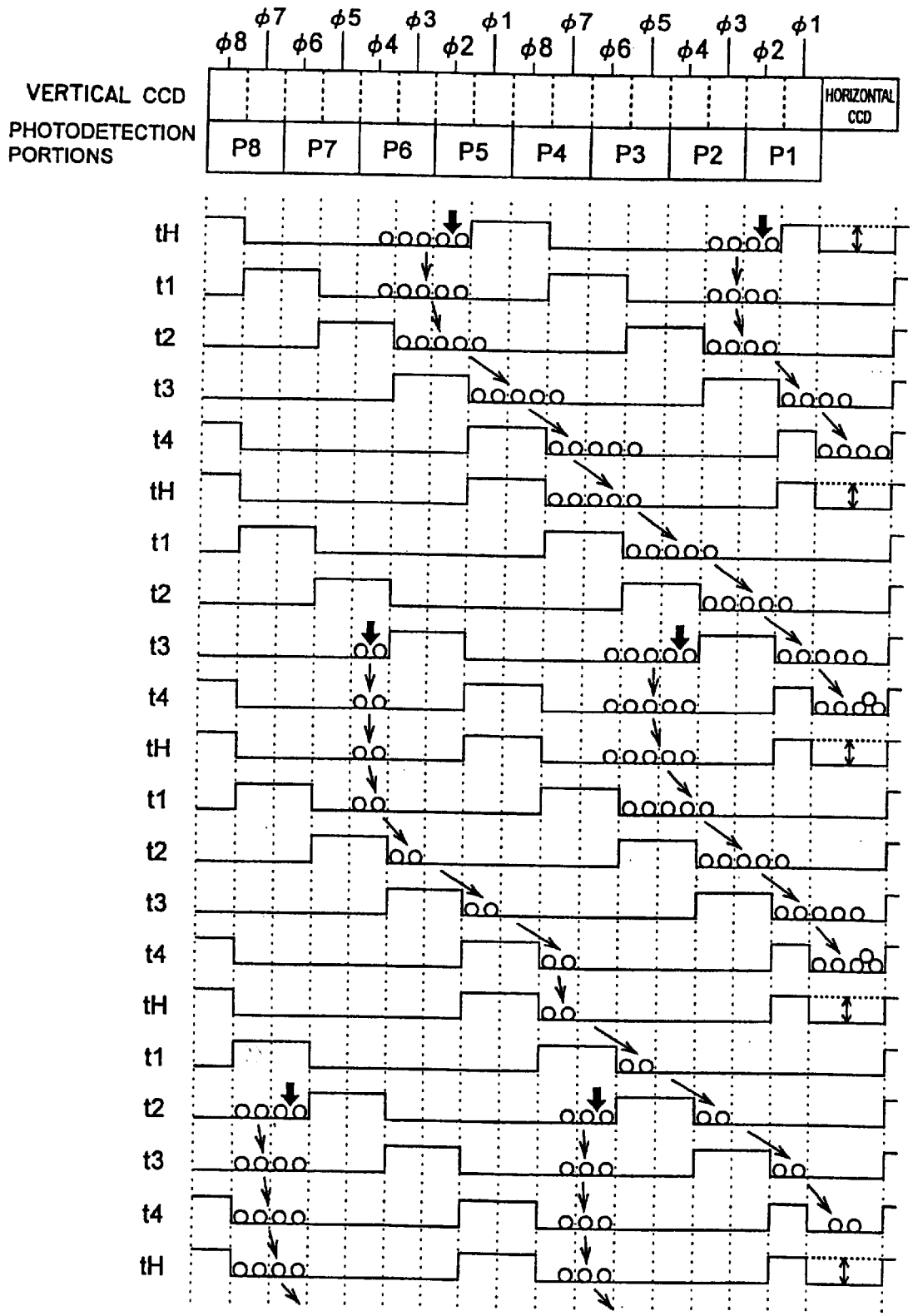
FIG. 34 and FIG. 35 are drawings for explaining the operation (the driving method) of the fifth embodiment of the image-pickup apparatus according to the present invention.
Figure 35:
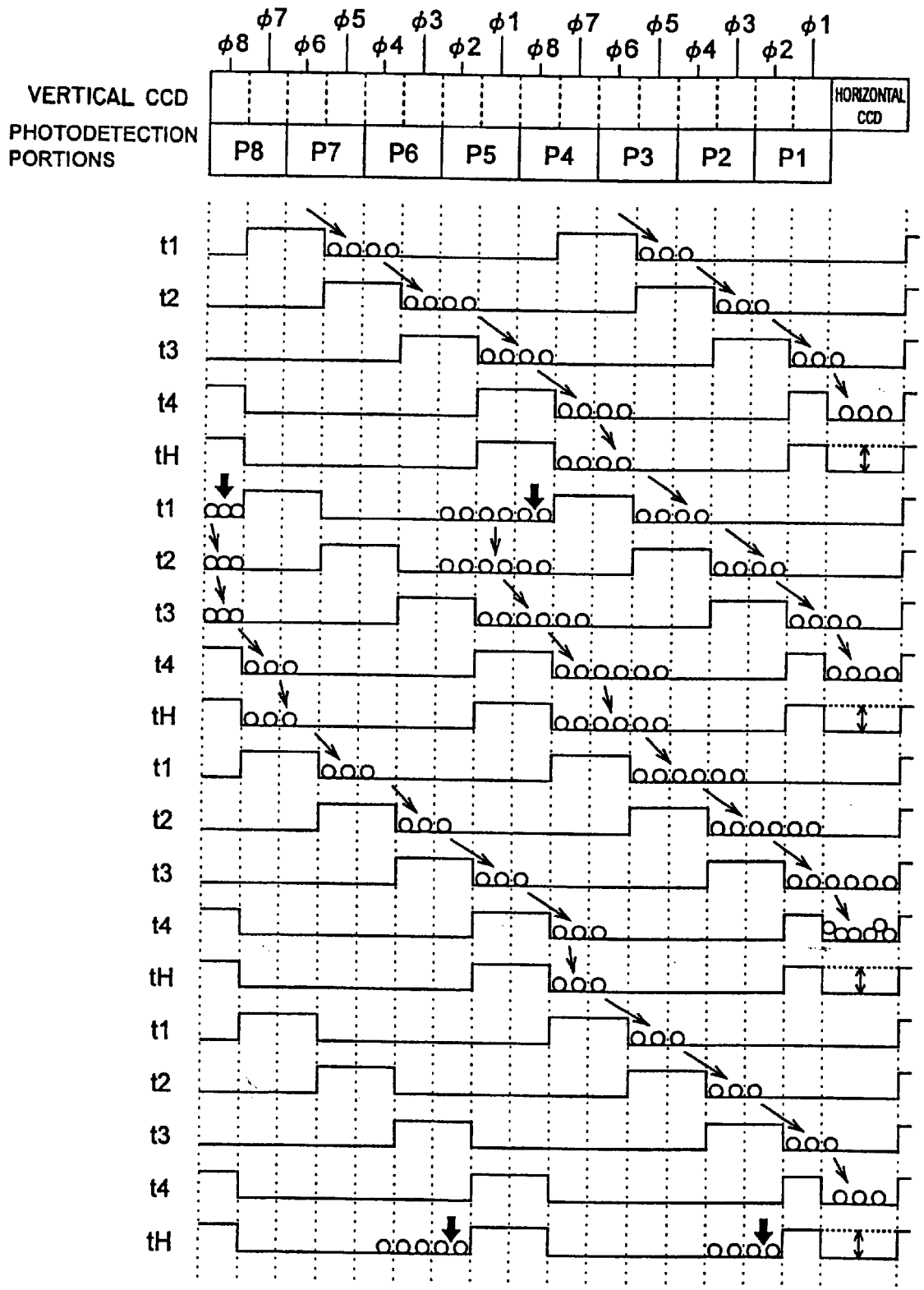

FIG. 33 is a drawing to show a timing chart of the fifth embodiment of the image-pickup apparatus according to the present invention and FIG. 34 and FIG. 35 are drawings for explaining the operation (the driving method) of the fifth embodiment of the image-pickup apparatus according to the present invention.

The operation of the fifth embodiment will be described using these drawings.

First, the driving circuit 140 applies the intermediate voltage to the electrodes φ2–7, thereby establishing potential wells having the length of three times the vertical width of a horizontal line at equal intervals. Since the low voltage is applied to the electrodes φ1, φ8, the potential wells are isolated from each other.

In this state the driving circuit 140 applies 8-phase driving pulses (of the intermediate voltage) as shown in FIG. 33, at the regular timing of t1–4 to the electrodes φ1 to φ8. The driving pulses move the potential wells established in the vertical transfer lines 11 step by step vertically toward the horizontal transfer line 13.

This vertical movement of potential well is executed in succession during intervals (horizontal blanking intervals) between horizontal scan periods tH of the horizontal transfer line 13.

In parallel with this vertical movement of potential well, the driving circuit 140 selects the electrodes φ2, φ4, φ6, φ8 one by one in the ascending order. The driving circuit 140 applies the high voltage to the pertinent electrode in synchronism with the timing when the vacant potential wells become adjacent to the selected electrode.

Specifically, as shown in FIG. 33, the high potential is first applied to the electrode φ2, whereby the signal charges in the first row and in the fifth row are transferred to the vacant potential wells established in the respective vertical transfer lines 21. These signal charges are transferred through the plural vertical transfer lines 11 and horizontal transfer line 13 to be successively outputted to the outside of the solid-state image sensing device 130.

When the high voltage is then applied to the electrode φ4, the signal charges in the second row and in the sixth row are transferred to the vacant potential wells in the respectively corresponding vertical transfer lines 11. These signal charges are also outputted successively to the outside of the solid-state image sensing device 130 in the same manner.

When the high voltage is then applied to the electrode φ6, the signal charges in the third row and in the seventh row are transferred to the vacant potential wells in the respectively corresponding vertical transfer lines 11. These signal charges are also outputted successively to the outside of the solid-state image sensing device 130 in the same manner.

When the high voltage is further applied to the electrode φ8, the signal charges in the fourth row and in the eighth row are transferred to the vacant potential wells in the respectively corresponding vertical transfer lines 11. These signal charges are also outputted successively to the outside of the solid-state image sensing device 130 in the same manner.

By the sequential operation described above, the solid-state image sensing device 130 successively outputs the transfer outputs of one screen in the following order within one frame period.

first row→fifth row→second row→sixth row→third row→seventh row→fourth row→eighth row The frame memory section 180 (included in the image rearranging section 70) captures these outputs from the horizontal transfer line 13, rearranges the outputs in the original sequence of horizontal lines, and stores them.

Specifically, the frame memory section 180 first stores the horizontal line of the first row in memory addresses (1) to (N) (where N is the number of pixels in a horizontal line). Further, the horizontal line of the fifth row is stored in memory addresses (4N+1) to (5N), the horizontal line of the second row in memory addresses (N+1) to (2N), the horizontal line of the sixth row in memory addresses (5N+1) to (6N), the horizontal line of the third row in memory addresses (2N+1) to (3N), the horizontal line of the seventh row in memory addresses (6N+1) to (7N), the horizontal line of the fourth row in memory addresses (3N+1) to (4N), and the horizontal line of the eighth row in memory addresses (7N+1) to (8N).

The frame memory section 180 reads the image information rearranged as described above, in the order of memory addresses (while adding horizontal/vertical synchronizing signals and a burst signal if necessary), thus generating frame image signals.

By the operation described above, the potential wells have the length of three times the vertical width of a horizontal line in this image-pickup apparatus of the fifth embodiment. Hence, the image-pickup apparatus can assure greater charge storage amounts of the potential wells than those of the short potential wells as in the case of the first conventional example of the progressive scan type (FIG. 1) and the second conventional example of the interlace scan type (FIG. 2). As a result, the horizontal width of the vertical transfer lines 21 can be decreased without any difficulty.

In this image-pickup apparatus of the fifth embodiment at least one potential well in which a signal charge is present moves to the output end of each vertical transfer line over a plurality of horizontal periods. Therefore, the driving speed of the vertical transfer lines 21 can be decreased so as to be much lower than in the case of the third conventional example of the CSD method (FIG. 3).

In this image-pickup apparatus of the fifth embodiment the plurality of horizontal lines spaced at the constant intervals are selected and the signal charges are read every one of the plural horizontal lines thus selected. Hence, the vertical driving of the potential wells and the charge transfer are carried out at the regular timing, so that the driving timing of the driving circuit 140 can be simplified remarkably.

In this image-pickup apparatus of the fifth embodiment the signal charge is outputted from each vertical transfer line 11 to the horizontal transfer line 13 only during the horizontal blanking interval. Therefore, there is no need for providing the storage areas or the like of signal charge between the plural vertical transfer lines 11 and the horizontal transfer line 13.

SIXTH EMBODIMENT

Figure 36:
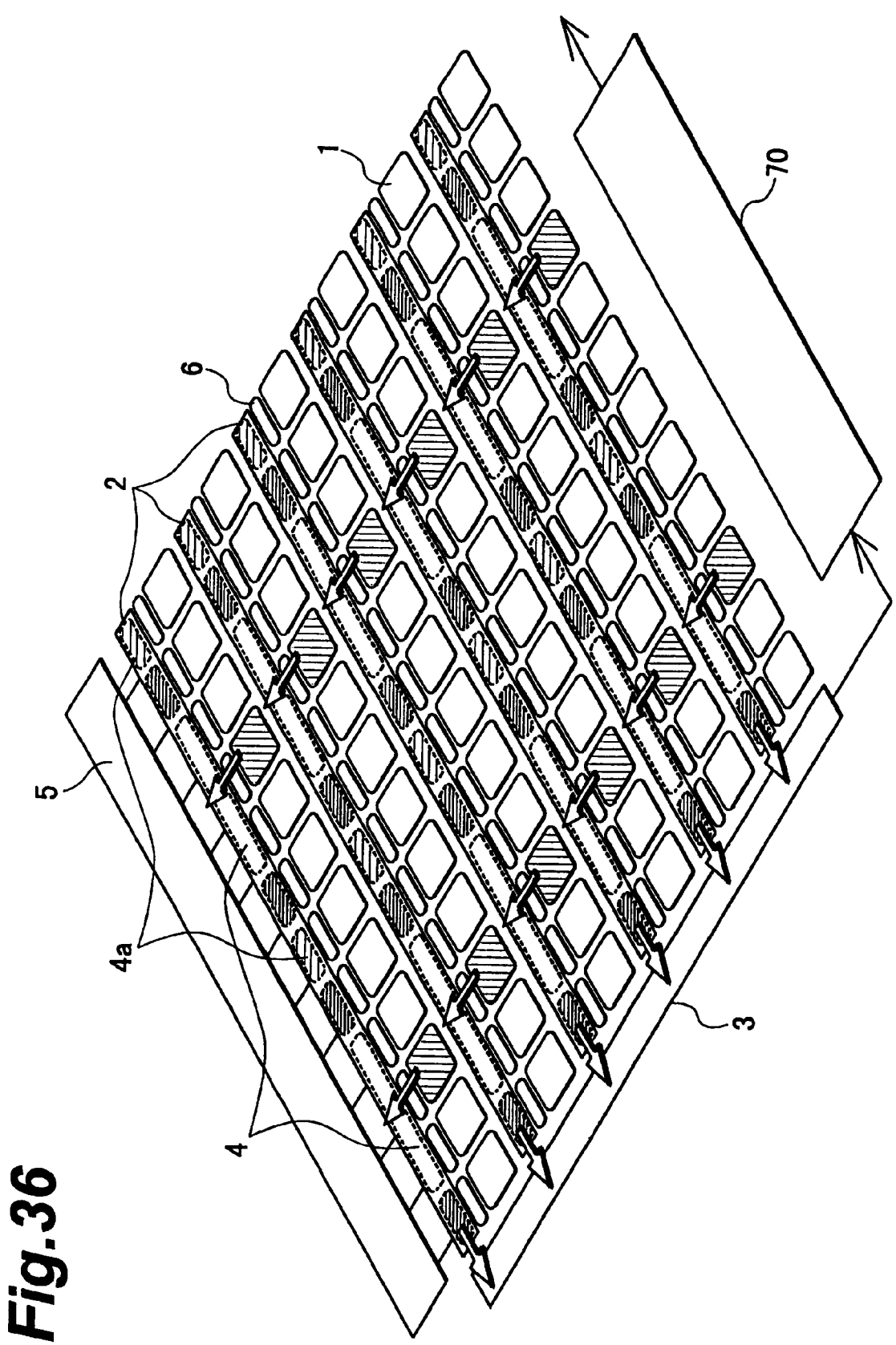
FIG. 36 is a conceptual drawing of the sixth embodiment of the image-pickup apparatus according to the present invention.

FIG. 36 is a conceptual drawing of the sixth embodiment of the image-pickup apparatus according to the present invention. This image-pickup apparatus of the sixth embodiment is characterized in that the vertical driving control system 5 establishes pairs of main potential well 4 and auxiliary potential well 4a in each vertical transfer line 2, each main potential well 4 being a potential well in which a signal charge is present and each auxiliary potential well 4a being a potential well in which a signal charge is substantially absent and which follows the main potential well 4.

A further feature is that the above vertical driving control system 5 operates to output each of signal charges accumulated in the main potential wells 4 and "leaks of signal charges" collected in the auxiliary potential wells 4a following the main potential wells 4, to the horizontal transfer line 3.

The above auxiliary potential wells 4a collect transfer leaks of the preceding main potential wells 4. This can surely prevent such a malfunction as mixture of the transfer leaks in other signal charges. Since a signal charge transferred in each vertical transfer line 2 is added to a transfer leak of the signal charge in the horizontal transfer line 3, the transfer leak of the signal charge can be prevented from being lost and the transfer efficiency of signal charge can be increased in the vertical transfer lines 2.

Figure 37:
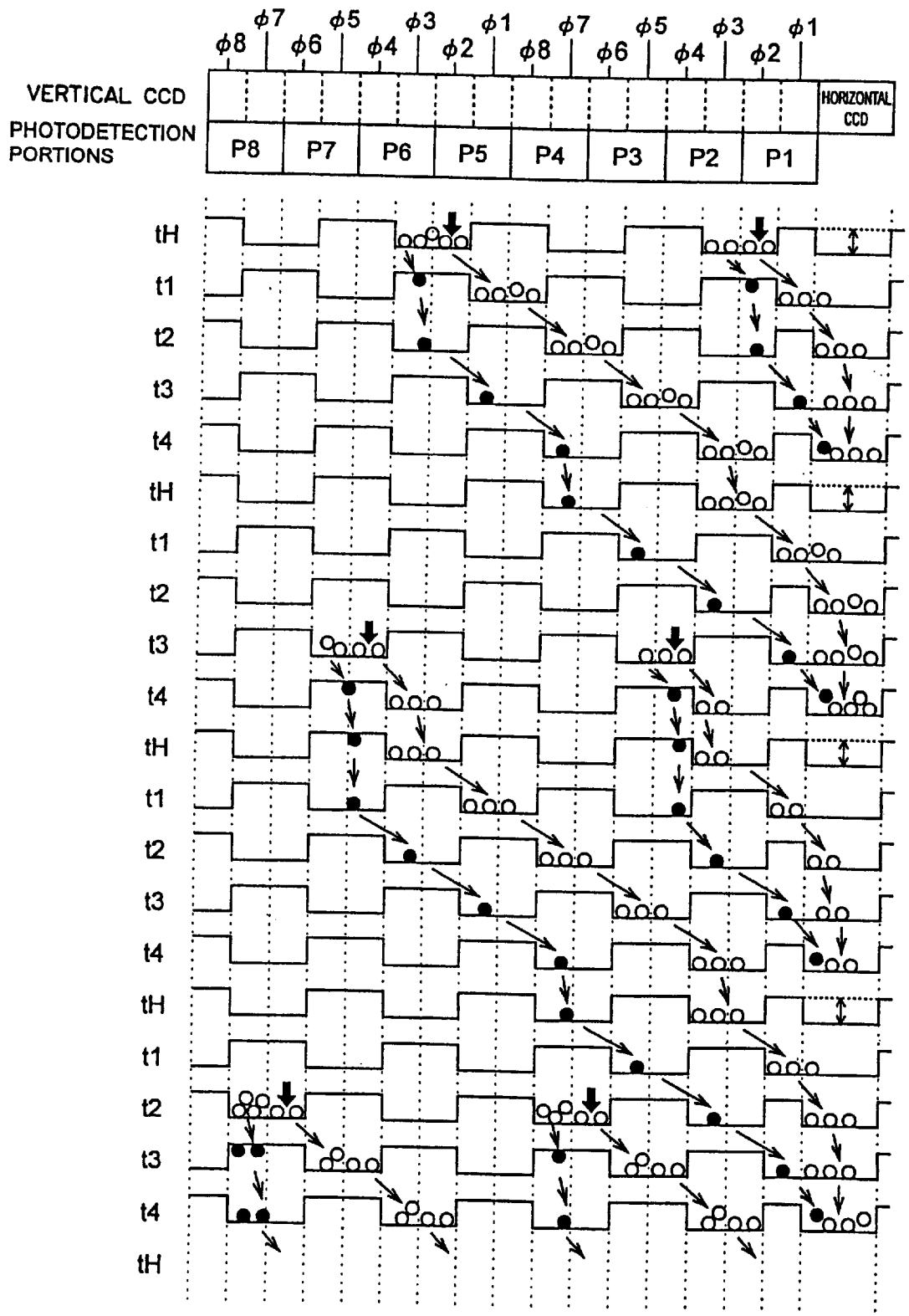
FIG. 37 is a drawing for explaining the operation (the driving method) of the sixth embodiment of the image-pickup apparatus according to the present invention.

FIG. 37 is a drawing for explaining the operation (the driving method) of the sixth embodiment of the image-pickup apparatus according to the present invention. The specific structure of the sixth embodiment is the same as that of the fifth embodiment described above (FIG. 30 and FIG. 31) and thus redundant description thereof is omitted herein.

The operation of the image-pickup apparatus of the sixth embodiment will be described.

The operational feature of the image-pickup apparatus of the sixth embodiment is that the auxiliary potential wells are placed after the main potential wells in each of which a signal charge is present. When each pair of main potential well and auxiliary potential well are formed adjacent to each other in this way, a leak (black dots in FIG. 37) appearing with transfer of a signal charge is collected by the auxiliary potential well following it. This can eliminate the malfunction of mixture of the leak in another signal charge and can surely prevent decrease in the vertical resolution of image.

Since the leak collected by the auxiliary potential well is added again to the signal charge in the horizontal transfer line 23, the transfer leak is not lost and the transfer efficiency of signal charge can be increased.

In this embodiment the plurality of potential wells having the length not shorter than the vertical width of a horizontal line are formed in each of the vertical transfer lines 11 for which 8-phase driving is employed as an example, but, without having to be limited to this, the potential wells may be made further longer than the vertical width of a horizontal line by employing 10-phase or more (for example, 16-phase) driving pulses.

In this embodiment the potential wells for transferring the signal charges in the vertical direction are established in the same length (the length in the vertical direction) as the vacant potential wells for collecting the transfer leaks, but the invention is not limited to this structure. For example, since a charge quantity of transfer leak is normally smaller than a charge quantity of signal charge, the vertical length of the vacant potential well for collecting the transfer leak can be shortened as shown in FIG. 36. This structure permits the length of the potential wells for transmitting the signal charges to be lengthened by that degree, thus increasing the storage amount of signal charge.

SEVENTH EMBODIMENT

Figure 38:
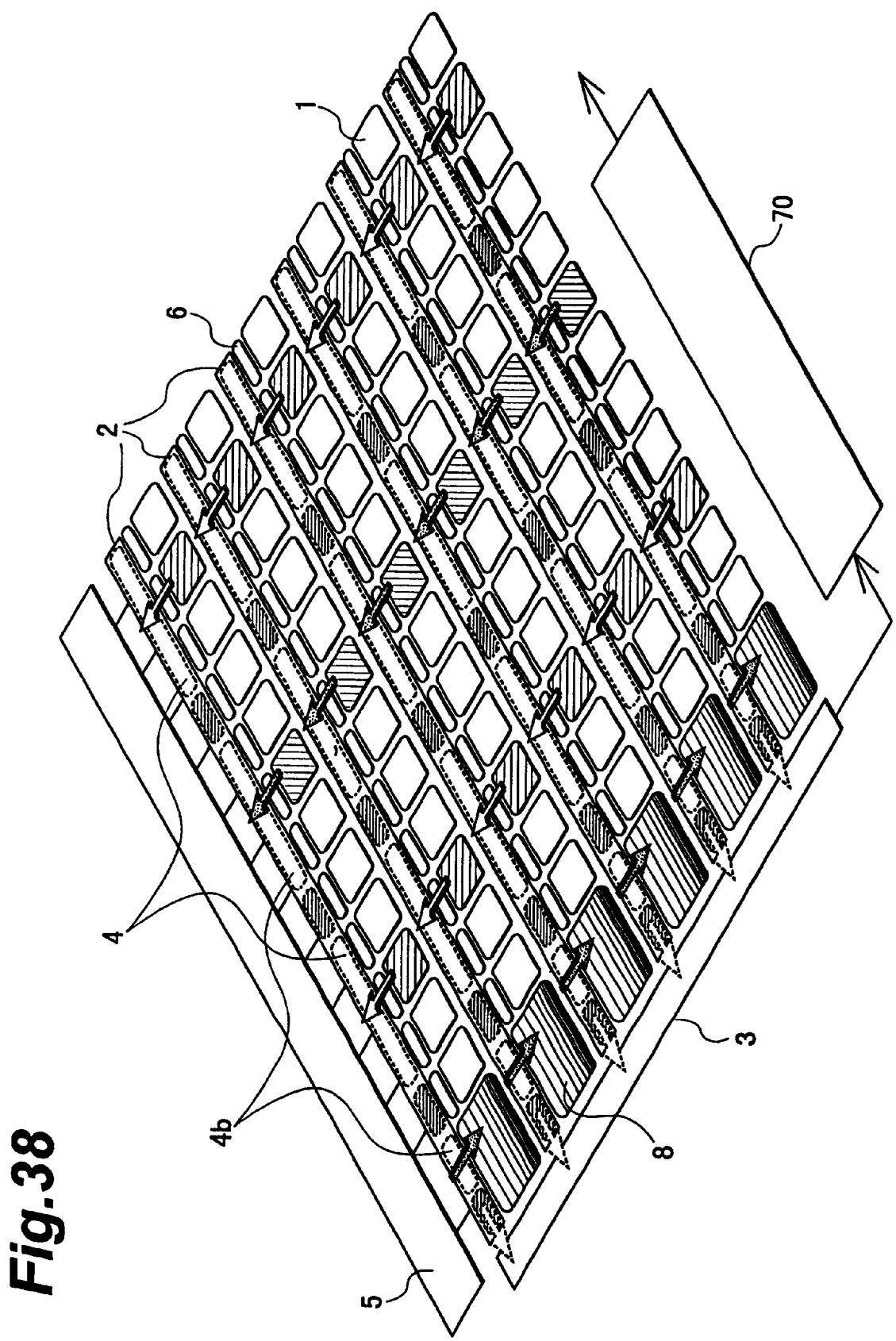
FIG. 38 is a conceptual drawing of the seventh embodiment of the image-pickup apparatus according to the present invention.

FIG. 38 is a conceptual drawing of the seventh embodiment of the image-pickup apparatus according to the present invention. This image-pickup apparatus of the seventh embodiment is provided with discharge areas 8 into which undesired charges are swept out of the vertical transfer lines 2. The vertical driving control system 5 transfers undesired charges accumulated in the photodetection portions 1 to the potential wells 4b and after a lapse of the predetermined exposure time from the time of transfer of the undesired charges the control system 5 transfers signal charges accumulated in the photodetection portions 1 to other potential wells 4 and then transfers them in the vertical transfer lines 2. In this arrangement in which after a lapse of the predetermined exposure time from the time when the undesired charges are transferred into the vertical transfer lines 2 the signal charges accumulated in the photodetection portions 1 are then transferred to other potential wells 4 through the gate structures 6, the potential wells 4b with undesired charge and the potential wells 4 with signal charge both are present in each vertical transfer line 2 and are vertically transferred in one direction.

The image-pickup apparatus is also characterized in that the vertical driving control system 5 determines, based on the transfer timing of the signal charges, whether a charge passing a predetermined portion in each vertical transfer line 2 is an undesired charge and sweeps the undesired charge away into the discharge area 8.

Therefore, only the signal charges accumulated during the predetermined exposure time reach the horizontal transfer line 3 to be read out to the outside. The electronic shutter function can be realized by limiting the exposure time in this way.

Figure 39:
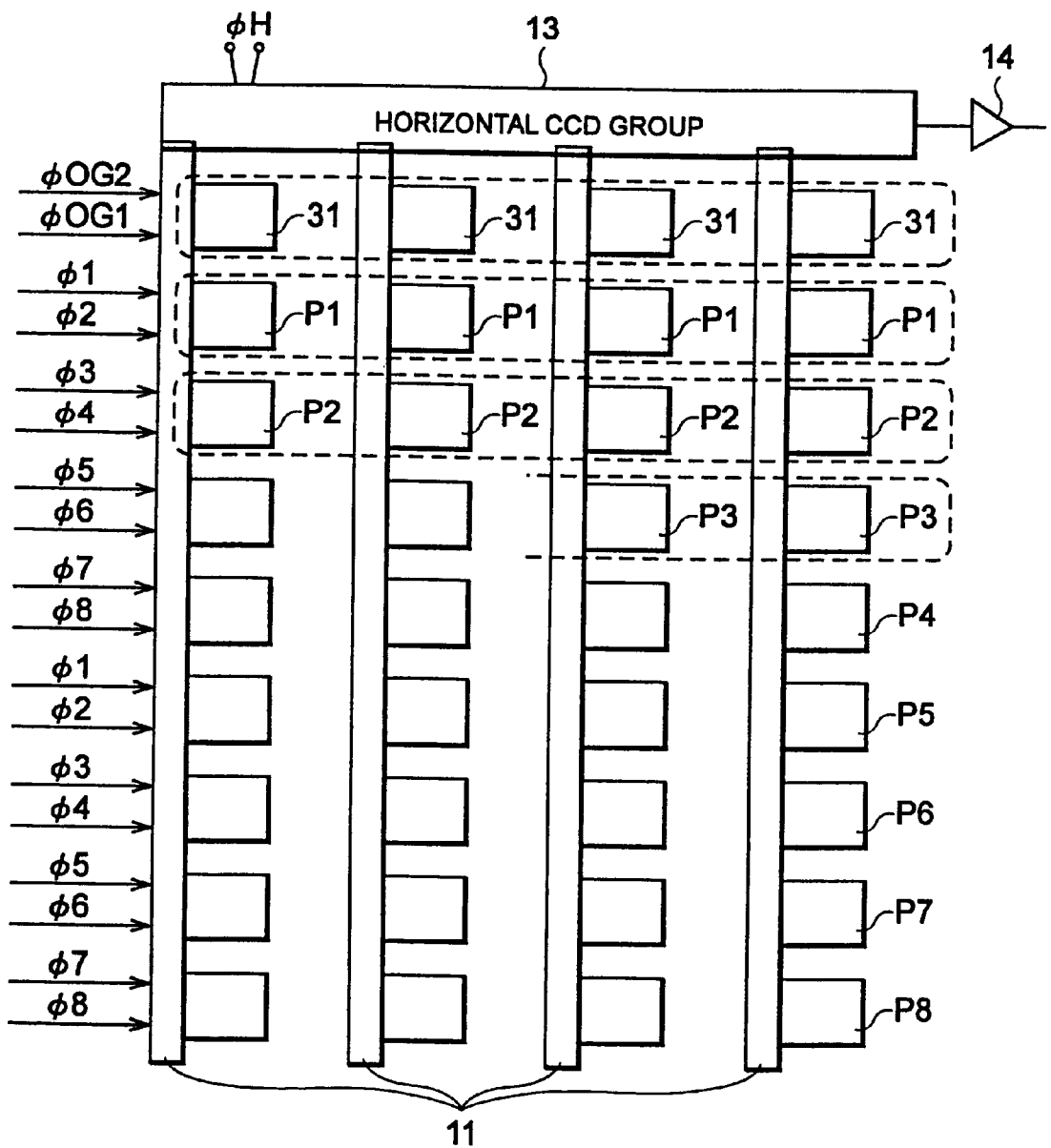
FIG. 39 is a drawing to show the schematic structure of the seventh embodiment of the image-pickup apparatus according to the present invention.

FIG. 39 is a drawing to show a more specific configuration of the seventh embodiment of the image-pickup apparatus according to the present invention. Particularly, a structural feature of the image-pickup apparatus of the seventh embodiment is that drains 31 (discharge areas) into which signal charges are swept are provided between the plural vertical transfer lines 11 and the horizontal transfer line 13 and electrodes φOG1 and φOG2 for controlling the drains 31 are connected to the driving circuit 140 (FIG. 30). The similar components to those shown in FIG. 31 are denoted by the same reference numerals and redundant description is omitted herein.

Figure 40:
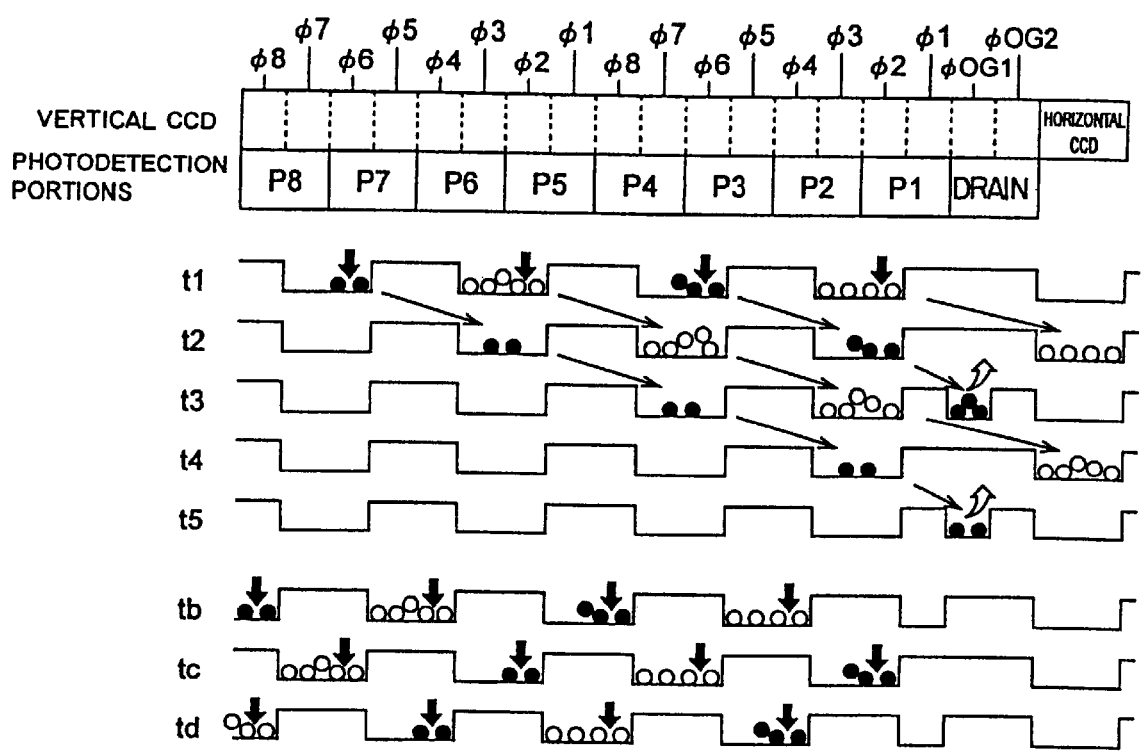
FIG. 40 is a drawing for explaining the operation (the driving method) of the seventh embodiment of the image-pickup apparatus according to the present invention.

FIG. 40 is a drawing for explaining the operation (the driving method) of the image-pickup apparatus of the seventh embodiment. Operational features of the image-pickup apparatus of the seventh embodiment are two points below.

(1) First, an undesired charge (black dots in FIG. 40) accumulated in each photodetection portion is transferred to a potential well, whereby the undesired charge is swept away out of the photodetection portion. After that, a signal charge (white dots in FIG. 40) accumulated during the predetermined exposure time is transferred this time to another potential well through the gate structure.

(2) Based on the timing when the undesired charge is transferred to the vertical transfer line 11, whether a charge passing beside the drain 31 is an undesired charge is determined, and if undesired charge it is swept away into the drain 31 through the electrode φOG1.

This transfer operation will be described in detail referring to FIG. 40. First, at t1 the intermediate voltage is applied to the electrodes φ2, φ3, φ6, φ7 to establish potential wells. In this state the high voltage is applied to the electrodes φ2, φ6, whereby charges in the photodetection portions in the first row, the third row, the fifth row, and the seventh row are transferred to the respective potential wells. These charges are transferred vertically in the vertical transfer lines 11 during a quarter frame period (t1–t5), whereby only the signal charges are outputted to the outside.

Specifically, at t2 the signal charges in the first row are transferred to the horizontal transfer line 13, and thereafter the signal charges in the first row are transferred horizontally in the horizontal transfer line 13 to be outputted from the output end of the horizontal transfer line 13 to the outside. At t3 the undesired charges in the third row are discharged into the drains 31 through the electrode φOG1.

Next, at t4 the signal charges in the fifth row are transferred each to the horizontal transfer line 13 and thereafter the signal charges in the fifth row are transferred horizontally in the horizontal transfer line 13 to be outputted from the output end of the horizontal transfer line 13 to the outside. At t5 the undesired charges in the seventh row are discharged into the drains 31 through the electrode φOG1.

At tb, tc, and td in FIG. 40, the signal charges and undesired charges are also read out in similar fashion, the charges are transferred in the vertical transfer lines 11 and horizontal transfer line 13 over a quarter frame period, and only the signal charges are outputted finally to the outside.

By this operation, the exposure time of the photodetection portions P1–8 is limited to approximately a half of one frame period in this image-pickup apparatus of the seventh embodiment, thus realizing the function of electronic shutter.

Figure 41:
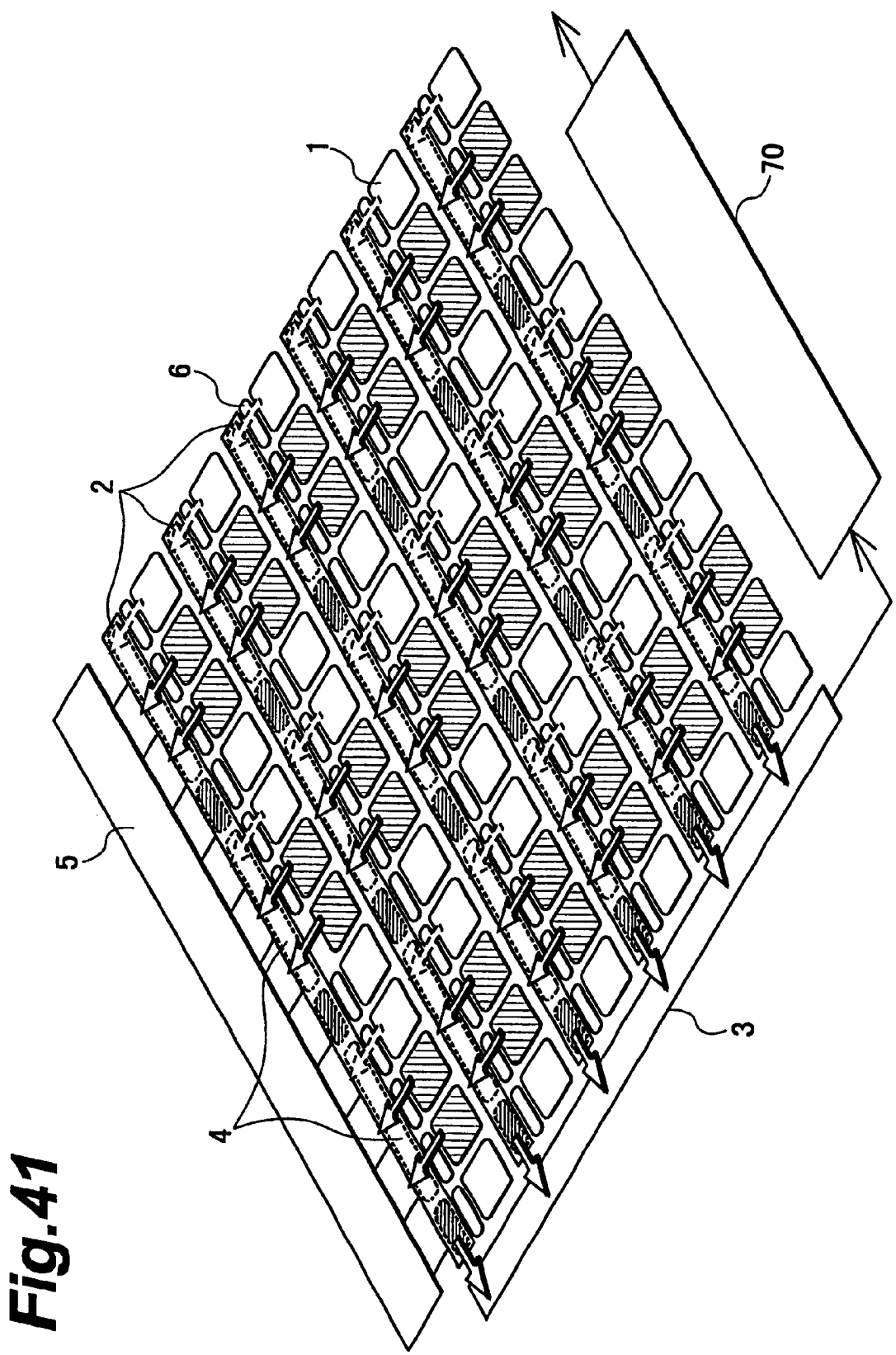
FIG. 41 is a conceptual drawing of the eighth embodiment of the image-pickup apparatus according to the present invention.

FIG. 41 is a conceptual drawing of the eighth embodiment of the image-pickup apparatus according to the present invention. In this image-pickup apparatus of the eighth embodiment one horizontal line is composed of a bundle of horizontal rows. A feature is that a shift of a predetermined distance in the vertical direction is given to positions where the potential wells for vertically transmitting the signal charges accumulated in the photodetection portions composing the horizontal line are successively established in the first operation for reading an odd field with respect to those in the second operation for reading an even field.

This is realized in such a way that the vertical driving control system 5 selects electrode groups in the second operation different from those in the first operation from the electrode string provided for each of the vertical transfer lines. This embodiment can realize the function of interlace scan by this setting of horizontal lines.

Figure 42:
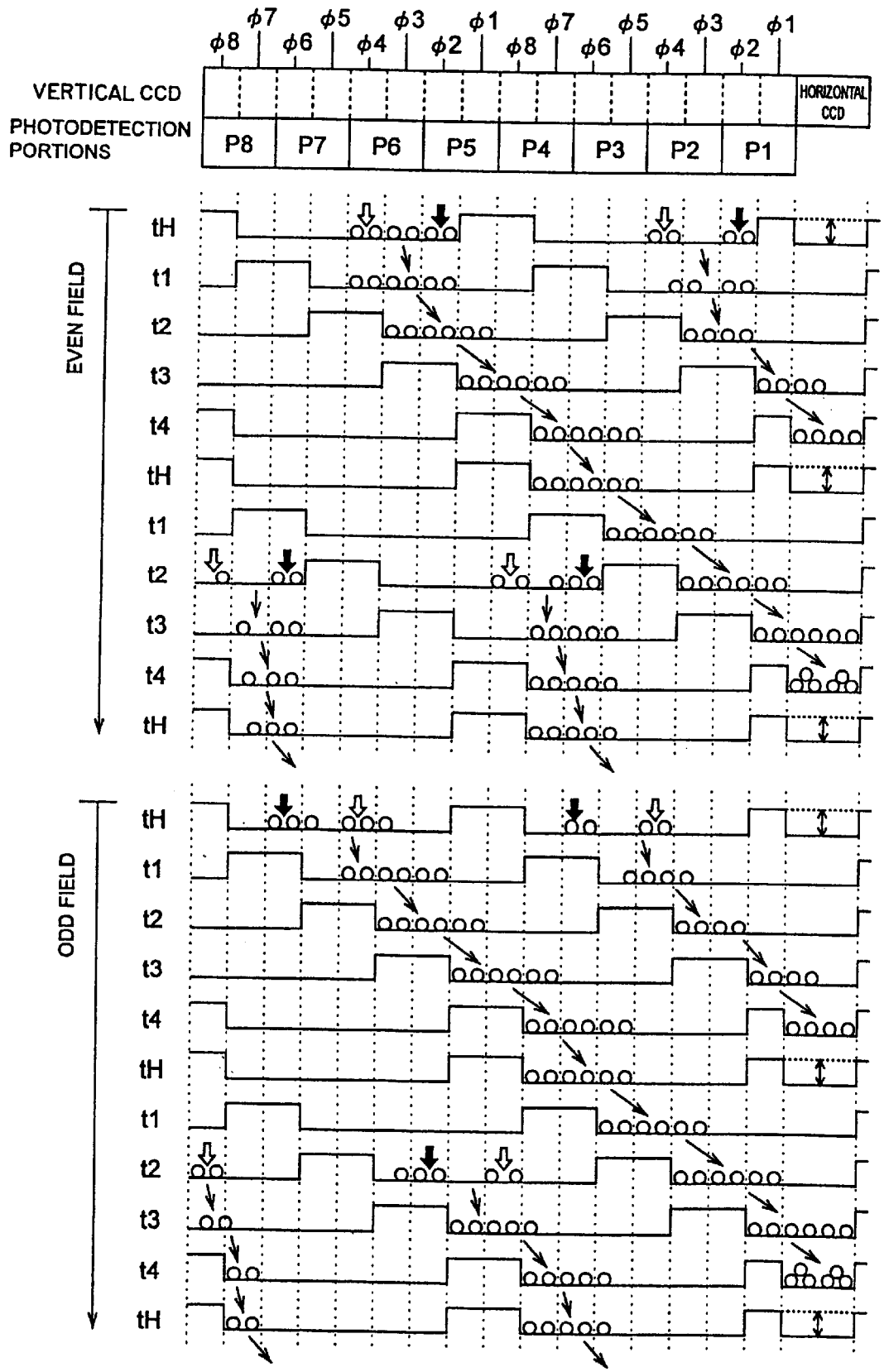
FIG. 42 is a drawing for explaining the operation (the driving method) of the eighth embodiment of the image-pickup apparatus according to the present invention.

Specifically, the interlace scan is realized by driving the image-pickup apparatus of this embodiment as shown in FIG. 42. FIG. 42 is a drawing for explaining the operation (the driving method) of the eighth embodiment of the image-pickup apparatus according to the present invention.

In the above-described embodiment the frame memory section 180 functions to perform the asynchronous read/write operation, but the invention is by no means limited to this structure. For example, it can be contemplated that frame images are stored alternately in two memories and the frame images are successively read out starting from the memory that first completes storage of image.

Further, in each of the above-described embodiments the frame memory section 180 functions to perform the rearrangement of horizontal lines on the occasion of storage of transfer outputs, but the invention is not limited to this structure. For example, the rearrangement of horizontal lines can also be made by changing the order on the occasion of reading the stored information from the frame memory section 180.

Each of the above-described embodiments was described as to the case of the photodetection portions P1–P8 of eight rows, but the invention is not limited to this structure. In general, the photodetection portions in an arbitrary number of rows can be read in sections of plural horizontal lines spaced from each other, and there is thus no specific limitation on the number of rows of the photodetection portions.

In the image-pickup apparatus according to the present invention as described above, the signal charges in the photodetection portions are transferred to the vertical transfer lines in synchronism with the timing when the vacant potential wells become adjacent to the photodetection portions. Therefore, reading can be executed for the all horizontal lines, though the number of potential wells is smaller than the number of horizontal lines.

Since the length of the potential well in the vertical direction (in the direction of movement thereof) is not smaller than the vertical width of the horizontal line, the charge storage amounts of the potential wells become greater than in the case of the short potential wells as in the first conventional example of the progressive scan type (FIG. 1) and the conventional example of the interlace scan type (FIG. 2). Therefore, the horizontal width of each vertical transfer line can be decreased without any difficulty. This decrease in the width of vertical transfer line can readily realize decrease in the chip size of image-pickup devices, increase in the number of pixels on the image-pickup surface, and increase in the aperture rate per pixel.

In the image-pickup apparatus according to the present invention at least one potential well having a signal charge is moved to the end of vertical transfer over a plurality of horizontal periods. Therefore, the driving speed of vertical transfer lines can be lowered without any difficulty, as compared with the conventional example of the CSD method (FIG. 3). This decrease in the driving speed of vertical transfer lines can effectively decrease the driving current in the vertical transfer lines, thus decreasing the dissipation power. The decrease in the driving current lowers the heating value of the driving circuit and thus can restrain occurrence of dark current noise. The decrease in the driving speed of vertical transfer lines reduces weakening of waveform of driving voltage, whereby the transfer leak of signal charge can be kept low.

The image-pickup apparatus according to the present invention outputs the signal charges from the vertical transfer lines to the horizontal transfer line during the horizontal blanking interval. This setting of timing can realize the transfer of signal charge without providing any special storage area of signal charge between the plural vertical transfer lines and the horizontal transfer line; however, if storage areas are provided and signal charges are stored temporarily therein, the timing can be adjusted on the occasion of outputting the signal charges to the horizontal transfer line. Consequently, the driving timing of vertical transfer lines can be set, independent of the driving timing of the horizontal transfer line.

In the image-pickup apparatus according to the present invention the vacant potential wells 4a collect transfer leaks of the preceding potential wells 4, whereby such a malfunction as mixture of transfer leaks in other signal charges can be prevented surely.

The image-pickup apparatus according to the present invention can also realize the structure in which the transfer leaks of signal charges collected by the vacant potential wells are not drained away but are added to the original signal charges. Therefore, the transfer leaks are not lost and the transfer efficiency of signal charges in the vertical transfer lines can be increased further.

Further, in the image-pickup apparatus according to the present invention, the potential wells including undesired charges and the potential wells having signal charges both are present in the vertical transfer lines and these potential wells are transferred vertically in one direction. The undesired charges out of the transferred charges are drained away to the outside. Therefore, only the signal charges accumulated during the predetermined exposure time reach the horizontal transfer line to be read out to the outside. The electronic shutter function can be realized by properly setting this exposure time.

The image-pickup apparatus according to the present invention can easily realize the function of interlace scan by modifying the setting of horizontal lines.

In addition, in the image-pickup apparatus according to the present invention, the horizontal lines of one screen are read out in sections of plural horizontal lines spaced from each other. Consequently, the all horizontal lines of one screen can be read out, though the number of potential wells is smaller than the number of horizontal lines.

Particularly, when the apparatus is provided with the pixel rearranging section, the horizontal lines can be read in an arbitrary order.

This eliminates the need for generating complex driving pulses in consideration of the scan order in the gate structures and the vertical driving control system, so that the structure of these circuits can be simplified more.

In the image-pickup apparatus according to the present invention, a plurality of horizontal lines spaced at constant intervals are selected and the signal charges are read every one of the plural horizontal lines selected.

In this transfer method plural potential wells can be placed at constant intervals, whereby the vertical driving of potential wells etc. can be carried out at regular timing. Therefore, the reading timing of signal charges can be simplified further.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An image-pickup apparatus comprising:
    a plurality of photodetection portions arrayed two-dimensionally on a predetermined plane;
    a plurality of vertical transfer lines which are regions respectively extending adjacent to a plurality of vertical lines defined by strings of vertical components arranged along a vertical direction out of said plurality of photodetection portions and on which electrode strings for establishing potential well transferring signal charges accumulated in said plurality of photodetection portions are respectively provided;
    a horizontal transfer line which is a region provided along a plurality of horizontal lines defined by one row or two or more rows of horizontal components arranged along a horizontal direction perpendicular to the vertical direction out of said plurality of photodetection portions;
    a plurality of gate structures provided adjacent to and corresponding to said plurality of photodetection portions, said plurality of gate structures transferring said signal charges accumulated in said plurality of photodetection portions; and
    a vertical driving control system connected to said plurality of vertical transfer lines and said plurality of gate structures, said vertical driving controlling said plurality of gate structures corresponding to said horizontal components defining a selected one of said plurality of horizontal lines and establishing said potential wells, which have a length not shorter than a width of each of said plurality of photodetection potions in the vertical direction, into said plurality of vertical transfer lines, whereby successively moving said potential wells to output ends of said plurality of vertical transfer lines over a plurality of horizontal scan periods in the vertical direction.

2. The image-pickup apparatus according to claim 1, wherein in each of said plurality of vertical transfer lines, said vertical driving control system simultaneously selects from said electrode string a first electrode group for establishing one of said potential wells which transfers said signal charges accumulated in one of said horizontal components defining a first horizontal line selected from said plurality of horizontal lines and a second electrode group for establishing one of said potential wells which transfers said signal charges accumulated in one of said horizontal components defining a second horizontal line different from said first horizontal line.

3. The image-pickup apparatus according to claim 1, wherein said vertical driving control system comprises:
    a first shift register having at least output ports the number of which is equal to the number of said vertical components defining each of said plurality of vertical lines and included in said plurality of photodetection portions, said first shift register being adapted for selecting ones of said gate structures, said selected ones of said gate structures corresponding to said horizontal components defining a selected one of said plurality of horizontal lines;
    a second shift register having at least output ports the number of which is smaller than the number of said vertical components defining each of said plurality of vertical lines and included in said plurality of photodetection portions, said second shift register being adapted for generating timing of movement of said potential wells respectively established in each of said plurality of vertical transfer lines; and
    a circuit for generating voltages of mutually different levels applied at predetermined timing to said transfer electrodes defining said electrode string provided on each of said plurality of vertical transfer lines.

4. The image-pickup apparatus according to claim 1, wherein said vertical driving control system controls said plurality of gate structures so that during a period in which said signal charges accumulated in said horizontal components defining a selected one of said horizontal lines are transferred in the vertical direction in said plurality of vertical transfer lines respectively adjacent to said horizontal components, different signal charges accumulated in said horizontal components defining a horizontal line adjacent to said selected horizontal line are transferred to each of said plurality of vertical transfer lines.

5. The image-pickup apparatus according to claim 1, further comprising a first output electrode provided so as to cover an output end of each of said plurality of vertical transfer lines adjacent to said horizontal transfer line and cover a part of said horizontal transfer line,
    wherein said vertical driving control system applies a predetermined voltage to said first output electrode during a horizontal blanking interval in which a transfer operation for signal charge is interrupted in said horizontal transfer line and at timing when said potential wells containing said signal charges reach said output end of each of said plurality of vertical transfer line, so that said signal charges are transferred to said horizontal transfer line.

6. The image-pickup apparatus according to claim 1, further comprising:

a plurality of storage areas provided so as to respectively correspond to said plurality of vertical transfer lines, each of said plurality of storage areas being adapted for storing said signal charges, which have been transferred in each of said plurality of vertical transfer lines, between said horizontal transfer line and each of said plurality of vertical transfer line;

a first electrode covering a part of said horizontal transfer line and a part of each of said plurality of storage areas; and a second output electrode covering a part of each of said plurality of storage areas and an output end of each of said plurality of vertical transfer lines, wherein said vertical driving control system applies a predetermined voltage to said first electrode at timing when said potential wells containing said signal charges reach said output end of each of said plurality of vertical transfer lines and said vertical driving control system applies a predetermined voltage to said second output electrode during a horizontal blanking interval in which a transfer operation for signal charge is interrupted in said horizontal transfer line.

7. The image-pickup apparatus according to claim 1, wherein said vertical driving control system simultaneously selects a first electrode group for establishing a main potential well and a second electrode group for establishing an auxiliary potential well from said electrode string provided on each of said plurality of vertical transfer lines so that in each of said plurality of vertical transfer lines at a certain instance said main potential well for transferring said signal charges and said auxiliary potential well for transferring leak components of said signal charges are established in an adjacent relation along the vertical direction.

8. The image-pickup apparatus according to claim 7, wherein said vertical driving control system controls application of voltage to said electrode string provided on each of said plurality of vertical transfer lines so that said signal charges in said main potential well which have been moved through each of said plurality of vertical transfer lines and said leak components of said signal charges collected by said auxiliary potential well both are outputted onto said horizontal transfer line.

9. The image-pickup apparatus according to claim 1, further comprising:

a plurality of discharge areas, each being a region provided between an output end of each of said vertical lines and said horizontal transfer line and each being adapted for sweeping undesired charges, which have been transferred in each of said plurality of vertical transfer line, away thereinto; and a third output electrode covering a part of each of said plurality of discharge areas and a part of each of said plurality of vertical transfer line corresponding thereto, wherein said vertical driving control system controls associated ones of said gate structures so that after a lapse of a predetermined time from the time when undesired charges accumulated in each of said horizontal components of a selected one of said horizontal lines are transferred to each of said plurality of vertical transfer lines adjacent to said horizontal components, said signal charges accumulated in each of said horizontal components are transferred to each of said plurality of vertical transfer lines adjacent to said horizontal components, and for establishing one of said potential wells to which said signal charges in each of said horizontal components are transferred, in each of said plurality of vertical transfer lines, said vertical driving control system applies a predetermined voltage to said selected electrode groups for establishing said one of said potential wells, and wherein for transferring said undesired charges from each of said plurality of vertical transfer lines to an associated one of said discharge areas, said vertical driving control system applies a predetermined voltage to said third output electrode at timing when in each of said plurality of vertical transfer lines associated one of said potential wells containing said undesired charges reach a portion adjacent to said associated discharge area.

10. The image-pickup apparatus according to claim 1, wherein when one of said plurality of horizontal lines is defined by a plurality of rows of said horizontal components arranged along the horizontal direction, said vertical driving control system selects a first electrode group for a first operation and a second electrode group for a second operation different therefrom out of said electrode string provided on each of said plurality of vertical transfer lines so that a shift of a predetermined distance in the vertical direction is given to positions where said potential wells for transferring said signal charges accumulated in said horizontal components of said defined one of said plurality of horizontal lines in the vertical direction are successively formed in the first operation for reading an odd field, with respect to positions in the second operation for reading an even field.

11. A driving method of image-pickup apparatus comprising:

a step of preparing the image-pickup apparatus according to claim 1;

a step of establishing said potential wells each having a length not shorter than a width of each of said plurality of horizontal lines in the vertical direction, in each of said plurality of vertical transfer lines and moving said potential wells along the vertical direction; and a step of, in each of said plurality of vertical transfer lines, successively selecting one of said horizontal components to be objects, according to a reading order of said plurality of horizontal lines, and transferring said signal charges in said selected one of said horizontal components to said vacant potential well at timing when a vacant potential well is established in a portion adjacent to said selected one of said horizontal components.

12. The driving method according to claim 11, wherein in each of said plurality of vertical transfer lines, one potential well or two or more potential wells each containing said signal charges are moved from a position where said signal charges were transferred through an associated one of said gate structures, to an output end of each of said plurality of vertical transfer lines over a plurality of horizontal scan periods, each being a period in which said signal charges are transferred in said horizontal transfer line, or over a plurality of horizontal blanking intervals, each being a period in which the transfer operation for signal charge is interrupted in said horizontal transfer line.

13. The driving method according to claim 11, wherein said potential wells each containing said signal charges are established in each of said plurality of vertical transfer lines at predetermined timing.

14. The driving method according to claim 11, wherein in each of said plurality of vertical transfer lines, during a period in which said signal charges in one of said horizontal components defining a selected one of said horizontal lines are transferred in the vertical direction, different signal charges in one of said horizontal components defining a different horizontal line to be read next is transferred to one of said potential wells established in each of said plurality of vertical transfer lines.

15. The driving method according to claim 11, wherein in each of said plurality of vertical transfer lines, said signal charges in one of said potential wells, which have been moved to an output end of each of said plurality of vertical transfer lines, are transferred to said horizontal transfer line during a horizontal blanking interval in which the transfer operation for signal charge is interrupted in said horizontal transfer line.

16. The driving method according to claim 11, further comprising:
   a step of, in each of said plurality of vertical transfer lines, temporarily withdrawing said signal charges in one of said potential wells, which have been moved to an output end of each of said plurality of vertical transfer lines; and
   a step of outputting said temporarily withdrawn signal charges, to said horizontal transfer line after arrival of a horizontal blanking interval in which a transfer operation for signal charge is interrupted in said horizontal transfer line.

17. The driving method according to claim 11, wherein in each of said plurality of vertical transfer lines at a certain instance, a main potential well for transferring said signal charges and an auxiliary potential well for transferring leak components of said signal charges are established in an adjacent relation along the vertical direction.

18. The driving method according to claim 17, wherein said signal charges in said main potential well and said leak components of said signal charges collected by said auxiliary potential well, both having been transferred through each of said plurality of vertical transfer lines, are outputted onto said horizontal transfer line.

19. The driving method according to claim 11, further comprising:
   a step of, in each of said plurality of vertical transfer lines, transferring said signal charges accumulated in one of said horizontal components defining a selected one of said horizontal lines to adjacent one of said plurality of vertical transfer lines after a lapse of a predetermined time from a time when undesired charges accumulated in said one of said horizontal components are transferred into said adjacent one of said plurality of vertical transfer line; and
   a step of discharging said undesired charges in one of said potential wells having been moved to a predetermined portion of each of said plurality of vertical transfer lines, to outside of each of said plurality of vertical transfer lines.

20. The driving method according to claim 11, wherein when one of said plurality of horizontal lines is defined by a plurality of rows of said horizontal components arranged along the horizontal direction, a shift of a predetermined distance in the vertical direction is given to positions where said potential wells for transferring said signal charges accumulated in said horizontal components of said defined one of said plurality of horizontal lines in the vertical direction are successively established in a first operation for reading an odd field, with respect to positions in a second operation for reading an even field.

21. An image-pickup apparatus comprising:
   a plurality of photodetection portions arrayed two-dimensionally on a predetermined plane;
   a plurality of vertical transfer lines which are regions respectively extending adjacent to a plurality of vertical lines defined by strings of vertical components arranged along a vertical direction out of said plurality of photodetection portions and on which electrode strings for establishing potential wells for transferring signal charges accumulated in said plurality of photodetection portions are respectively provided;
   a plurality of gate structures provided adjacent to and corresponding to said plurality of photodetection portions, said plurality of gate structures transferring said signal charges accumulated in said plurality of photodetection portions;
   a vertical driving control system connected to said plurality of vertical transfer lines, said vertical driving control system controlling said gate structures respectively corresponding to horizontal components defining selected ones of a plurality of horizontal lines, which are selected on the basis of reading sections of horizontal lines spaced from each other at a predetermined distance out of said plurality of said horizontal lines and define each of said horizontal lines spaced from each other, and establishing said potential wells each having a length not shorter than a width of each of said plurality of photodetection portions in the vertical direction, whereby successively moving said potential wells to output ends of said plurality of vertical transfer lines over a plurality of horizontal scan periods in the vertical direction;
   a horizontal transfer line which is a region provided along said plurality of horizontal lines, said horizontal transfer line successively transferring said signal charges, which have been transferred through said plurality of vertical transfer lines, along the horizontal direction; and
   a pixel rearranging section connected to said horizontal transfer line, said pixel rearranging section successively capturing outputs from said horizontal transfer line and rearranging the outputs according to an original sequence of said horizontal lines, whereby generating image signals of a frame unit or a field unit.

22. The image-pickup apparatus according to claim 21, wherein said vertical driving control system controls said gate structures so that said signal charges in said horizontal components defining said selected ones of said plurality of horizontal lines are transferred to said plurality of vertical transfer lines respectively adjacent to said horizontal components.

23. The image-pickup apparatus according to claim 21, further comprising a first output electrode provided so as to cover an output end of each of said plurality of vertical transfer lines adjacent to said horizontal transfer line and cover a part of said horizontal transfer line,
   wherein said vertical driving control system applies a predetermined voltage to said first output electrode during a horizontal blanking interval in which a transfer operation for signal charge is interrupted in said horizontal transfer line and at timing when said potential wells containing said signal charges reach said output end of each of said plurality of vertical transfer lines, so that said signal charges are transferred to said horizontal transfer line.

24. The image-pickup apparatus according to claim 21, wherein said vertical driving control system simultaneously selects a first electrode group for establishing at least a main potential well and a second electrode group for establishing an auxiliary potential well from said electrode string provided on each of said plurality of vertical transfer lines so that in each of said plurality of vertical transfer lines at a certain instance said main potential well for transferring said signal charges and said auxiliary potential well for transferring leak components of said signal charges are established in an adjacent relation along the vertical direction.

25. The image-pickup apparatus according to claim 24, wherein said vertical driving control system controls application of voltage to said electrode string provided on each of said plurality of vertical transfer lines so that said signal charges in said main potential well having been moved through each of said plurality of vertical transfer lines and said leak components of said signal charges collected by said auxiliary potential well are added and outputted onto said horizontal transfer line.

26. The image-pickup apparatus according to claim 21, further comprising:
   a plurality of discharge areas, each being a region provided between an output end of each of said plurality of vertical transfer lines and said horizontal transfer line and each being adapted for sweeping undesired charges, which have been transferred in each of said plurality of vertical transfer line, away thereinto; and
   a third output electrode covering a part of each of said plurality of discharge areas and a part of each of said plurality of vertical transfer line corresponding thereto,
   wherein said vertical driving control system controls associated ones of said gate structures so that after a lapse of a predetermined time from the time when undesired charges accumulated in said horizontal components of said selected ones of said plurality of horizontal lines is transferred to each of said plurality of vertical transfer lines adjacent to said horizontal components, said signal charges accumulated in each of said horizontal components are transferred to each of said plurality of vertical transfer lines adjacent to said horizontal components, and for establishing one of said potential wells to which said signal charges in each of said horizontal components are transferred, in each of said plurality of vertical transfer lines, said vertical driving control system applies a predetermined voltage to an associated one of said plurality of electrode groups for establishing said one of said potential wells, and wherein for transferring said undesired charges from each of said plurality of vertical transfer lines to an associated one of said discharge areas, said vertical driving control system applies a predetermined voltage to said third output electrode at timing when in each of said plurality of vertical transfer lines said one of said potential wells containing said undesired charges reaches a portion adjacent to said associated discharge area.

27. The image-pickup apparatus according to claim 21, wherein when one of said plurality of horizontal lines are defined by a plurality of rows of said horizontal components arranged adjacent to each other along the horizontal direction, said vertical driving control system selects a first electrode group for a first operation and a second electrode group for a second operation different therefrom out of said electrode string provided on each of said plurality of vertical transfer lines so that a shift of a predetermined distance in the vertical direction is given to positions where said potential wells for transferring said signal charges accumulated in said horizontal components of said defined one of said plurality of horizontal lines in the vertical direction are successively formed in the first operation for reading an odd field, with respect to positions in the second operation for reading an even field.

* * * * *